(12) United States Patent
Koezuka et al.

(10) Patent No.: US 9,450,104 B2
(45) Date of Patent: Sep. 20, 2016

(54) SEMICONDUCTOR DEVICE AND MANUFACTURING METHOD THEREOF

(71) Applicant: Semiconductor Energy Laboratory Co., Ltd., Atsugi-shi, Kanagawa-ken (JP)

(72) Inventors: Junichi Koezuka, Tochigi (JP); Shinji Ohno, Atsugi (JP); Yuichi Sato, Isehara (JP); Masahiro Takahashi, Atsugi (JP); Hideyuki Kishida, Isehara (JP)

(73) Assignee: Semiconductor Energy Laboratory Co., Ltd., Kanagawa-ken (JP)

(*) Notice: Subject to any disclaimer, the term of this patent is extended or adjusted under 35 U.S.C. 154(b) by 0 days.

(21) Appl. No.: 14/920,244

(22) Filed: Oct. 22, 2015

(65) Prior Publication Data
US 2016/0043231 A1    Feb. 11, 2016

Related U.S. Application Data

(62) Division of application No. 13/413,714, filed on Mar. 7, 2012, now Pat. No. 9,184,296.

(30) Foreign Application Priority Data

Mar. 11, 2011 (JP) .................... 2011-054610

(51) Int. Cl.
*H01L 29/04*  (2006.01)
*H01L 29/786* (2006.01)
(Continued)

(52) U.S. Cl.
CPC ....... *H01L 29/7869* (2013.01); *H01L 27/1225* (2013.01); *H01L 29/045* (2013.01); *H01L 29/66969* (2013.01); *H01L 29/78693* (2013.01); *H01L 29/78696* (2013.01)

(58) Field of Classification Search
CPC ................ H01L 29/7869; H01L 29/66969; H01L 29/78621; H01L 29/04; H01L 29/045; H01L 29/4908; H01L 29/66757; H01L 29/78666; H01L 29/78675; H01L 29/78684; H01L 29/78693; H01L 29/78696; H01L 27/12; H01L 27/1225; G02F 1/13454; G02F 2001/136245
See application file for complete search history.

(56) References Cited

U.S. PATENT DOCUMENTS 5,528,032 A    6/1996  Uchiyama
5,716,871 A    2/1998  Yamazaki et al.
(Continued)

FOREIGN PATENT DOCUMENTS

EP    1737044 A    12/2006
EP    1770788 A    4/2007
(Continued)

OTHER PUBLICATIONS

Nakamura.M, "Synthesis of Homologous Compound with New Long-Period Structure", Nirim Newsletter, Mar. 1, 1995, vol. 150, pp. 1-4.

(Continued)

*Primary Examiner* — Chuong A Luu
*Assistant Examiner* — Cory Eskridge
(74) *Attorney, Agent, or Firm* — Robinson Intellectual Property Law Office; Eric J. Robinson

(57) ABSTRACT

The semiconductor device includes an oxide semiconductor film having a first region and a pair of second regions facing each other with the first region provided therebetween, a gate insulating film over the oxide semiconductor film, and a first electrode overlapping with the first region, over the gate insulating film. The first region is a non-single-crystal oxide semiconductor region including a c-axis-aligned crystal portion. The pair of second regions is an oxide semiconductor region containing dopant and including a plurality of crystal portions.

4 Claims, 24 Drawing Sheets

(51) Int. Cl.
  *H01L 27/12* (2006.01)
  *H01L 29/66* (2006.01)

(56) References Cited

U.S. PATENT DOCUMENTS

| | | |
|---|---|---|
| 5,731,856 A | 3/1998 | Kim et al. |
| 5,744,864 A | 4/1998 | Cillessen et al. |
| 6,087,679 A | 7/2000 | Yamazaki et al. |
| 6,294,274 B1 | 9/2001 | Kawazoe et al. |
| 6,483,493 B2 | 11/2002 | Murade |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,598,520 B2 | 10/2009 | Hirao et al. |
| 7,674,650 B2 | 3/2010 | Akimoto et al. |
| 7,732,819 B2 | 6/2010 | Akimoto et al. |
| 7,804,088 B2 | 9/2010 | Tanaka et al. |
| 7,910,490 B2 | 3/2011 | Akimoto et al. |
| 7,932,521 B2 | 4/2011 | Akimoto et al. |
| 7,993,964 B2 | 8/2011 | Hirao et al. |
| 8,183,099 B2 | 5/2012 | Sakata |
| 8,274,077 B2 | 9/2012 | Akimoto et al. |
| 8,466,463 B2 | 6/2013 | Akimoto et al. |
| 8,629,069 B2 | 1/2014 | Akimoto et al. |
| 8,669,550 B2 | 3/2014 | Akimoto et al. |
| 8,790,959 B2 | 7/2014 | Akimoto et al. |
| 8,796,069 B2 | 8/2014 | Akimoto et al. |
| 8,803,149 B2 | 8/2014 | Sakata |
| 9,099,562 B2 | 8/2015 | Akimoto et al. |
| 9,209,311 B2 | 12/2015 | Ueda et al. |
| 2001/0046027 A1 | 11/2001 | Tai et al. |
| 2002/0033485 A1 | 3/2002 | Morosawa |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2008/0308805 A1 | 12/2008 | Akimoto et al. |
| 2009/0008645 A1 | 1/2009 | Yamazaki et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2009/0283763 A1* | 11/2009 | Park ............... H01L 29/78621 257/43 |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0117073 A1 | 5/2010 | Yamazaki et al. |
| 2011/0104851 A1 | 5/2011 | Akimoto et al. |
| 2011/0121290 A1 | 5/2011 | Akimoto et al. |
| 2011/0133191 A1 | 6/2011 | Yamazaki |
| 2011/0168993 A1 | 7/2011 | Jeon et al. |
| 2012/0161124 A1 | 6/2012 | Yamazaki |
| 2015/0037912 A1 | 2/2015 | Sakata |
| 2015/0340513 A1 | 11/2015 | Akimoto et al. |

FOREIGN PATENT DOCUMENTS

| | | |
|---|---|---|
| EP | 1995787 A | 11/2008 |
| EP | 1998373 A | 12/2008 |
| EP | 1998374 A | 12/2008 |
| EP | 1998375 A | 12/2008 |
| EP | 2226847 A | 9/2010 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 06-275697 A | 9/1994 |
| JP | 08-264794 A | 10/1996 |
| JP | 11-505377 | 5/1999 |
| JP | 2000-026119 A | 1/2000 |
| JP | 2000-044236 A | 2/2000 |
| JP | 2000-150900 A | 5/2000 |
| JP | 2002-033332 A | 1/2002 |

(56) References Cited

FOREIGN PATENT DOCUMENTS

| | | |
|---|---|---|
| JP | 2002-076356 A | 3/2002 |
| JP | 2002-151524 A | 5/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2007-096055 A | 4/2007 |
| JP | 2007-123861 A | 5/2007 |
| JP | 2007-281486 A | 10/2007 |
| JP | 2008-124215 A | 5/2008 |
| JP | 2009-528670 | 8/2009 |
| JP | 2009-267399 A | 11/2009 |
| JP | 2010-135774 A | 6/2010 |
| JP | 2010-166030 A | 7/2010 |
| JP | 2010-267975 A | 11/2010 |
| WO | WO-2004/114391 | 12/2004 |
| WO | WO-2007/142167 | 12/2007 |
| WO | WO-2010/071034 | 6/2010 |
| WO | WO-2011/027467 | 3/2011 |

OTHER PUBLICATIONS

Jeon.S et al., "180nm Gate Length Amorphous InGaZnO Thin Film Transistor for High Density Image Sensor Applications", IEDM 10: Technical Digest of International Electron Devices Meeting, Dec. 6, 2010, pp. 504-507.

Morosawa.N et al., "35.3: Distinguished Paper: A Novel Self-Aligned Top-Gate Oxide TFT for AM-OLED Displays", SID Digest '11 : SID International Symposium Digest of Technical Papers, May 17, 2011, pp. 479-482.

Kim.S et al., "Source/Drain Formation of Self-Aligned Top-Gate Amorphous GaInZnO Thin-Film Transistors by NH3 Plasma Treatment", IEEE Electron Device Letters, Apr. 1, 2009, vol. 30, No. 4, pp. 374-376.

Park.J et al., "High performance amorphous oxide thin film transistors with self-aligned top-gate structure", IEDM 09: Technical Digest of International Electron Devices Meeting, Dec. 7, 2009, pp. 191-194.

Fortunato.E et al., "Wide-Bandgap High-Mobility ZnO Thin-Film Transistors Produced At Room Temperature", Appl. Phys. Lett. (Applied Physics Letters) , Sep. 27, 2004, vol. 85, No. 13, pp. 2541-2543.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Ikeda.T et al., "Full-Functional System Liquid Crystal Display Using CG-Silicon Technology", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Park.J et al., "Improvements in the Device Characteristics of Amorphous Indium Gallium Zinc Oxide Thin-Film Transistors by Ar Plasma Treatment", Appl. Phys. Lett. (Applied Physics Letters) , Jun. 26, 2007, vol. 90, No. 26, pp. 262106-1-262106-3.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Hayashi.R et al., "42.1: Invited Paper: Improved Amorphous In—Ga—Zn—O Tfts", SID Digest '08 : SID International Symposium Digest of Technical Papers, May 20, 2008, vol. 39, pp. 621-624.

Prins.M et al., "A Ferroelectric Transparent Thin-Film Transistor", Appl. Phys. Lett. (Applied Physics Letters) , Jun. 17, 1996, vol. 68, No. 25, pp. 3650-3652.

Nakamura.M et al., "The phase relations in the In2O3—Ga2ZnO4—ZnO system at 1350° C", Journal of Solid State Chemistry, Aug. 1, 1991, vol. 93, No. 2, pp. 298-315.

Kimizuka.N et al., "Syntheses and Single-Crystal Data of Homologous Compounds, In2O3(ZnO)m (m = 3, 4, and 5), InGaO3(ZnO)3, and Ga2O3(ZnO)m (m = 7, 8, 9, and 16) in the In2O3—ZnGa2O4—ZnO System", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor", Science, May 23, 2003, vol. 300, No. 5623, pp. 1269-1272.

Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.

Asakuma.N et al., "Crystallization and Reduction of Sol-Gel-Derived Zinc Oxide Films by Irradiation with Ultraviolet Lamp", Journal of Sol-Gel Science and Technology, 2003, vol. 26, pp. 181-184.

Osada.T et al., "15.2: Development of Driver-Integrated Panel using Amorphous In—Ga—Zn—Oxide TFT", SID Digest '09 : SID International Symposium Digest of Technical Papers, May 31, 2009, pp. 184-187.

Nomura.K et al., "Carrier transport in transparent oxide semiconductor with intrinsic structural randomness probed using single-crystalline InGaO3(ZnO)5 films", Appl. Phys. Lett. (Applied Physics Letters) , Sep. 13, 2004, vol. 85, No. 11, pp. 1993-1995.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Son.K et al., "42.4L: Late-News Paper: 4 Inch QVGA AMOLED Driven by the Threshold Voltage Controlled Amorphous GIZO (Ga2O3—In2O3—ZnO) TFT", SID DIGEST '08 : SID International Symposium Digest of Technical Papers, May 20, 2008, vol. 39, pp. 633-636.

Lee.J et al., "World'S Largest (15-Inch) XGA AMLCD Panel Using IGZO Oxide TFT", SID Digest '08 : SID International Symposium Digest of Technical Papers, May 20, 2008, vol. 39, pp. 625-628.

Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.

Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.

Tsuda.K et al., "Ultra Low Power Consumption Technologies for Mobile TFT-LCDs ", IDW '02 : Proceedings of the 9th International Display Workshops, Dec. 4, 2002, pp. 295-298.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Jeong.J et al., "3.1: Distinguished Paper: 12.1-Inch WXGA AMOLED Display Driven by Indium—Gallium—Zinc Oxide TFTs Array", SID Digest '08 : SID International Symposium Digest of Technical Papers, May 20, 2008, vol. 39, No. 1, pp. 1-4.

Kurokawa.Y et al., "UHF RFCPUS on Flexible and Glass Substrates for Secure RFID Systems", Journal of Solid-State Circuits , 2008, vol. 43, No. 1, pp. 292-299.

Ohara.H et al., "Amorphous In—Ga—Zn—Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

(56) References Cited

OTHER PUBLICATIONS

Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.
Jin.D et al., "65.2:Distinguished Paper:World-Largest (6.57) Flexible Full Color Top Emission AMOLED Display on Plastic Film and its Bending Properties", SID Digest '09 : SID International Symposium Digest of Technical Papers, May 31, 2009, pp. 983-985.
Sakata.J et al., "Development of 4.0-In. AMOLED Display With Driver Circuit Using Amorphous In—Ga—Zn—Oxide TFTs", IDW '09 : Proceedings of the 16th International Display Workshops, 2009, pp. 689-692.
Park.J et al., "Amorphous Indium—Gallium—Zinc Oxide TFTs and Their Application for Large Size AMOLED", AM-FPD '08 Digest of Technical Papers, Jul. 2, 2008, pp. 275-278.
Park.S et al., "Challenge to Future Displays: Transparent AM-OLED Driven by Peald Grown ZNO TFT", IMID '07 Digest, 2007, pp. 1249-1252.
Godo.H et al., "Temperature Dependence of Characteristics and Electronic Structure for Amorphous In—Ga—Zn—Oxide TFT", AM-FPD '09 Digest of Technical Papers, Jul. 1, 2009, pp. 41-44.
Osada.T et al., "Development of Driver-Integrated Panel Using Amorphous In—Ga—Zn—Oxide TFT", AM-FPD '09 Digest of Technical Papers, Jul. 1, 2009, pp. 33-36.
Hirao.T et al., "Novel Top-Gate Zinc Oxide Thin-Film Transistors (ZNO TFTs) for AMLCDs", J. Soc. Inf. Display (Journal of the Society for Information Display), 2007, vol. 15, No. 1, pp. 17-22.
Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.
Godo.H et al., "P-9:Numerical Analysis on Temperature Dependence of Characteristics of Amorphous In—Ga—Zn—Oxide TFT", SID Digest '09 : SID Internatinoal Symposium Digest of Technical Papers, May 31, 2009, pp. 1110-1112.
Ohara.H et al., "21.3:4.0 In. QVGA AMOLED Display Using In—Ga—Zn—Oxide TFTs With a Novel Passivation Layer", SID Digest '09 : SID International Symposium Digest of Technical Papers, May 31, 2009, pp. 284-287.
Miyasaka.M, "Suftla Flexible Microelectronics on Their Way to Business", SID Digest '07 : SID International Symposium Digest of Technical Papers, 2007, vol. 38, pp. 1673-1676.
Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.
Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.
Asaoka.Y et al., "29.1: Polarizer-Free Reflective LCD Combined With Ultra Low-Power Driving Technology", SID Digest '09 : SID International Symposium Digest of Technical Papers, May 31, 2009, pp. 395-398.
Lee.H et al., "Current Status of, Challenges to, and Perspective View of AM-OLED", IDW '06 : Proceedings of the 13th International Display Workshops, Dec. 7, 2006, pp. 663-666.
Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.
Kikuchi.H et al., "Polymer-Stabilized Liquid Crystal Blue Phases", Nature Materials, Sep. 2, 2002, vol. 1, pp. 64-68.
Kimizuka.N et al., "Spinel,YBFE2O4, and YB2FE3O7 Types of Structures for Compounds in the In2O3 and Sc2O3—A2O3—BO Systems [A; Fe, Ga, or Al; B: Mg, Mn, Fe, Ni, Cu,or Zn] at Temperatures Over 1000° C", Journal of Solid State Chemistry, 1985, vol. 60, pp. 382-384.
Kitzerow.H et al., "Observation of Blue Phases in Chiral Networks", Liquid Crystals, 1993, vol. 14, No. 3, pp. 911-916.
Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.
Meiboom.S et al., "Theory of the Blue Phase of Cholesteric Liquid Crystals", Phys. Rev. Lett. (Physical Review Letters), May 4, 1981, vol. 46, No. 18, pp. 1216-1219.
Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.
Orita.M et al., "Mechanism of Electrical Conductivity of Transparent InGaZnO4", Phys. Rev. B (Physical Review. B), Jan. 15, 2000, vol. 61, No. 3, pp. 1811-1816.
Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.
Janotti.A et al., "Native Point Defects in ZnO", Phys. Rev. B (Physical Review. B), Oct. 4, 2007, vol. 76, No. 16, pp. 165202-1-165202-22.
Park.J et al., "Electronic Transport Properties of Amorphous Indium—Gallium—Zinc Oxide Semiconductor Upon Exposure to Water", Appl. Phys. Lett. (Applied Physics Letters) , 2008, vol. 92, pp. 072104-1-072104-3.
Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.
Janotti.A et al., "Oxygen Vacancies in ZnO", Appl. Phys. Lett. (Applied Physics Letters) , 2005, vol. 87, pp. 122102-1-122102-3.
Oba.F et al., "Defect energetics in ZnO: A hybrid Hartree-Fock density functional study", Phys. Rev. B (Physical Review. B), 2008, vol. 77, pp. 245202-1-245202-6.
Orita.M et al., "Amorphous transparent conductive oxide InGaO3(ZnO)m (m<4):a Zn4s conductor", Philosophical Magazine, 2001, vol. 81, No. 5, pp. 501-515.
Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.
Mo.Y et al., "Amorphous Oxide TFT Backplanes for Large Size AMOLED Displays", IDW '08 : Proceedings of the 6th International Display Workshops, Dec. 3, 2008, pp. 581-584.
Kim.S et al., "High-Performance oxide thin film transistors passivated by various gas plasmas", 214th ECS Meeting, 2008, No. 2317, ECS.
Clarks et al., "First Principles Methods Using Castep", Zeitschrift fur Kristallographie, 2005, vol. 220, pp. 567-570.
Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.
Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.
Oh.M et al., "Improving the Gate Stability of ZnO Thin-Film Transistors With Aluminum Oxide Dielectric Layers", J. Electrochem. Soc. (Journal of the Electrochemical Society, 2008, vol. 155, No. 12, pp. H1009-H1014.
Ueno.K et al., "Field-Effect Transistor on SrTiO3 With Sputtered Al2O3 Gate Insulator", Appl. Phys. Lett. (Applied Physics Letters) , Sep. 1, 2003, vol. 83, No. 9, pp. 1755-1757.
Du Ahn et al., "Comparison of the effects of Ar and H2 plasmas on the performance of homojunctioned amorphous indium gallium zinc oxide thin film transistors," Appl. Phys. Lett. (Applied Physics Letters), 2008, vol. 93, No. 20, pp. 203506-1-203506-3.

* cited by examiner

SEMICONDUCTOR DEVICE AND MANUFACTURING METHOD THEREOF

BACKGROUND OF THE INVENTION

1. Field of the Invention

The present invention relates to a semiconductor device including an oxide semiconductor.

In this specification, the semiconductor device refers to all devices that can operate by utilizing semiconductor characteristics. A transistor described in this specification is a semiconductor device, and an electrooptic device, a semiconductor circuit, and an electronic device which include the transistor are all semiconductor devices.

2. Description of the Related Art

Transistors used for most flat panel displays typified by a liquid crystal display device and a light-emitting display device are formed using silicon semiconductors such as amorphous silicon, single crystal silicon, and polycrystalline silicon provided over glass substrates. Further, transistors formed using such silicon semiconductors are used in integrated circuits (ICs) and the like.

Attention has been directed to a technique for using metal oxides exhibiting semiconductor characteristics for transistors, instead of the above silicon semiconductors. Note that in this specification, a metal oxide exhibiting semiconductor characteristics is referred to as "oxide semiconductor".

For example, a technique is disclosed in which a transistor is formed using a Zn—O-based metal oxide or an In—Ga—Zn—O-based metal oxide as an oxide semiconductor and such a transistor is used as a switching element or the like in a pixel of a display device (see Patent Documents 1 and 2).

Further, a technique is disclosed in which in a transistor including an oxide semiconductor, a highly conductive oxide semiconductor containing nitrogen is provided as buffer layers between a source region and a source electrode and between a drain region and a drain electrode, and thereby the contact resistance between the oxide semiconductor and the source electrode and the contact resistance between the oxide semiconductor and the drain electrode are reduced (see Patent Document 3).

Further, a technique for forming a channel formation region, a source region, and a drain region in a self-aligned manner in a top-gate transistor including an oxide semiconductor is disclosed (see Non-Patent Document 1).

REFERENCE

Patent Document

[Patent Document 1] Japanese Published Patent Application No. 2007-123861
[Patent Document 2] Japanese Published Patent Application No. 2007-096055
[Patent Document 3] Japanese Published Patent Application No. 2010-135774

Non-Patent Document

[Non-Patent Document 1] Jae Chul Park et al., "High performance amorphous oxide thin film transistors with self-aligned top-gate structure", IEDM2009, pp. 191-194

SUMMARY OF THE INVENTION

In order to increase integration of an integrated circuit including a transistor, the transistor needs to be miniaturized. In general, a transistor including a silicon semiconductor and whose channel length is extremely shortened for miniaturization has fluctuation in electric characteristics, such as a negative shift of the threshold voltage. Suppression of the above phenomenon is a challenge for miniaturization of a transistor including a silicon semiconductor.

In addition, it is known that a transistor including an oxide semiconductor has smaller off-state current than a transistor including silicon at room temperature. It is considered that this is because the number of carriers generated by thermal excitation is small, that is, the carrier density is low. Also in a transistor including a material with low carrier density, fluctuation in the threshold voltage and the like occurs when the channel length is shortened.

In view of the foregoing, an object of one embodiment of the present invention is to provide a semiconductor device in which fluctuation in electric characteristics due to miniaturization is less likely to be caused.

In order to suppress the fluctuation in electric characteristics of a transistor including an oxide semiconductor due to miniaturization of the transistor, a region containing dopant is provided in an oxide semiconductor film including a channel formation region. Specifically, a channel formation region and a pair of regions containing dopant are provided in the oxide semiconductor film. Accordingly, an electric field generated in one of the pair of regions and applied to the channel formation region can be relieved, and thus, an influence of shortening a channel length such as fluctuation in threshold voltage can be reduced. Note that in this specification, "dopant" is a general term for elements and/or impurities added to an oxide semiconductor film including a channel formation region.

In addition, the oxide semiconductor film is non-single-crystal; specifically, the channel formation region includes a crystal portion in which atoms are arranged in a triangle, a hexagon, a regular triangle, or a regular hexagon when seen from the direction perpendicular to the a-b plane of the non-single-crystal and in which metal atoms or metal atoms and oxygen atoms are arranged in layers when seen from the direction perpendicular to the c-axis. Note that in this specification, an oxide semiconductor including the crystal portion is referred to as c-axis aligned crystalline oxide semiconductor (CAAC oxide semiconductor, CAAC-OS). With the channel formation region including CAAC-OS, fluctuation in electric characteristics of the transistor due to irradiation with visible light or ultraviolet light and application of heat or bias can be suppressed and the reliability of the semiconductor device can be improved.

In addition, the region containing dopant includes an oxide semiconductor region including a plurality of crystal portions whose main component is polycrystal. In such a manner, the region containing dopant also comprises an oxide semiconductor region including a plurality of crystal portions, and thus, fluctuation in electric characteristics of the transistor can be suppressed.

One embodiment of the present invention is a semiconductor device including an oxide semiconductor film having a first region and a pair of second regions facing each other with the first region provided therebetween, a gate insulating film over the oxide semiconductor film, and a first electrode overlapping with the first region, over the gate insulating film. The first region is a non-single-crystal oxide semiconductor region including a c-axis-aligned crystal portion. The pair of second regions is an oxide semiconductor region containing dopant and including a plurality of crystal portions.

Further, the region containing dopant may include a non-single-crystal oxide semiconductor region including a c-axis-aligned crystal portion, over the oxide semiconductor region including the plurality of crystal portions.

The oxide semiconductor film preferably contains two or more elements selected from In, Ga, Sn, and Zn.

The semiconductor device further includes a second electrode and a third electrode each of which electrically connected to one of the pair of second regions.

The pair of second regions can be formed in a self-aligned manner by using the first electrode as a mask and adding dopant through the gate insulating film. The pair of second regions serves at least as a source region and a drain region. The second region containing dopant is formed at both ends of the first region which is a channel formation region, and thus, an electric field applied to the first region can be relieved, so that an influence of shortening a channel length such as fluctuation in threshold voltage of a transistor can be reduced.

In addition, a pair of third regions whose dopant concentration is lower than that of the pair of second regions can be formed in a self-aligned manner by forming a sidewall insulating film on a side surface of the first electrode, using the first electrode as a mask, and adding dopant through the sidewall insulating film.

That is, each of the third regions is formed between the first region serving as a channel formation region and one of the second regions. The pair of second regions whose dopant concentration is higher than that of the pair of third regions serves as a source region and a drain region. The pair of third regions whose dopant concentration is lower than that of the pair of second regions serves as an electric-field relaxation region where an electric field applied to the channel formation region is relieved. With the electric-field relaxation region, an influence of shortening a channel length such as fluctuation in threshold voltage can be reduced. In addition, the pair of second regions and the pair of third regions are oxide semiconductor regions including a plurality of crystal portions.

Another embodiment of the present invention is a semiconductor device including an oxide semiconductor film having a first region, a pair of second regions facing each other with the first region provided therebetween, and a pair of third regions each provided between the first region and one of the second regions, a gate insulating film over the oxide semiconductor film, and a first electrode provided over the gate insulating film and overlapping with the first region. The first region is a non-single-crystal oxide semiconductor region including a c-axis-aligned crystal portion. The pair of second regions and the pair of third regions are oxide semiconductor regions containing dopant and including a plurality of crystal portions. The dopant concentration of the pair of second regions is higher than that of the pair of third regions.

In addition, the pair of second regions and the pair of third regions may include a non-single-crystal oxide semiconductor portion including a c-axis-aligned crystal portion, over the oxide semiconductor region including a plurality of crystal portions.

For example, the dopant added to the pair of second regions and the pair of third regions is a Group 15 element or boron. For example, the dopant is one or more elements selected from phosphorus, arsenic, antimony, and boron, and the dopant concentration of the pair of second regions and the dopant concentration of the pair of third regions are preferably higher than or equal to $5\times10^{18}$ cm$^{-3}$ and lower than or equal to $1\times10^{22}$ cm$^{-3}$. It is further preferable that the dopant concentration of the pair of second regions be higher than or equal to $5\times10^{20}$ cm$^{-3}$ and lower than or equal to $1\times10^{22}$ cm$^{-3}$ and that the dopant concentration of the pair of third regions be higher than or equal to $5\times10^{18}$ cm$^{-3}$ and lower than $5\times10^{21}$ cm$^{-3}$.

Further, the transistor of one embodiment of the present invention may be a top-gate transistor having a top-contact structure so that the second electrode and the third electrode are in contact with top surfaces of the pair of second regions. Alternatively, the transistor may be a top-gate transistor having a bottom-contact structure so that the second electrode and the third electrode are in contact with bottom surfaces of the pair of second regions.

When the dopant is added to the oxide semiconductor film having a channel formation region using the first electrode as a mask, the dopant may be added without passing through the gate insulating film. For example, the gate insulating film may be formed only over the first region.

In the case where an oxide insulating film is used as the gate insulating film and a nitride insulating film is used as the sidewall insulating film, the gate insulating film (the oxide insulating film) serves as an etching stopper in formation of the sidewall insulating film (the nitride insulating film) owing to a difference of the etching rates between the nitride insulating film and the oxide insulating film; thus, excessive etching of the oxide semiconductor film in contact with a bottom surface of the gate insulating film can be suppressed. As a result, the gate insulating film remains over the first region, the pair of second regions, and the pair of third regions.

In the case where an oxide insulating film is used as each of the sidewall insulating film and the gate insulating film, the gate insulating film provided over the pair of second regions and the pair of third regions can be etched by utilizing a difference in etching rates between the oxide insulating film and the first electrode. As a result, the gate insulating film remains over the first region.

According to one embodiment of the present invention, a semiconductor device in which fluctuation in electric characteristics due to miniaturization is less likely to be caused can be provided.

DETAILED DESCRIPTION OF THE INVENTION

Figure 1A:
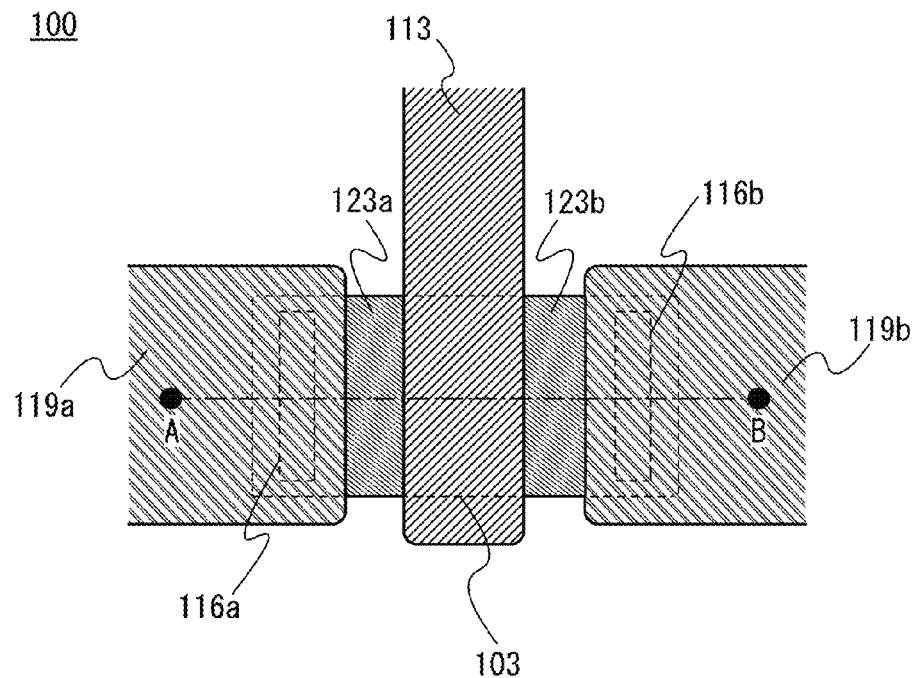
FIGS. 1A and 1B are a top view and a cross-sectional view illustrating an example of a semiconductor device of one embodiment of the present invention.

Embodiments of the present invention will be described below with reference to the accompanying drawings. Note that the present invention is not limited to the following description, and it will be easily understood by those skilled in the art that various changes and modifications can be made without departing from the spirit and scope of the present invention. Therefore, the present invention should not be construed as being limited to the description in the following embodiments. Note that the same portions or portions having the same function in the structure of the present invention described below are denoted by the same reference numerals in common among different drawings and repetitive description thereof will be omitted.

Note that in each drawing described in this specification, the size, the film thickness, or the region of each component is exaggerated for clarity in some cases. Therefore, embodiments of the present invention are not limited to such scales.

Note that terms such as "first", "second", and "third" in this specification are used in order to avoid confusion among components, and the terms do not limit the components numerically. Therefore, for example, the term "first" can be replaced with the term "second", "third", or the like as appropriate.

In this specification, the term "film" is used to denote the one which is entirely formed over a surface by a CVD method (including a plasma CVD method and the like), a sputtering method, or the like and the one which is entirely formed over a surface and is then subjected to treatment in a manufacturing process of a semiconductor device.

Note that, functions of "source" and "drain" may become switched in the case that a direction of a current flow is changed during circuit operation, for example. Therefore, the terms "source" and "drain" can be used to denote the drain and the source, respectively, in this specification.

Embodiment 1

In this embodiment, a structure of a transistor and a method for manufacturing the transistor according to one embodiment of the present invention will be described with reference to FIGS. 1A and 1B, FIGS. 2A to 2D, FIGS. 3A to 3D, FIGS. 4A and 4B, FIGS. 5A and 5B, FIGS. 6A and 6B, FIGS. 7A and 7B, and FIG. 8.

<Structure and Characteristic of Transistor 100>

FIG. 1A is a top view of a transistor 100. Note that a base insulating film 102, a gate insulating film 111, and an interlayer insulating film 117 are not illustrated in FIG. 1A for convenience.

As illustrated in FIG. 1A, a first electrode 113 is formed over an oxide semiconductor film 103 including a first region 105 (not shown) and a pair of second regions 123a and 123b. In addition, a second electrode 119a is formed to be in contact with the second region 123a through an opening 116a and a third electrode 119b is formed to be in contact with the second region 123b through an opening 116b. Further, the second electrode 119a and the third electrode 119b are in contact with a top surface of the second region 123a and a top surface of the second region 123b, respectively; thus, the transistor 100 is a top-gate top-contact transistor.

Figure 1B:
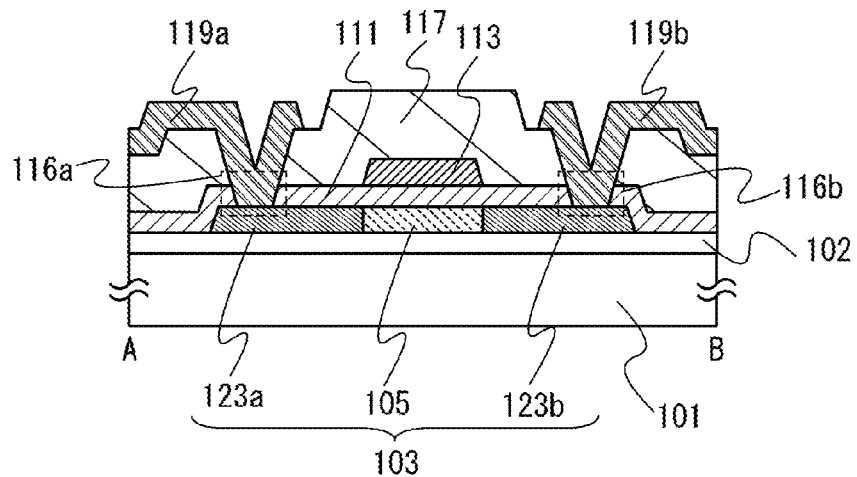

FIG. 1B is a cross-sectional view of the transistor 100 along line A-B. In FIG. 1B, the base insulating film 102 is provided over a substrate 101, and the oxide semiconductor film 103 including the first region 105 and the pair of second regions 123a and 123b is provided over the base insulating film 102. The pair of second regions 123a and 123b faces each other with the first region 105 provided therebetween.

The gate insulating film 111 is provided over the oxide semiconductor film 103. The first electrode 113 overlapping with the first region 105 is provided over the gate insulating film 111.

The interlayer insulating film 117 is provided over the gate insulating film 111 and the first electrode 113.

The second electrode 119a and the third electrode 119b are provided in contact with the pair of second regions 123a and 123b through the opening 116a and 116b in the gate insulating film 111 and the interlayer insulating film 117 as shown in FIG. 1B. Note that the gate insulating film 111 is in contact with the first region 105 and the pair of second regions 123a and 123b.

The oxide semiconductor film 103 including the first region 105 and the pair of second regions 123a and 123b is a metal oxide containing two or more elements selected from In, Ga, Sn, and Zn. Note that the metal oxide has a bandgap greater than or equal to 2 eV, preferably greater than or equal to 2.5 eV, further preferably greater than or equal to 3 eV. The off-state current of the transistor 100 can be reduced by using such a metal oxide having a wide bandgap.

In the transistor 100, the first region 105 serves as a channel formation region.

The first region 105 is the CAAC-OS described above. As described above, CAAC-OS means a non-single-crystal oxide semiconductor including a triangular, hexagonal, regular triangular, or regular hexagonal atomic arrangement when seen from the direction perpendicular to the a-b plane of the non-single crystal and including a crystal portion in which metal atoms are arranged in a layered manner or metal atoms and oxygen atoms are arranged in a layered manner when seen from the direction perpendicular to the c-axis.

In addition, CAAC-OS is not a single crystal, but this does not mean that the CAAC-OS is composed of only an amorphous component. Although the CAAC-OS includes a crystal portion, a boundary between one crystal portion and another crystal portion is not clear in some cases.

Nitrogen may be substituted for part of oxygen which is a constituent of the CAAC-OS. The c-axes of individual crystal portions included in CAAC-OS may be aligned in one direction (e.g., the direction perpendicular to a surface of a substrate over which CAAC-OS is formed, a surface of CAAC-OS, a surface of a CAAC-OS film, an interface of CAAC-OS, or the like). Alternatively, normals of the a-b planes of individual crystal portions included in CAAC-OS may be aligned in one direction (e.g., the direction perpendicular to a surface of a substrate over which CAAC-OS is formed, a surface of CAAC-OS, a surface of a CAAC-OS film, an interface of CAAC-OS, or the like).

CAAC-OS becomes a conductor, a semiconductor, or an insulator depending on its composition or the like. In addition, CAAC-OS transmits or does not transmit visible light depending on its composition or the like.

In addition, the hydrogen concentration of the first region 105 is lower than $5\times10^{18}$ cm$^{-3}$, preferably lower than or equal to $1\times10^{18}$ cm$^{-3}$, further preferably lower than or equal to $5\times10^{17}$ cm$^{-3}$, and still further preferably lower than or equal to $1\times10^{16}$ cm$^{-3}$. The transistor 100 in which the first region 105 which is a channel formation region includes CAAC-OS and the hydrogen concentration is reduced is a highly reliable transistor having stable electric characteristics, because fluctuation in the threshold voltage between before and after light irradiation and between before and after a gate bias-temperature (BT) stress test is small.

The pair of second regions 123a and 123b is an oxide semiconductor region containing dopant and including a plurality of crystal portions. As dopant, one or more elements selected from phosphorus, arsenic, antimony, and boron is added to the pair of second regions 123a and 123b.

Since the pair of second regions 123a and 123b is a pair of oxide semiconductor regions containing dopant and including a plurality of crystal portions, conductivity of the pair of second regions 123a and 123b is higher than that in the case where the pair of second regions 123a and 123b includes CAAC-OS and does not contain dopant as the first region 105 (in the case where the oxide semiconductor film 103 includes CAAC-OS and does not entirely contain dopant). That is, a resistance component in the channel direction of the oxide semiconductor film 103 can be reduced and thus the on-state current of the transistor 100 can be increased.

For that reason, the conductivity of the pair of second regions 123a and 123b is higher than or equal to 0.1 S/cm and lower than or equal to 1000 S/cm, preferably higher than or equal to 10 S/cm and lower than or equal to 1000 S/cm. Note that when the conductivity is too low, the on-state current of the transistor 100 is decreased. In addition, the carrier density can be increased by increasing the dopant concentration of the pair of the second regions 123a and 123b to increase the conductivity of the pair of the second regions 123a and 123b; however, an excessively high dopant concentration may cause a decrease of the conductivity of the pair of the second regions 123a and 123b.

Accordingly, the dopant concentration of the pair of second regions 123a and 123b is preferably higher than or equal to $5\times10^{18}$ cm$^{-3}$ and lower than or equal to $1\times10^{22}$ cm$^{-3}$. In addition, in the step of adding dopant in the manufacturing process of the transistor 100, the first electrode 113 serves as a mask and thus the first region 105 and the pair of second regions 123a and 123b are formed in a self-aligned manner.

The pair of second regions 123a and 123b serves as at least a source region and a drain region in the transistor 100. The second regions 123a and 123b is provided at each end of the first region 105 which is a channel formation region; thus, an electric field applied to the first region 105 which is a channel formation region can be relieved.

Specifically, the second regions 123a and 123b is provided at each end of the first region 105 which is a channel formation region; thus, a curve of a band edge of a channel formed in the first region 105 can be small. Therefore, in the transistor 100, an influence of shortening a channel length such as a negative shift of a threshold voltage can be reduced.

Further, since the contact resistance between the second region 123a and the second electrode 119a and the contact resistance between the second region 123b and the third electrode 119b are reduced, the on-state current of the transistor 100 can be increased.

<Method for Manufacturing Transistor 100>

Next, a method for manufacturing the transistor 100 will be described with reference to FIGS. 2A to 2D, FIGS. 3A to 3D, and FIGS. 4A and 4B.

There is no particular limitation on a material and the like of the substrate 101 as long as the material has heat resistance high enough to withstand at least heat treatment performed later. For example, a glass substrate, a ceramic substrate, a quartz substrate, or a sapphire substrate may be used as the substrate 101. Further alternatively, a single crystal semiconductor substrate or a polycrystalline semiconductor substrate made of silicon, silicon carbide, or the like, a compound semiconductor substrate made of silicon germanium or the like, an SOI substrate, or the like may be used as the substrate 101. Furthermore, any of these substrates further provided with a semiconductor element may be used as the substrate 101.

In addition, a flexible substrate may also be used as the substrate 101. In the case where a transistor is provided over the flexible substrate, the transistor may be formed directly on the flexible substrate, or the transistor may be formed over a different substrate and then separated from the substrate to be transferred to the flexible substrate. In order to separate the transistor from the substrate and transfer it to the flexible substrate, a region which is easily separated is preferably provided between the different substrate and the transistor.

First, the base insulating film 102 is formed over the substrate 101. The base insulating film 102 is formed using the material described below to have a single-layer structure or a stacked-layer structure.

The base insulating film 102 is formed using any of insulating films selected from oxide insulating films such as a silicon oxide film, a gallium oxide film, and an aluminum oxide film; nitride insulating films such as a silicon nitride film and an aluminum nitride film; a silicon oxynitride film; an aluminum oxynitride film; and a silicon nitride oxide film. Note that the base insulating film 102 preferably contains oxygen in a portion in contact with the oxide semiconductor film 103 formed later. Note that "silicon nitride oxide" contains more nitrogen than oxygen and "silicon oxynitride" contains more oxygen than nitrogen.

An aluminum nitride film, an aluminum nitride oxide film, and a silicon nitride film which have high thermal conductivity are particularly effective in improving thermal dissipation of the transistor 100 when used for the base insulating film 102.

Furthermore, in the manufacture of the transistor 100, the content of an alkali metal such as Li or Na, which is an impurity, is preferably low. In the case where a glass substrate containing an impurity such as an alkali metal is used as the substrate 101, the above nitride insulating film is preferably formed as the base insulating film 102 in order to prevent entry of an alkali metal.

The base insulating film 102 can be formed by a sputtering method, a CVD method, a coating method, or the like. Note that the thickness of the base insulating film 102 is preferably, but not limited to, 50 nm or more. This is because the base insulating film 102 is used to prevent diffusion of an impurity (e.g., an alkali metal such as Li or Na) from the substrate 101 and also to prevent the substrate 101 from being etched by an etching step in a manufacturing process of the transistor 100.

In addition, since the base insulating film 102 preferably contains oxygen in a portion in contact with the oxide semiconductor film 103, an insulating film from which oxygen is released by heating may be used as the base insulating film 102. Note that the expression "oxygen is released by heating" means that the amount of released oxygen which is converted into oxygen atoms is greater than or equal to $1.0 \times 10^{18}$ cm$^{-3}$, preferably greater than or equal to $3.0 \times 10^{20}$ cm$^{-3}$, in thermal desorption spectroscopy (TDS) analysis.

A method for quantifying the amount of released oxygen which is converted into oxygen atoms, with the use of TDS analysis will be described below.

The amount of released gas in TDS analysis is proportional to the integral value of a spectrum. Therefore, the amount of released gas can be calculated based on the integral value of a spectrum of an insulating film and the reference value of a standard sample. The reference value of a standard sample refers to the ratio of the density of a predetermined atom contained in a sample to the integral value of a spectrum.

For example, the number of released oxygen molecules ($N_{O2}$) from an insulating film can be found according to Formula 1 with the TDS analysis results of a silicon wafer containing hydrogen at a predetermined density which is the standard sample and the TDS analysis results of the insulating film. Here, all spectra having a mass number of 32 which are obtained by the TDS analysis are assumed to originate from an oxygen molecule. CH$_3$OH, which is given as a gas having a mass number of 32, is not taken into consideration on the assumption that it is unlikely to be present. Further, an oxygen molecule including an oxygen atom having a mass number of 17 or 18 which is an isotope of an oxygen atom is not taken into consideration either because the proportion of such a molecule in the natural world is minimal.

$$N_{O2} = \frac{N_{H2}}{S_{H2}} \times S_{O2} \times \alpha \qquad \text{[FORMULA 1]}$$

$N_{H2}$ is the value obtained by conversion of the number of hydrogen molecules desorbed from the standard sample into density. $S_{H2}$ is the integral value of a spectrum of the standard sample which is analyzed by TDS. Here, the reference value of the standard sample is set to $N_{H2}/S_{H2}$. $S_{O2}$ is the integral value of a spectrum of the insulating film which is analyzed by TDS. $\alpha$ is a coefficient which influences spectrum intensity in TDS analysis. Japanese Published Patent Application No. H6-275697 can be referred to for details of Formula 1. Note that the above value of the amount of released oxygen is obtained by measurement with a thermal desorption spectroscopy apparatus produced by ESCO Ltd., EMD-WA1000S/W using a silicon wafer containing hydrogen atoms at $1 \times 10^{16}$ cm$^{-3}$ as the standard sample.

Further, in the TDS analysis, part of oxygen is detected as an oxygen atom. The ratio between oxygen molecules and oxygen atoms can be calculated from the ionization rate of the oxygen molecules. Note that, since the above $\alpha$ includes the ionization rate of the oxygen molecules, the number of the released oxygen atoms can also be estimated through the evaluation of the number of the released oxygen molecules.

Note that $N_{O2}$ is the number of the released oxygen molecules. For the insulating film, the amount of released oxygen in the case of being converted into oxygen atoms is twice the number of the released oxygen molecules.

As an example of the film from which oxygen is released by heating, oxygen-excess silicon oxide (SiO$_X$ (X>2)) is given. In the oxygen-excess silicon oxide (SiO$_X$ (X>2)), the number of oxygen atoms per unit volume is more than twice the number of silicon atoms per unit volume. The number of silicon atoms and the number of oxygen atoms per unit volume are measured by Rutherford backscattering spectrometry.

By using the film from which oxygen is released by heating as the base insulating film 102, oxygen can be supplied to the oxide semiconductor film 103 formed later and the interface state between the base insulating film 102 and the oxide semiconductor film 103 can be reduced. Accordingly, electric charge or the like that can be generated owing to operation of the transistor 100 can be prevented from being trapped at the interface between the base insulating film 102 and the oxide semiconductor film 103, and thus the transistor 100 can be a transistor with little deterioration of electric characteristics.

Next, an oxide semiconductor film 130 whose entire region includes CAAC-OS is formed over the base insulating film 102.

There are two kinds of methods for forming the oxide semiconductor film 130 whose entire region includes CAAC-OS, for example. One of the methods is that a step of forming an oxide semiconductor film is performed once while the substrate is heated (method (1)). The other is that a step of forming an oxide semiconductor film is divided into two steps, and heat treatment is performed after each formation of the oxide semiconductor film (method (2)).

First, a case in which the oxide semiconductor film 130 is formed by the method (1) will be described.

Figure 2A:
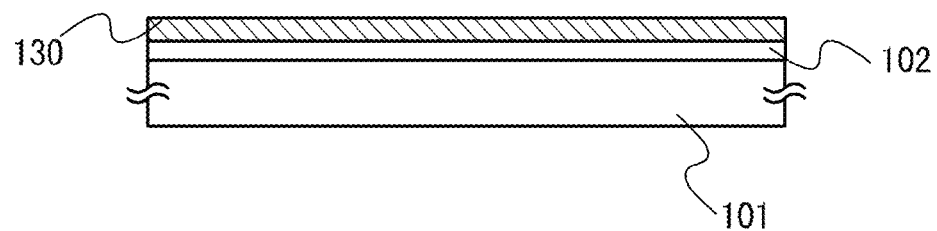
FIGS. 2A to 2D illustrate a method for manufacturing a semiconductor device of one embodiment of the present invention.

The oxide semiconductor film 130 is formed over the base insulating film 102 while the substrate 101 is heated (see FIG. 2A). Note that the oxide semiconductor film 130 may be formed by a sputtering method, a molecular beam epitaxy method, an atomic layer deposition method, a pulsed laser deposition method, or the like. The thickness of the oxide semiconductor film 130 may be greater than or equal to 10 nm and less than or equal to 100 nm, preferably greater than or equal to 10 nm and less than or equal to 30 nm.

A metal oxide material containing two or more elements selected from In, Ga, Zn, and Sn may be used for the oxide semiconductor film 130. For example, a four-component metal oxide such as an In—Sn—Ga—Zn—O-based material; a three-component metal oxide such as an In—Ga—Zn—O-based material, an In—Sn—Zn—O-based material, an In—Al—Zn—O-based material, a Sn—Ga—Zn—O-based material, an Al—Ga—Zn—O-based material, or a Sn—Al—Zn—O-based material; a two-component metal oxide such as an In—Zn—O-based material, a Sn—Zn—O-based material, an Al—Zn—O-based material, a Zn—Mg—O-based material, a Sn—Mg—O-based material, an In—Mg—O-based material, or an In—Ga—O-based material; indium oxide, tin oxide, zinc oxide; or the like may be used. Here, for example, an In—Ga—Zn—O-based material means oxide containing indium (In), gallium (Ga), and zinc (Zn), and there is no particular limitation on the composition ratio. Further, the In—Ga—Zn—O-based oxide semiconductor may contain an element other than In, Ga, and Zn. At this time, the amount of oxygen is preferably in excess of stoichiometry in the oxide semiconductor film. When the amount of oxygen is in excess of stoichiometry, generation of carriers which results from oxygen deficiency in the oxide semiconductor film can be suppressed.

In the case where an In—Ga—Zn—O-based material is used for the oxide semiconductor film 130, an example of the target is a metal oxide target containing In, Ga, and Zn at a composition ratio of $In_2O_3:Ga_2O_3:ZnO=1:1:1$ [molar ratio]. Alternatively, a target having a composition ratio of $In_2O_3:Ga_2O_3:ZnO=1:1:2$ [molar ratio], a target having a composition ratio of $In_2O_3:Ga_2O_3:ZnO=1:1:4$ [molar ratio], or a target having a composition ratio of $In_2O_3:Ga_2O_3:ZnO=2:1:8$ [molar ratio] can be used.

For example, in the case where an In—Zn—O-based material is used for the oxide semiconductor film 130, the atomic ratio of In to Zn is higher than or equal to 0.5 and lower than or equal to 50, preferably higher than or equal to 1 and lower than or equal to 20, further preferably higher than or equal to 1.5 and lower than or equal to 15. Here, when the atomic ratio of the compound is In:Zn:O=X:Y:Z, the relation of Z>1.5X+Y is preferably satisfied.

Further, a material represented by $InMO_3(ZnO)_m$ (m>0) may be used for the oxide semiconductor film. Here, M represents one or more metal elements selected from Ga, Al, Mn, and Co. For example, M may be Ga, Ga and Al, Ga and Mn, Ga and Co, or the like.

The heating temperature of the substrate 101 is higher than or equal to 150° C. and lower than or equal to 450° C., and preferably the substrate temperature is higher than or equal to 200° C. and lower than or equal to 350° C. Note that the heating temperature of the substrate 101 is increased when the oxide semiconductor film 130 is formed, so that CAAC-OS in which the ratio of a crystal portion to an amorphous portion is high can be formed.

Next, a case in which the oxide semiconductor film 130 is formed by the method (2) will be described.

While the temperature of the substrate 101 is kept at a temperature higher than or equal to 200° C. and lower than or equal to 400° C., a first oxide semiconductor film is formed over the base insulating film 102, and then heat treatment is performed at a temperature higher than or equal to 550° C. and lower than the strain point of the substrate under an atmosphere of nitrogen, oxygen, a rare gas, or dry air. By the heat treatment, a c-axis-aligned crystal portion (including a plate-like crystal) is formed in a region including a surface of the first oxide semiconductor film. Next, a second oxide semiconductor film is formed thicker than the first oxide semiconductor film. Then, the heat treatment is performed again at a temperature higher than or equal to 550° C. and lower than the strain point of the substrate, so that crystals in the second oxide semiconductor film grow upward, with the use of the first oxide semiconductor film in which the c-axis-aligned crystal portion (including a plate-like crystal) is formed in the region including the surface as a seed for the crystal growth. Note that the first oxide semiconductor film and the second oxide semiconductor film may be formed using the metal oxide materials which can be used for the oxide semiconductor film 130. Note that the thickness of the first oxide semiconductor film is preferably greater than or equal to 1 nm and less than or equal to 10 nm.

When the oxide semiconductor film 130 is formed by either the method (1) or the method (2) and by a sputtering method, it is preferable that the hydrogen concentration of the oxide semiconductor film 130 be reduced as much as possible. In order to reduce the hydrogen concentration, a rare gas (typically, argon), oxygen, and a mixed gas of a rare gas and oxygen, which are high-purity gases and from which impurities such as hydrogen, water, hydroxyl, and hydride are removed are used as appropriate, as an atmosphere gas supplied to a treatment chamber of a sputtering apparatus. Further, a cryopump having a high capability in evacuating water and a sputter ion pump having a high capability in evacuating hydrogen may be used in combination for evacuation of the treatment chamber.

In this manner, the oxide semiconductor film 130 into which entry of hydrogen is suppressed can be formed. Note that even when the sputtering apparatus is used, the first oxide semiconductor film 130 contains a certain amount of nitrogen. For example, the nitrogen concentration of the first oxide semiconductor film 130 measured by secondary ion mass spectrometry (SIMS) is less than $5 \times 10^{18}$ cm$^{-3}$.

In addition, the base insulating film 102 and the oxide semiconductor film 130 may be successively formed in vacuum. For example, after impurities including hydrogen over the surface of the substrate 101 are removed by heat treatment or plasma treatment, the base insulating film 102 may be formed without exposure to the air, and the oxide semiconductor film 130 may be successively formed without exposure to the air. In this manner, impurities including hydrogen over the surface of the substrate 101 can be reduced, and an atmospheric component can be prevented from attaching to the interface between the substrate 101 and the base insulating film 102 and the interface between the base insulating film 102 and the oxide semiconductor film 130. As a result, it is possible to manufacture the transistor 100 having favorable electric characteristics and high reliability.

Further, during or after the formation of the first oxide semiconductor film 130, charge might be generated owing to oxygen deficiency in the first oxide semiconductor film 130. In general, when oxygen deficiency is caused in an oxide semiconductor, part of the oxygen deficiency serves as a donor to generate an electron as a carrier. That is, also in the transistor 100, part of oxygen deficiency in the first oxide semiconductor film 130 serves as a donor to generate an electron as a carrier and thus the threshold voltage of the transistor 100 is negatively shifted. In addition, the generation of an electron in the oxide semiconductor film 130 often occurs in oxygen deficiency caused in the vicinity of the interface between the oxide semiconductor film 130 and the base insulating film 102.

Figure 2B:
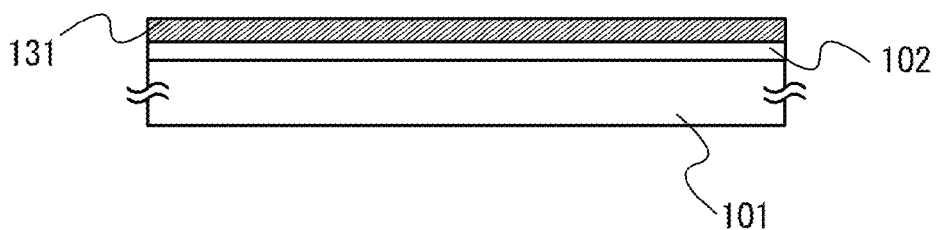

Therefore, after the formation of the first oxide semiconductor film 130, first heat treatment is performed to form an oxide semiconductor film 131 (see FIG. 2B).

By the first heat treatment, hydrogen (including water, hydroxyl, and hydride) is released from the oxide semiconductor film 130, part of oxygen contained in the base insulating film 102 is released, and the oxygen is diffused into the first oxide semiconductor film 130 and to the vicinity of the interface between the base insulating film 102 and the oxide semiconductor film 130. That is, by the first heat treatment, the interface state between the base insulating film 102 and the oxide semiconductor film 130 and oxygen deficiency in the oxide semiconductor film 130 can be reduced. Thus, an influence of carrier trapping at the interface between the oxide semiconductor film 103 and the base insulating film 102 can be reduced in the completed transistor 100. Accordingly, the first heat treatment can suppress a negative shift of the threshold voltage of the transistor 100.

In addition to part of the oxygen deficiency in the oxide semiconductor film 130, hydrogen in the oxide semiconductor film 130 also serves as a donor to generate an electron which is a carrier. By the first heat treatment, the hydrogen concentration of the oxide semiconductor film 130 is reduced, so that the oxide semiconductor film 130 becomes the oxide semiconductor film 131 which is highly purified. The hydrogen concentration of the oxide semiconductor film 131 is lower than $5 \times 10^{18}$ cm$^{-3}$, preferably lower than or equal to $1 \times 10^{18}$ cm$^{-3}$, further preferably lower than or equal to $5 \times 10^{17}$ cm$^{-3}$, and still further preferably lower than or equal to $1 \times 10^{16}$ cm$^{-3}$. Note that the concentration of hydrogen in the oxide semiconductor film 131 is measured by secondary ion mass spectrometry (SIMS).

With the oxide semiconductor film 131 whose hydrogen concentration is sufficiently reduced to be highly purified and the defect states due to oxygen deficiency are reduced by sufficient supply of oxygen, by the first heat treatment, the on-state current of the transistor 100 can be reduced. Specifically, the off-state current (per unit channel width (1 μm) here) at room temperature (25° C.) is 100 zA/μm (1 zA (zeptoampere) is $1 \times 10^{-21}$ A) or lower, preferably 10 zA/μm or lower. Note that since alkali metal such as Li or Na is an impurity, the amount of the alkali metal contained in the oxide semiconductor film 131 is preferably reduced. The concentration of the alkali metal in the oxide semiconductor film 131 is preferably lower than or equal to $2 \times 10^{16}$ cm$^{-3}$, further preferably lower than or equal to $1 \times 10^{15}$ cm$^{-3}$. Further, the amount of an alkaline earth metal is preferably low because the alkaline earth metal is also an impurity.

The first heat treatment is performed at a temperature higher than or equal to 150° C. and lower than the strain point of the substrate, preferably higher than or equal to 250° C. and lower than or equal to 450° C., further preferably higher than or equal to 300° C. and lower than or equal to 450° C., in an oxidizing atmosphere or an inert atmosphere. Here, the oxidizing atmosphere refers to an atmosphere including an oxidizing gas such as oxygen, ozone, or nitrogen oxide at 10 ppm or higher. The inert atmosphere refers to an atmosphere which includes the oxidizing gas at lower than 10 ppm and is filled with nitrogen or a rare gas. The treatment time is 3 minutes to 24 hours. Heat treatment for over 24 hours is not preferable because the productivity is reduced.

There is no particular limitation on a heating apparatus used for the first heat treatment, and the apparatus may be provided with a device for heating an object to be processed by heat radiation or heat conduction from a heating element such as a resistance heating element. For example, an electric furnace, or a rapid thermal annealing (RTA) apparatus such as a gas rapid thermal annealing (GRTA) apparatus or a lamp rapid thermal annealing (LRTA) apparatus can be used. An LRTA apparatus is an apparatus for heating an object to be processed by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for heat treatment using a high-temperature gas.

Figure 2C:
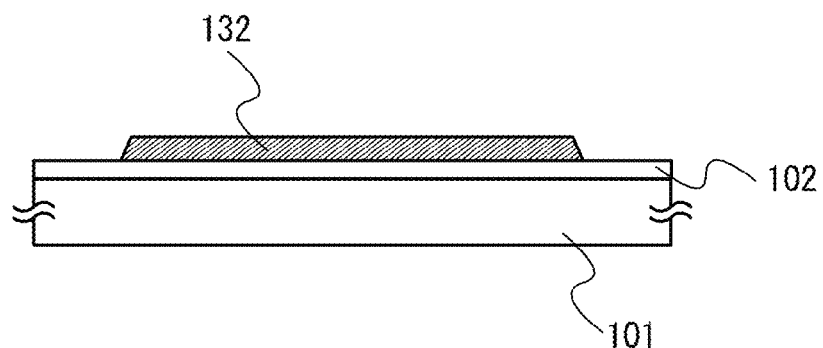

Next, a resist mask is formed over the oxide semiconductor film 131 through a photolithography step, and the oxide semiconductor film 131 is etched to have a desired shape using the resist mask, so that an island-shaped oxide semiconductor film 132 is formed (see FIG. 2C). Note that the resist mask can be formed by an ink-jet method, a printing method, or the like as appropriate, as well as through the photolithography step. This etching is preferably performed so that an end portion of the island-shaped oxide semiconductor film 132 has a tapered shape. The island-shaped oxide semiconductor film 132 is formed to have a tapered end portion, whereby the coverage with a film formed in a later step of the manufacturing process of the transistor 100 can be improved, and thus, disconnection of the film can be prevented. Note that the tapered shape can be obtained by etching while removing the resist mask.

The first etching step in this step may be dry etching, wet etching, or combination thereof. As an etchant used for wet etching, a mixed solution of phosphoric acid, acetic acid, and nitric acid, an ammonia hydrogen peroxide mixture (hydrogen peroxide water at 31 wt %:ammonia water at 28 wt %:water=5:2:2 (volume ratio)), or the like can be used. In addition, ITO07N (produced by KANTO CHEMICAL CO., INC.) may also be used.

As an etching gas used for dry etching, a gas containing chlorine (a chlorine-based gas such as chlorine ($Cl_2$), boron trichloride ($BCl_3$), silicon tetrachloride ($SiCl_4$), or carbon tetrachloride ($CCl_4$)) is preferably used.

Alternatively, a gas containing fluorine (a fluorine-based gas such as carbon tetrafluoride ($CF_4$), sulfur hexafluoride ($SF_6$), nitrogen trifluoride ($NF_3$), or trifluoromethane ($CHF_3$)); hydrogen bromide (HBr); oxygen ($O_2$); any of these gases to which a rare gas such as helium (He) or argon (Ar) is added; or the like can be used.

As dry etching, a parallel plate reactive ion etching (RIE) method, an inductively coupled plasma (ICP) etching method, or the like can be used. In order to process the film into a desired shape, the etching condition (the amount of electric power applied to a coil-shaped electrode, the amount of electric power applied to an electrode on a substrate side, the temperature of the electrode on the substrate side, or the like) is adjusted as appropriate.

Next, the gate insulating film 111 is formed over the oxide semiconductor film 132. The gate insulating film 111 is formed to have a single-layer structure or a stacked-layer structure using a material which can be used for the base insulating film 102. In addition, the thickness of the gate insulating film 111 is preferably greater than or equal to 1 nm and less than or equal to 300 nm, further preferably greater than or equal to 5 nm and less than or equal to 50 nm.

A high-k material such as hafnium oxide, yttrium oxide, hafnium silicate (HfSi$_x$O$_y$ (x>0, y>0)), hafnium silicate to which nitrogen is added (HfSi$_x$O$_y$N$_z$ (x>0, y>0, z>0)), or hafnium aluminate (HfAl$_x$O$_y$ (x>0, y>0)) may be used. Because of the high dielectric constant, a high-k material enables increase in the physical thickness of the gate insulating film while maintaining the capacitance of the gate insulating film as the same as the case that, for example, a silicon film is used for the gate insulating film, thereby reducing the gate leakage current. Note that the gate insulating film 111 may be formed to have a single-layer structure using the high-k material or a stacked-layer structure using the high-k material and the material which can be used for the base insulating film 102.

Note that the portion where the gate insulating film 111 is in contact with the oxide semiconductor film 132 preferably contains oxygen, and therefore, the gate insulating film 111 is preferably an oxide insulating film or a film from which oxygen is released by heating.

Figure 2D:
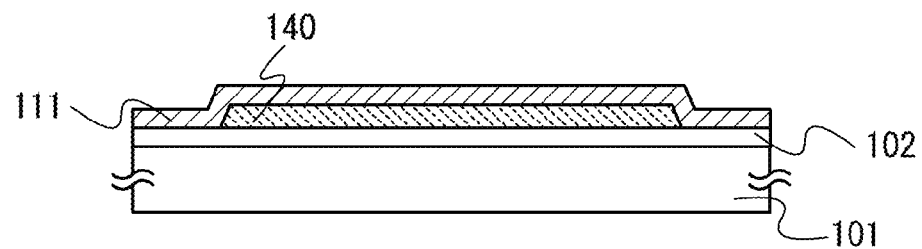

The gate insulating film 111 is formed and then second heat treatment is performed to form an island-shaped oxide semiconductor film 140 (see FIG. 2D). By the second heat treatment, hydrogen (including water, hydroxyl, and hydride) is released from the oxide semiconductor film 132, and part of oxygen contained in the base insulating film 102 and the gate insulating film 111 is released, and thus, oxygen can be diffused into the oxide semiconductor film 132, to the vicinity of the interface between the base insulating film 102 and the oxide semiconductor film 132, and into the vicinity of the interface between the oxide semiconductor film 132 and the gate insulating film 111. That is, by the second heat treatment, oxygen deficiency in the oxide semiconductor film 132, the interface state between the base insulating film 102 and the oxide semiconductor film 132, and the interface state between the oxide semiconductor film 132 and the gate insulating film 111 can be reduced.

The conditions and the apparatus which can be employed in the first heat treatment may be employed as appropriate in the second heat treatment.

Note that it is possible to perform only the second heat treatment which also serves as the first heat treatment without performing the first heat treatment; however, when both of the first heat treatment and the second heat treatment are performed, the interface states and the oxygen deficiency can be efficiently reduced.

Figure 3A:
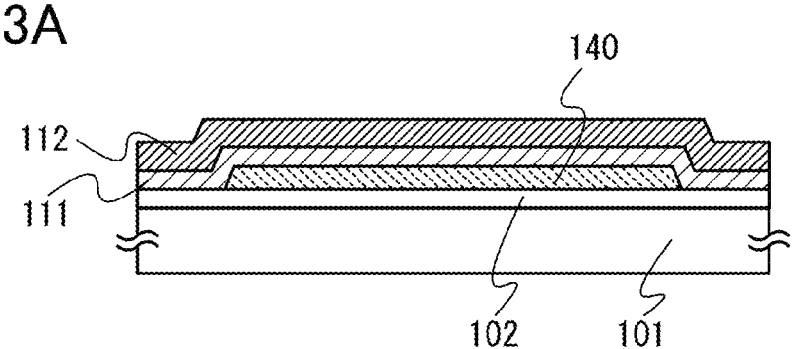
FIGS. 3A to 3D illustrate a method for manufacturing a semiconductor device of one embodiment of the present invention.

Next, a conductive film 112 is formed over the gate insulating film 111 using a conductive material which can be used for the first electrode 113 (see FIG. 3A). The thickness of the conductive film 112 can be determined as appropriate depending on the electric resistance of the conductive material described below and a period of time for the manufacturing step. For example, the thickness of the conductive film 112 may be greater than or equal to 10 nm and less than or equal to 500 nm.

A conductive material which can be used for the first electrode 113 is a metal such as aluminum, titanium, chromium, nickel, copper, yttrium, zirconium, molybdenum, silver, tantalum, or tungsten; or an alloy including any of these metals as its main component. In addition, the conductive film 112 is formed using the conductive material to have a single-layer structure or a stacked-layer structure. For example, a single-layer structure of an aluminum film containing silicon, a two-layer structure in which a titanium film is stacked over an aluminum film, a two-layer structure in which a titanium film is stacked over a tungsten film, a two-layer structure in which a copper film is formed over a copper-magnesium-aluminum alloy film, and a three-layer structure in which a titanium film, an aluminum film, and a titanium film are stacked in this order can be given. Note that a transparent conductive material containing indium oxide, tin oxide, or zinc oxide may be used.

Figure 3B:
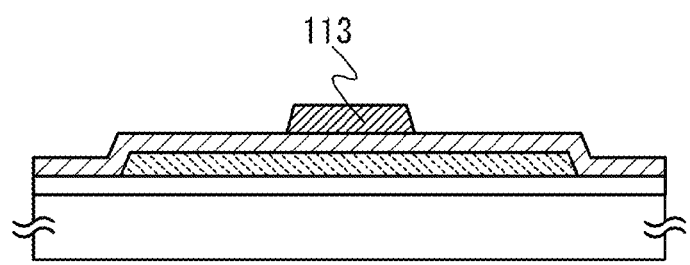

Then, a resist mask is formed over the conductive film 112 through a photolithography step, and the conductive film 112 is etched to have a desired shape using the resist mask, so that the first electrode 113 is formed (see FIG. 3B). The first electrode 113 serves as at least a gate electrode, and in addition, may also serve as a gate wiring. Note that the resist mask can be formed by an ink-jet method, a printing method, or the like as appropriate, as well as through the photolithography step. For the etching here, dry etching or wet etching may be employed as appropriate, as in the process of the oxide semiconductor film 130.

Further, it is preferable that the gate insulating film 111 and the conductive film to be the first electrode 113 be successively formed without exposure to the air.

Further, an In—Ga—Zn—O film containing nitrogen, an In—Sn—O film containing nitrogen, an In—Ga—O film containing nitrogen, an In—Zn—O film containing nitrogen, a Sn—O film containing nitrogen, an In—O film containing nitrogen, or a film of a metal nitride (such as InN or ZnN) is preferably provided between the first electrode 113 and the gate insulating film 111. These films each have a work function of 5 eV or higher, preferably 5.5 eV or higher, and thus the threshold voltage in electric characteristics of the transistor 100 can be positively shifted; consequently, the transistor 100 can be a so-called normally-off transistor. For example, in the case of using an In—Ga—Zn—O film containing nitrogen, an In—Ga—Zn—O film having a higher nitrogen concentration than at least the oxide semiconductor film 140, specifically, an In—Ga—Zn—O film having a nitrogen concentration of 7 at. % or higher is used.

Figure 3C:
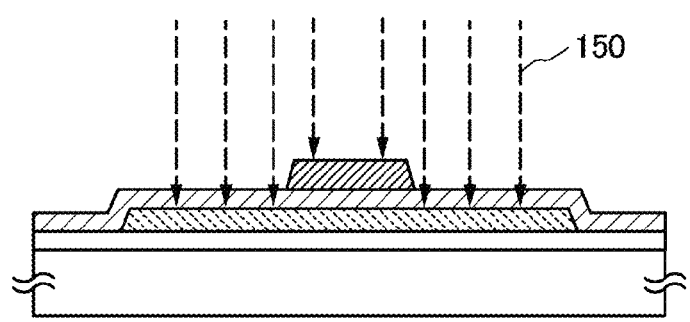
Figure 3D:
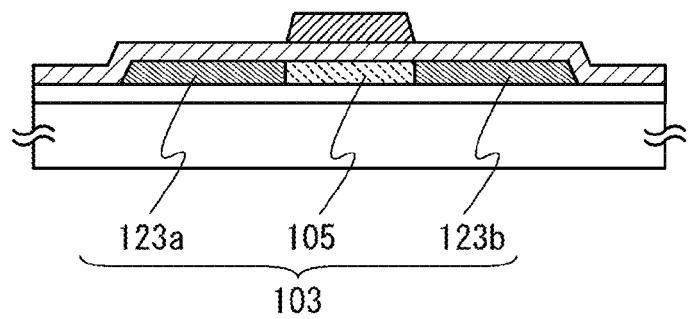
Figure 4A:
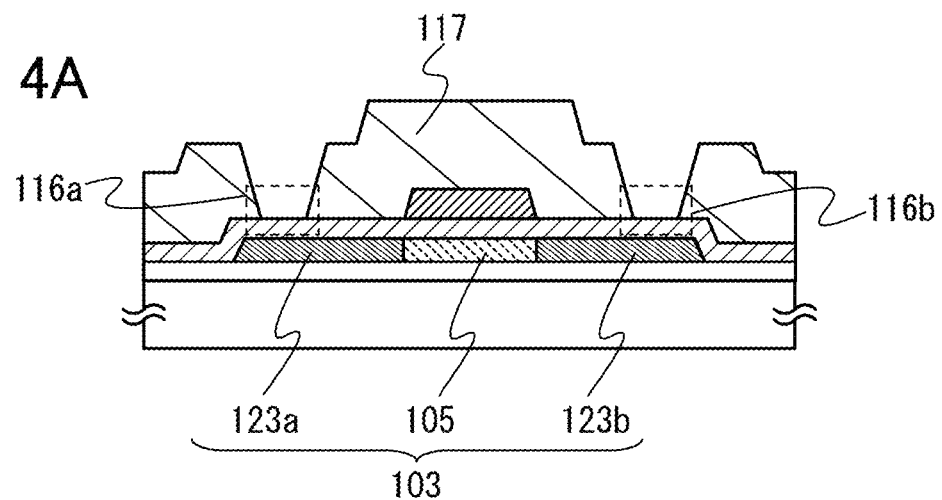
FIGS. 4A and 4B illustrate a method for manufacturing a semiconductor device of one embodiment of the present invention.
Figure 4B:
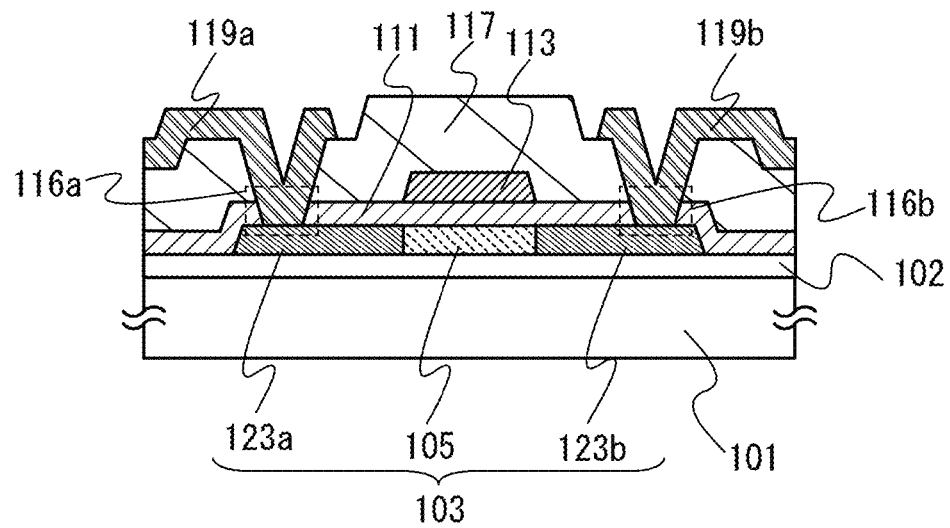

Next, treatment for adding dopant 150 to the oxide semiconductor film 140 is performed (see FIG. 3C).

The dopant 150 is a Group 15 element or boron, or more specifically, one or more selected from phosphorus, arsenic, antimony, and boron. As a method for adding the dopant 150 to the oxide semiconductor film 140, an ion doping method or an ion implantation method can be used.

When an ion doping method or an ion implantation method is used, the depth to which the dopant 150 is added (an addition region) can be easily controlled and thus the dopant 150 can be added to the oxide semiconductor film 140 with high accuracy. The dopant 150 may be added by an ion doping method or an ion implantation method while the substrate 101 is heated.

Note that the treatment for adding the dopant 150 to the oxide semiconductor film 140 may be performed plural times. In the case where the treatment for adding the dopant 150 to the oxide semiconductor film 140 is performed plural times, the kind of the dopant 150 may be the same in the plural treatments or different in every treatment.

The first electrode 113 serves as a mask when the dopant 150 is added to the oxide semiconductor film 140; therefore, the dopant 150 is not added to a region of the oxide semiconductor film 140 overlapping with the first electrode 113, so that the region becomes the first region 105 serving as a channel formation region.

The region where the dopant 150 is added also becomes an amorphous region where crystallinity is decreased owing to damage by addition of the dopant 150. By adjusting the additive amount of the dopant 150 or the like, the degree of damage can be reduced so that the region is prevented from becoming completely amorphous. That is, the region where the dopant 150 is added has a proportion of amorphous region higher than at least the first region 105. It is preferable that the region is not completely amorphous because crystallization through third heat treatment performed in the following step can be easily performed.

Next, the third heat treatment is performed after the dopant 150 is added. Through the third heat treatment, the region where the dopant 150 is added can be the pair of second regions 123a and 123b in which the dopant is contained and which is an oxide semiconductor region including a plurality of crystal portions (see FIG. 3D).

The pair of second regions 123a and 123b serves as a source region and a drain region. In addition, the oxide semiconductor region including a plurality of crystal portions which is the pair of second regions 123a and 123b is different from CAAC-OS included in the first region 105. Note that the crystallinity of the first region 105 included in CAAC-OS is improved through the third heat treatment in some cases.

The third heat treatment is performed at a temperature higher than or equal to 450° C. and lower than the strain point of the substrate, preferably higher than or equal to 650° C. and lower than the strain point of the substrate, under a reduced-pressure atmosphere, an oxidizing atmosphere, or an inert atmosphere. Here, the oxidation atmosphere refers to an atmosphere containing an oxidation gas such as oxygen, ozone, or nitrogen oxide at 10 ppm or higher. The inert atmosphere refers to an atmosphere containing the oxidation gas at lower than 10 ppm and is filled with nitrogen or a rare gas. The treatment time is for 1 hour to 24 hours. Heat treatment for longer than 24 hours is not preferable because the productivity is reduced.

The heating apparatus which can be used in the first heat treatment and the second heat treatment can be used in the third heat treatment.

In such a manner, the dopant 150 is added to the oxide semiconductor film 140 utilizing the first electrode 113 as a mask and then the third heat treatment is performed; thus, the first region 105 which is a channel formation region and the pair of second regions 123a and 123b which is a source region and a drain region can be formed in a self-aligned manner.

Next, an insulating film to be the interlayer insulating film 117 is formed over the gate insulating film 111 and the first electrode 113. A resist mask is formed over the insulating film to be the interlayer insulating film 117 through a photolithography step and etching is performed using the resist mask to form the openings 116a and 116b (see FIG. 4A). Note that the resist mask can be formed by an ink-jet method, a printing method, or the like as appropriate, as well as through the photolithography step. For the etching here, dry etching or wet etching may be employed as appropriate as in the process of the oxide semiconductor film 130.

The interlayer insulating film 117 may be formed using a silicon oxide film, a silicon oxynitride film, a silicon nitride oxide film, or a silicon nitride film by a sputtering method, a CVD method, or the like. At this time, a film from which oxygen is less likely to be released by heating is preferably used as the interlayer insulating film 117. This is for prevention against a decrease in the conductivity of the pair of second regions 123a and 123b. Specifically, the interlayer insulating film 117 may be formed by a CVD method with the use of a mixture which includes a silane gas as a main material and a proper source gas selected from a nitrogen oxide gas, a nitrogen gas, a hydrogen gas, and a rare gas. The substrate temperature may be set to higher than or equal to 300° C. and lower than or equal to 550° C. By using a CVD method, the film from which oxygen is less likely to be released by heating can be formed.

Next, a conductive film is formed to be in contact with the pair of second regions 123a and 123b through the openings 116a and 116b. A resist mask is formed over the conductive film through a photolithography step and the conductive film is etched using the resist mask to form the second electrode 119a and the third electrode 119b (see FIG. 4B). Note that the second electrode 119a and the third electrode 119b can be formed in a manner similar to the first electrode 113.

The second electrode 119a and the third electrode 119b serve as at least a source electrode and a drain electrode, and in addition, as a source wiring and a drain wiring.

Through the above steps, the transistor 100 can be manufactured.

Modification Example 1 of Transistor 100

In addition, the third heat treatment is performed at a temperature higher than or equal to 550° C. and lower than the strain point of the substrate under an oxidizing atmosphere, so that in the pair of second regions 123a and 123b, non-single-crystal oxide semiconductor regions 107a and 107b including a c-axis-aligned crystal portion and containing the dopant 150 can be formed over oxide semiconductor regions 109a and 109b including a plurality of crystal portions and containing the dopant 150.

Figure 5A:
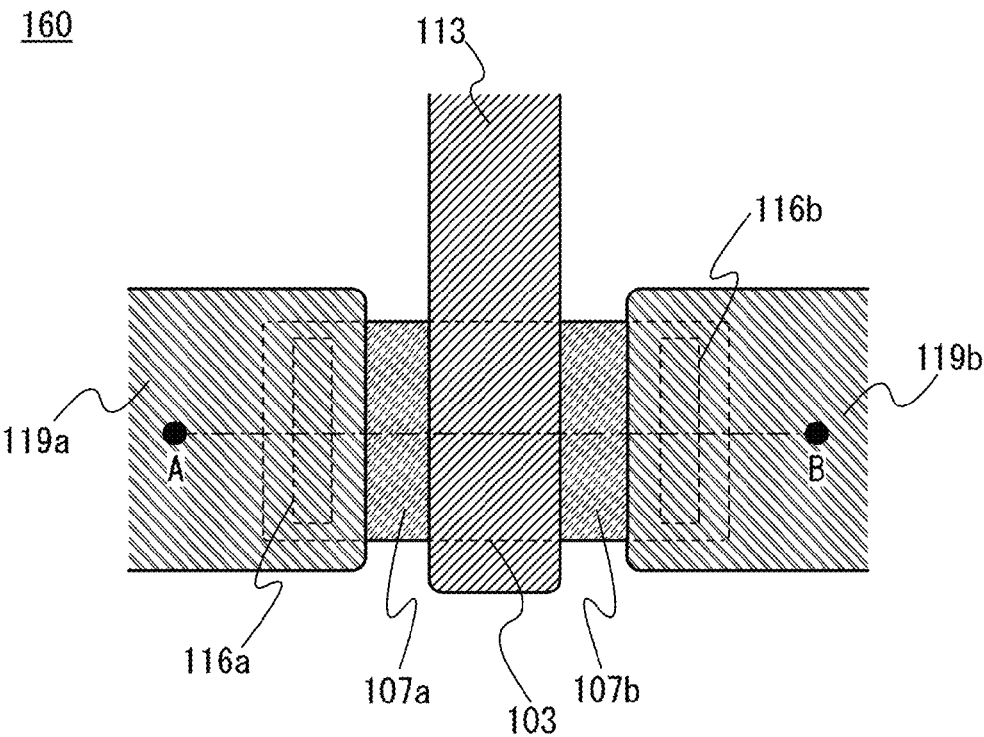
FIGS. 5A and 5B are a top view and a cross-sectional view illustrating an example of a semiconductor device of one embodiment of the present invention.

FIG. 5A is a top view of a transistor 160 manufactured in this manner. Further, FIG. 5B is a cross-sectional view taken along line A-B in FIG. 5A.

Figure 5B:
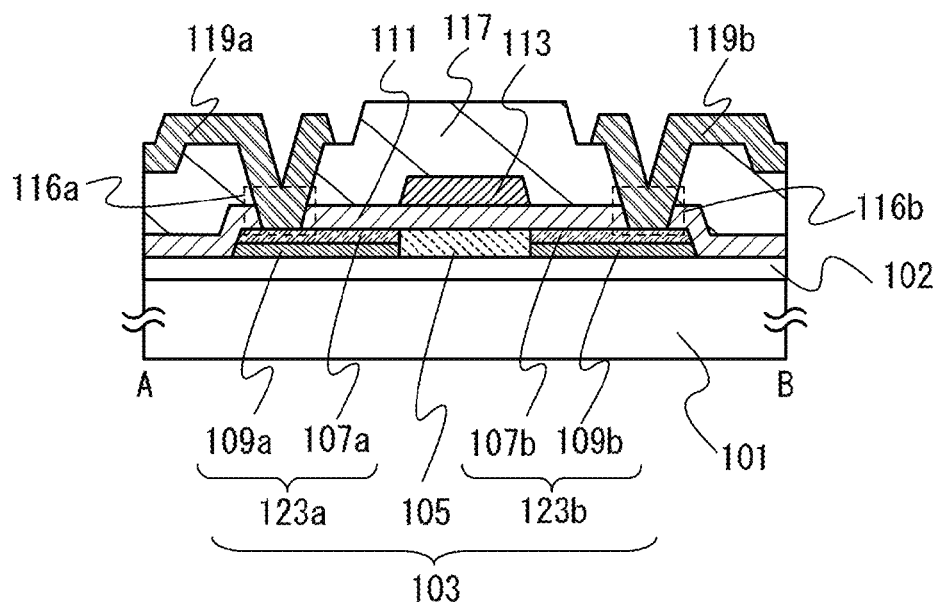

The pair of second regions 123a and 123b of the transistor 160 includes the non-single-crystal oxide semiconductor regions 107a and 107b including a c-axis-aligned crystal portion and containing the dopant 150 and the oxide semiconductor regions 109a and 109b including a plurality of crystal portion and containing the dopant 150 (see FIG. 5B). Note that the dopant concentration of the oxide semiconductor regions 107a and 107b and that of the oxide semiconductor regions 109a and 109b are the same.

Further, the second electrode 119a and the third electrode 119b are in contact with the oxide semiconductor regions 107a and 107b through the openings 116a and 116b. Note that the other components of the transistor 160 are similar to those of the transistor 100.

In addition, the third heat treatment is performed under the above-described conditions for 1 hour, the oxide semiconductor regions 107a and 107b is formed with a thickness of 2 nm or more from the top surface of the pair of second regions 123a and 123b toward the bottom surface of the pair of second regions 123a and 123b. As the time of the third heat treatment under the above-described conditions is increased, the thickness of the oxide semiconductor regions 107a and 107b can be increased.

A difference between the transistor 100 and the transistor 160 is only the structure of the pair of second regions 123a and 123b, and thus the description of the transistor 100 can be referred to for the transistor 160.

Also in the transistor 160, a curve of a band edge of a channel formed in the first region 105 can be small, and thus, an influence of shortening a channel length such as a negative shift of the threshold voltage can be reduced. Further, the contact resistance between the second region 123a and the second electrode 119a and the contact resistance between the second region 123b and the third electrode 119b can be reduced, and a resistance component in the channel direction of the pair of second regions 123a and 123b can be reduced; accordingly, the on-state current of the transistor 160 can be increased.

Since the transistor 160 includes the pair of second regions 123a and 123b including the oxide semiconductor regions 107a and 107b and the oxide semiconductor regions 109a and 109b, fluctuation in the threshold voltage between before and after light irradiation and between before and after a gate bias-temperature (BT) stress test is considered to be reduced as compared to the case where the pair of second regions 123a and 123b is an amorphous region. For that reason, the transistor 160 has high reliability.

Modification Example 2 of Transistor 100

The gate insulating film 111 is etched at the same time as the first electrode 113 is formed in the manufacturing process of the transistor 100, a gate insulating film 121 can be formed only over the first region 105 of the oxide semiconductor film 103.

Figure 6A:
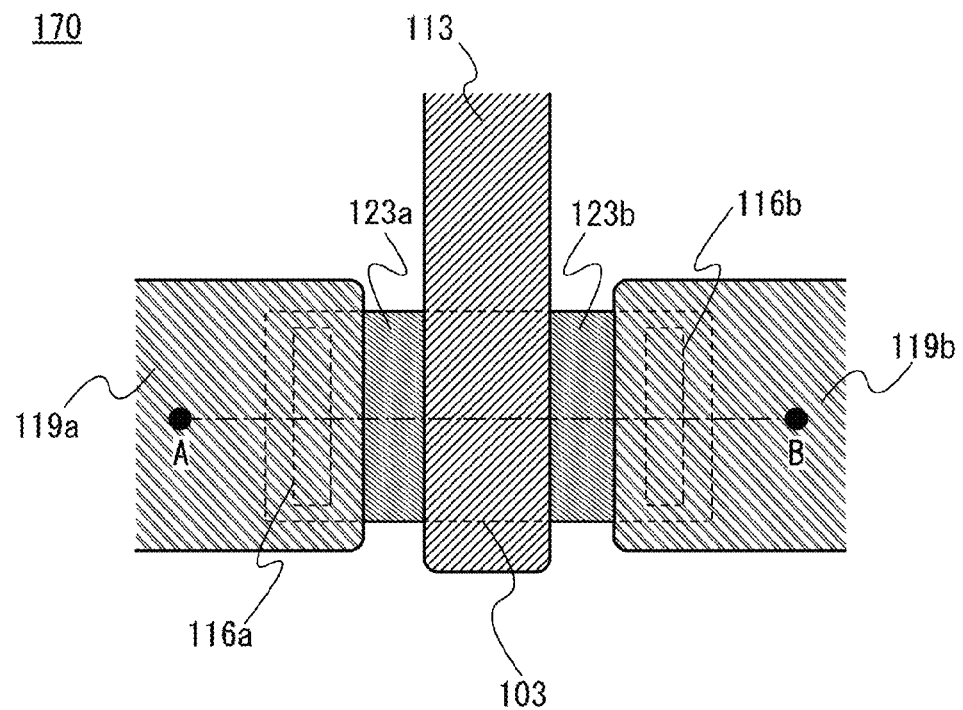
FIGS. 6A and 6B are a top view and a cross-sectional view illustrating an example of a semiconductor device of one embodiment of the present invention.
Figure 6B:
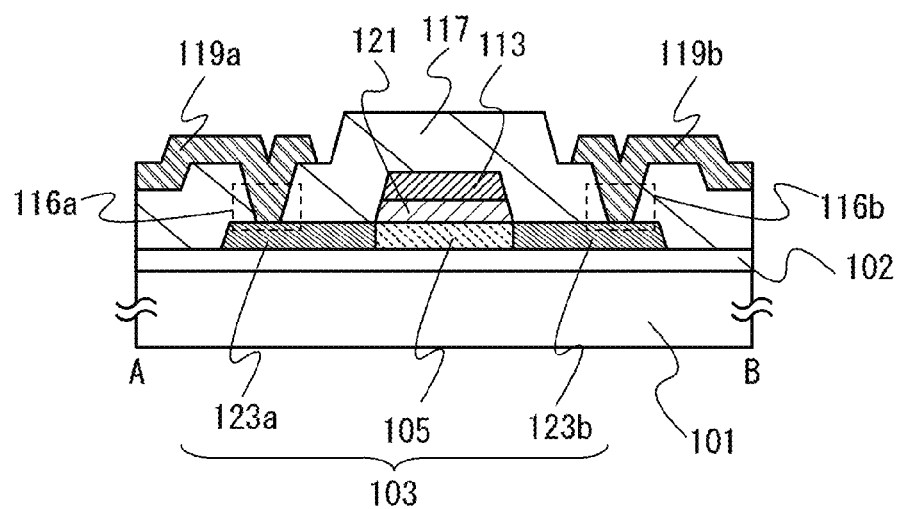

FIG. 6A is a top view of a transistor 170 manufactured in this manner. Further, FIG. 6B is a cross-sectional view taken along line A-B in FIG. 6A. The transistor 170 has a top-view structure similar to that of the transistor 100 and is a top-gate top-contact transistor.

A difference between the transistor 100 and the transistor 170 is only the structure of the gate insulating film 111, and thus the description of the transistor 100 can be referred to for the transistor 170.

Also in the transistor 170, a curve of a band edge of a channel formed in the first region 105 can be small, and thus, an influence of shortening a channel length such as a negative shift of the threshold voltage can be reduced. Further, the contact resistance between the second region 123a and the second electrode 119a and the contact resistance between the second region 123b and the third electrode 119b can be reduced, and a resistance component in the channel direction of the pair of second regions 123a and 123b can be reduced; accordingly, the on-state current of the transistor 170 can be increased.

Since the transistor 170 includes the pair of second regions 123a and 123b including an oxide semiconductor regions including a plurality of crystal portions, fluctuation in the threshold voltage between before and after light irradiation and between before and after a gate bias-temperature (BT) stress test is considered to be reduced as compared to the case where the pair of second regions 123a and 123b is an amorphous region. For that reason, the transistor 170 has high reliability.

A method for manufacturing the transistor 170 will be described with reference to FIGS. 3A to 3C, FIGS. 7A and 7B, and FIG. 8. In the manufacturing process of the transistor 170, steps up to and including a step of forming the conductive film 112 (see FIG. 3A) are similarly performed as in the transistor 100.

Figure 7A:
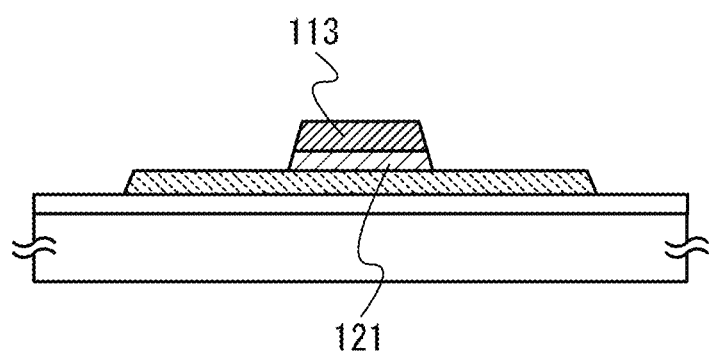
FIGS. 7A and 7B illustrate a method for manufacturing a semiconductor device of one embodiment of the present invention.
Figure 7B:
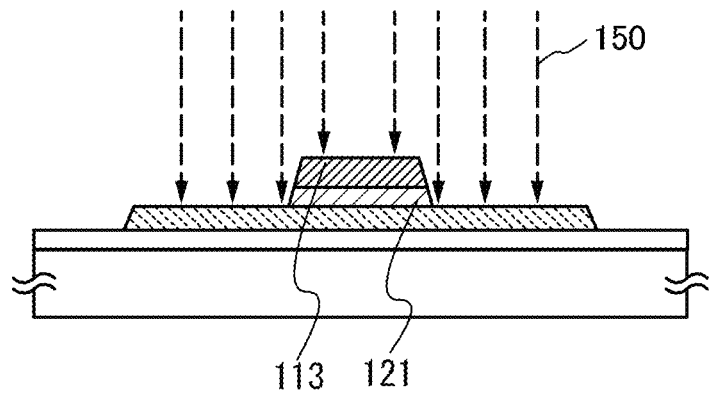

The conductive film 112 is formed and then etching treatment is performed on the conductive film 112 and the gate insulating film 111, so that a gate insulating film 121 overlapped only the first electrode 113 and the first region 105 of the oxide semiconductor film 103 formed later can be formed (see FIG. 7A).

In addition, the gate insulating film 121 is in contact with only the first region 105 and thus does not follow the shape of (does not cover a step formed by) the oxide semiconductor film 140. In other words, the gate insulating film 121 does not have a portion which extends beyond a step formed by the oxide semiconductor film 140. Thus, also in the completed transistor 170, the gate insulating film 121 does not have a portion which extends beyond a step formed by the oxide semiconductor film 103, which contributes to a reduction in the leakage current of the transistor 170 due to disconnection of the gate insulating film 121 and an increase in the withstand voltage of the gate insulating film 121. Therefore, even when the gate insulating film 121 whose thickness is reduced to around 5 nm is used, the transistor 170 can operate. Note that a reduction in the thickness of the gate insulating film 121 leads to reduction of an influence of shortening a channel length, and also leads to an increase in the operation speed of the transistor.

Moreover, in the transistor 170, since the gate insulating film 121 does not have a portion which extends beyond the step, parasitic capacitance is hardly caused between the first electrode 113 and the pair of second regions 123a and 123b. Consequently, even when the channel length of the transistor 170 is shortened, fluctuation in the threshold voltage can be reduced.

The following steps to manufacture the transistor 170 can be performed in a manner similar to those in the manufacturing process of the transistor 100. Note that in the manufacturing steps of the transistor 170, the step of adding the dopant 150 is different from that in the transistor 100; the dopant 150 is added with the use of the first electrode 113 as a mask in the state where the oxide semiconductor film 140 is partly exposed (see FIG. 7B).

In the case where the dopant 150 is added in the state where the oxide semiconductor film 140 is partly exposed as in the transistor 170, the dopant 150 can be also added by a method other than an ion doping method or an ion implantation method. For example, plasma treatment can be given in which plasma is generated in an atmosphere of a gas containing an added element and an object to which the element is added (here, the oxide semiconductor film 140) is irradiated with the plasma. As an apparatus for generating the plasma, a dry etching apparatus, a plasma CVD apparatus, a high-density plasma CVD apparatus, or the like can be used. Note that the plasma treatment may be performed while the substrate 101 is heated.

Figure 8:
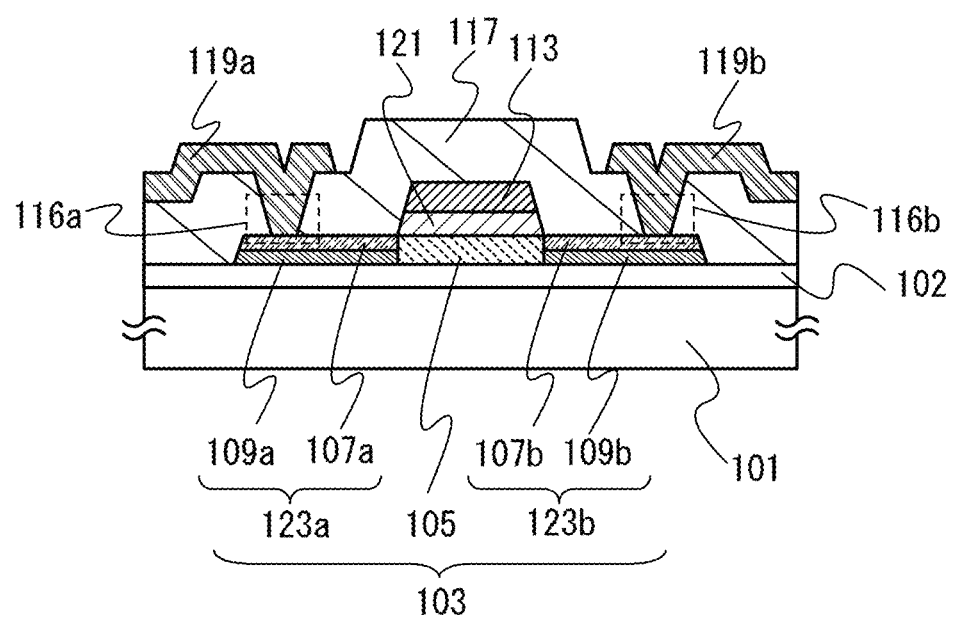
FIG. 8 is a cross-sectional view illustrating an example of a semiconductor device of one embodiment of the present invention.

Further, also in the transistor 170, by performing the third heat treatment after the dopant 150 is added at a temperature of higher than or equal to 550° C. and lower than a strain point of the substrate under an oxidizing atmosphere, the pair of second regions 123a and 123b including the non-single-crystal oxide semiconductor regions 107a and 107b including a c-axis-aligned crystal portion and containing the dopant 150, over the oxide semiconductor regions 109a and 109b including a plurality of crystal portions and containing the dopant 150 can be formed (see FIG. 8). Note that reference numerals in FIG. 8 correspond to those of the transistor 100 in FIGS. 1A and 1B, the transistor 160 in FIGS. 5A and 5B, and the transistor 170 in FIGS. 6A and 6B.

As described above, according to one embodiment of the disclosed invention, a problem due to miniaturization can be resolved. As a result, the size of the transistor can be sufficiently reduced. When the size of the transistor is sufficiently reduced, the size of the semiconductor device is also reduced and thus the number of semiconductor devices manufactured from one substrate is increased. Accordingly, manufacturing costs of the semiconductor device can be reduced. Further, the size of the semiconductor device can be reduced without its function degrading; therefore, the semiconductor device of the same size can have improved functions. Furthermore, effects of high-speed operation, low power consumption, and the like of a transistor can be obtained in accordance with a reduction in channel length. That is, according to one embodiment of the disclosed invention, miniaturization of a transistor including an oxide semiconductor is achieved, so that a variety of advantageous effects accompanying therewith can be obtained. This embodiment can be used in combination with other embodiments and an example, as appropriate.

Embodiment 2

In this embodiment, a structure of a transistor 200 according to another embodiment of the present invention and a method for manufacturing the transistor 200 will be described with reference to FIGS. 9A and 9B, FIGS. 10A to 10E, FIGS. 11A and 11B, FIGS. 12A and 12B, FIGS. 13A to 13D, and FIG. 14. The transistor 200 is different from the transistor 100 described in Embodiment 1 in that a sidewall insulating film 215 is provided at a side surface of the first electrode 113 and that third regions 223a and 223b are provided between the first region 105 and one of the second regions 123a and 123b of the oxide semiconductor film 103.

In addition, since the transistor 200 is another embodiment of the present invention, the description of Embodiment 1 is also employed in this embodiment.

<Structure and Characteristics of Transistor 200>

Figure 9A:
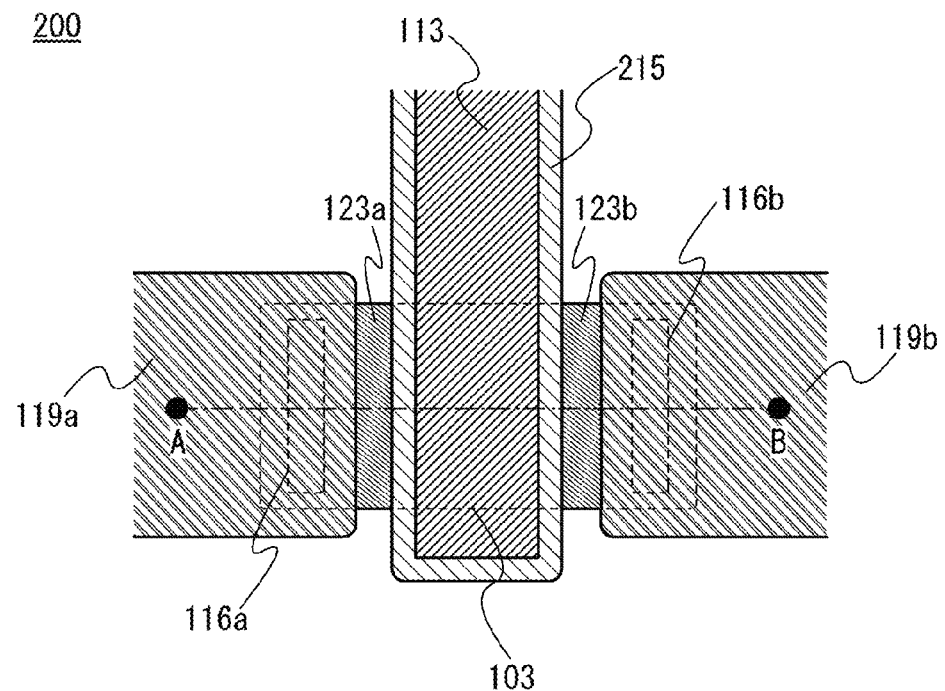
FIGS. 9A and 9B are a top view and a cross-sectional view illustrating an example of a semiconductor device of one embodiment of the present invention.

FIG. 9A is a top view of the transistor 200. Note that the base insulating film 102, the gate insulating film 111, and the interlayer insulating film 117 are not illustrated in FIG. 9A for convenience.

As illustrated in FIG. 9A, the first electrode 113 is formed over the oxide semiconductor film 103 including the first region 105 (not shown), the pair of second regions 123a and 123b, and the pair of third regions 223a and 223b (not shown). The sidewall insulating films 215 are provided at the side surfaces of the first electrode 113. In addition, the second electrode 119a and the third electrode 119b are formed over the pair of second regions 123a and 123b through the openings 116a and 116b. The second electrode 119a and the third electrode 119b are in contact with top surfaces of the pair of second regions 123a and 123b. The transistor 200 is a top-gate top-contact transistor.

Figure 9B:
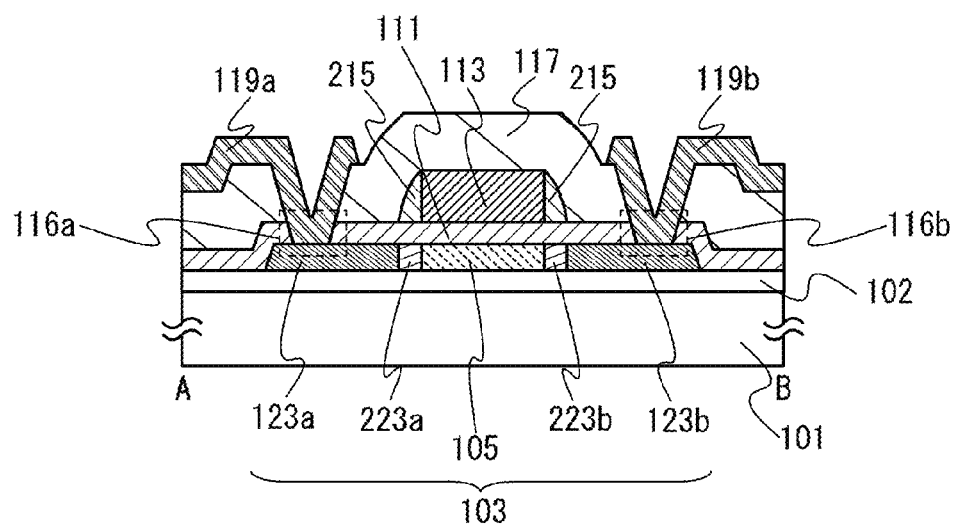

FIG. 9B is a cross-sectional view of the transistor 200 along line A-B. In FIG. 9B, the base insulating film 102 is provided over the substrate 101, and the oxide semiconductor film 103 including the first region 105, the pair of second regions 123a and 123b, and the pair of third regions 223a and 223b is provided over the base insulating film 102. The pair of second regions 123a and 123b is faced to each other with the first region 105 provided therebetween. Each of the third regions 223a and 223b is provided between the first region 105 and one of the second regions 123a and 123b.

The gate insulating film 111 is provided over the oxide semiconductor film 103. The first electrode 113 overlapping with the first region 105 is provided over the gate insulating film 111. The sidewall insulating films 215 are provided in contact with both of the side surfaces of the first electrode 113.

The interlayer insulating film 117 is provided over the gate insulating film 111, the first electrode 113, and the sidewall insulating film 215.

The second electrode 119a and the third electrode 119b are provided in contact with the pair of second regions 123a and 123b through the opening 116a and 116b in the interlayer insulating film 117. Note that the gate insulating film 111 is in contact with the first region 105, the pair of second regions 123a and 123b, and the pair of third regions 223a and 223b.

Although end portions of the second electrode 119a and the third electrode 119b may be tapered, the first electrode 113 preferably has a vertical end. This is because when the first electrode 113 is formed to have a vertical end, an insulating film to be the sidewall insulating film 215 is formed over the first electrode 113, and highly anisotropic etching is performed; thus, the sidewall insulating film 215 can be formed.

In addition, in FIGS. 9A and 9B, the pair of third regions 223a and 223b corresponds to a region where the oxide semiconductor film 103 overlaps with the sidewall insulating film 215, which will be described in detail later. Further, at least part of the sidewall insulating film 215 is curved except for regions in contact with the side surfaces of the first electrode 113 and the gate insulating film 111.

The oxide semiconductor film 103 is formed using a metal oxide containing two or more elements selected from In, Ga, Sn, and Zn and having a wide bandgap as in Embodiment 1, and thus, the off-state current of the transistor 200 can be reduced.

Further, in the transistor 200, the first region 105 serves as a channel formation region and is CAAC-OS, and the hydrogen concentration of the first region 105 is reduced. Thus, the transistor 200 is a highly reliable transistor having stable electric characteristics, because fluctuation in the threshold voltage between before and after light irradiation and between before and after a gate bias-temperature (BT) stress test is small.

The pair of second regions 123a and 123b is similar to that of Embodiment 1, and has conductivity higher than that in the case where the pair of second regions 123a and 123b is CAAC-OS and does not contain dopant as in the first region 105 (in the case where the oxide semiconductor film 103 is CAAC-OS and does not entirely contain dopant). In addition, since the pair of third regions 223a and 223b contains dopant as in the pair of second regions 123a and 123b, the pair of third regions 223a and 223b has high conductivity. That is, a resistance component in the channel direction of the oxide semiconductor film 103 can be reduced, and thus, the on-state current of the transistor 200 can be increased.

In addition, in the transistor 200, the conductivities and the dopant concentrations of the pair of second regions 123a and 123b and the pair of third regions 223a and 223b are in the range similar to those of Embodiment 1, and an excessively high dopant concentration may cause a decrease of the conductivity, so that the on-state current of the transistor 200 is decreased.

Thus, the dopant concentrations of the pair of second regions 123a and 123b and the pair of third regions 223a and 223b are preferably higher than or equal to $5 \times 10^{18}$ cm$^{-3}$ and lower than or equal to $1 \times 10^{22}$ cm$^{-3}$. Further, the dopant concentration of the pair of third regions 223a and 223b is higher than the dopant concentration of the pair of second regions 123a and 123b. Specifically, the dopant concentration of the pair of second regions 123a and 123b is preferably higher than or equal to $5 \times 10^{20}$ cm$^{-3}$ and lower than or equal to $1 \times 10^{22}$ cm$^{-3}$. The dopant concentration of the pair of third regions 223a and 223b is preferably higher than or equal to $5 \times 10^{18}$ cm$^{-3}$ and lower than $5 \times 10^{21}$ cm$^{-3}$. In addition, such a difference in the dopant concentration is made in a self-aligned manner in a step of adding dopant, because the sidewall insulating film 215 is provided in the transistor 200.

In the transistor 200, the third region 223a is interposed between the first region 105 and the second region 123a and the third region 223b is interposed between the first region 105 and the second region 123b, so that an electric field applied to the first region 105 can be relieved. The pair of second regions 123a and 123b serves as a source region and a drain region. The pair of third regions 223a and 223b serves as an electric-field relaxation region.

Specifically, the third region 223a is interposed between the first region 105 and the second region 123a and the third region 223b is interposed between the first region 105 and the second region 123b, so that a band edge of a channel formed in the first region 105 is hardly curved. Thus, in the transistor 200, an influence of shortening a channel length such as a negative shift of a threshold voltage can be reduced.

Further, since the contact resistance between the second region 123a and the second electrode 119a and the contact resistance between the second region 123b and the third electrode 119b is reduced, the on-state current of the transistor 200 can be increased.

<Method for Manufacturing Transistor 200>

Next, a method for manufacturing the transistor 200 will be described with reference to FIGS. 2A to 2D, FIGS. 3A to 3D, and FIGS. 10A to 10E.

In the manufacturing process of the transistor 200, steps up to and including a step of forming the oxide semiconductor film 140 in which oxygen is diffused and hydrogen concentration is sufficiently reduced and the gate insulating film 111 (the step corresponding to FIG. 2D) and a step for forming the conductive film 112 over the oxide semiconductor film 140 with the use of a conductive material which can be used for the first electrode 113 (the step corresponding to FIG. 3A) are similarly performed as in the transistor 100, and thus, Embodiment 1 can be referred to for details.

Figure 10A:
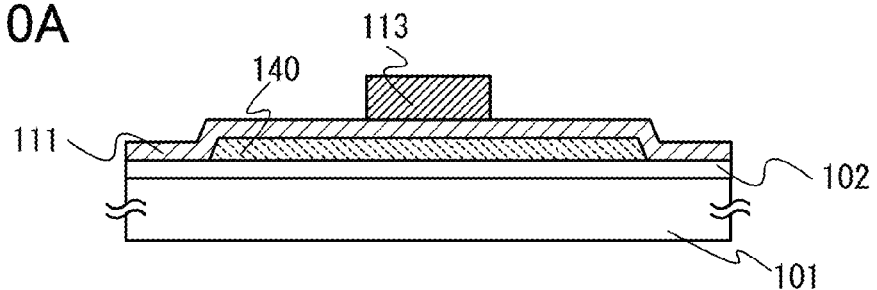
FIGS. 10A to 10E illustrate a method for manufacturing a semiconductor device of one embodiment of the present invention.

Then, a photolithography step is performed to form a resist mask over the conductive film 112, and etching is performed with the use of the resist mask so that the first electrode 113 is formed (see FIG. 10A). The etching here is preferably highly anisotropic etching so that the first electrode 113 is formed to have a vertical end as described above. As the conditions of the highly anisotropic etching, it is preferable that the selectivity ratio of the conductive film 112 with respect to the resist mask be extremely high.

Figure 10B:
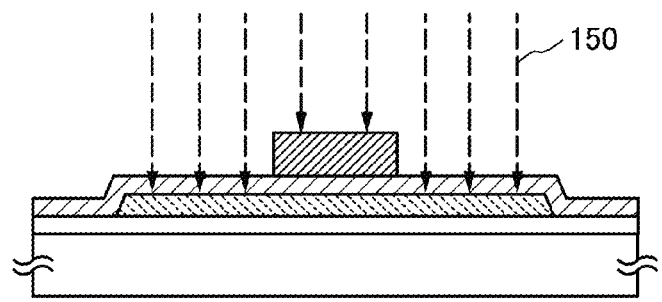

Next, treatment for adding the dopant 150 to the oxide semiconductor film 140 (first dopant addition treatment) is performed (see FIG. 10B). Note that in the first dopant addition treatment, a kind of the dopant 150 (an element to be added) and a method for adding the dopant 150 is similar to those in Embodiment 1.

In the first dopant addition treatment, the first electrode 113 serves as a mask and the dopant 150 is added to the oxide semiconductor film 140 through the gate insulating film 111. Thus, oxide semiconductor regions 214a and 214b to which the dopant 150 is added are formed. The dopant 150 is not added to a region of the oxide semiconductor film 140 overlapping with the first electrode 113, and thus, the first region 105 is formed in the region.

Next, the sidewall insulating film 215 is formed. The sidewall insulating film 215 is formed using any of the insulating films given in the description of the base insulating film 102 and the gate insulating film 111.

In the transistor 200, the gate insulating film 111 is provided in contact with all of the first region 105, the pair of second regions 123a and 123b, and the pair of third regions 223a and 223b. In order to obtain such a structure, the gate insulating film 111 and the sidewall insulating film 215 can be formed using insulating films having different etching rates. With such a structure, the gate insulating film 111 can serve as an etching stopper in formation of the sidewall insulating film 215. By using the gate insulating film 111 as an etching stopper, excessive etching of the oxide semiconductor film 140 can be suppressed. Moreover, an end point of the etching for forming the sidewall insulating film 215 can be easily detected. In addition, when the gate insulating film 111 serves as an etching stopper, the width of the sidewall insulating film 215 (the width of a portion where the sidewall insulating film 215 is in contact with the gate insulating film 111 in FIG. 9B) can be easily controlled. The area of the pair of third regions 223a and 223b depends on the width of the sidewall insulating film 215. As the area of the pair of third regions 223a and 223b is increased, an electric field applied to the first region 105 which is a channel formation region can be further relieved.

Figure 10C:
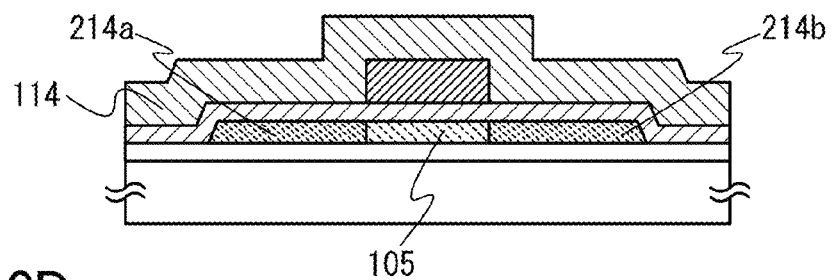

First, an insulating film 114 to be the sidewall insulating film 215 is formed over the gate insulating film 111 and the first electrode 113 (see FIG. 10C). The insulating film 114 is preferably formed by a method similar to that of the base insulating film 102 or the gate insulating film 111 and is preferably formed using any of the nitride insulating films described in Embodiment 1. In addition, although the thickness of the insulating film 114 is not particularly limited, the thickness can be selected as appropriate in consideration of coverage with respect to the shape of the first electrode 113.

The sidewall insulating film 215 is formed by etching the insulating film 114. The etching here is highly anisotropic etching, and the sidewall insulating film 215 can be formed in a self-aligned manner by performing the highly anisotropic etching on the insulating film 114. Here, dry etching is preferably employed as highly anisotropic etching, and a gas including fluorine such as trifluoromethane ($CHF_3$), octafluorocyclobutane ($C_4F_8$), or tetrafluoromethane ($CF_4$) can be used as an etching gas. A rare gas such as helium (He) or argon (Ar) or hydrogen ($H_2$) may be added to the etching gas. In addition, as the dry etching, a reactive ion etching (RIE) method in which high-frequency voltage is applied to a substrate, is preferably used.

Further, the dopant concentration of the pair of third regions 223a and 223b formed later depends on the thickness of the sidewall insulating film 215; therefore, the thickness of the sidewall insulating film 215 and the thickness of the first electrode 113 may be determined so that the dopant concentration of the pair of third regions 223a and 223b is within the above range. Note that the thickness of the sidewall insulating film 215 here means the distance from a plane of the sidewall insulating film 215 which is in contact with the gate insulating film 111 to the highest point of a plane thereof which is in contact with the first electrode 113.

In addition, the area of the pair of third regions 223a and 223b depends on the width of the sidewall insulating film 215 which corresponds to the thickness of the first electrode 113, and thus, the thickness of the first electrode 113 may be determined so that the area of the pair of third regions 223a and 223b becomes desired one.

Figure 10D:
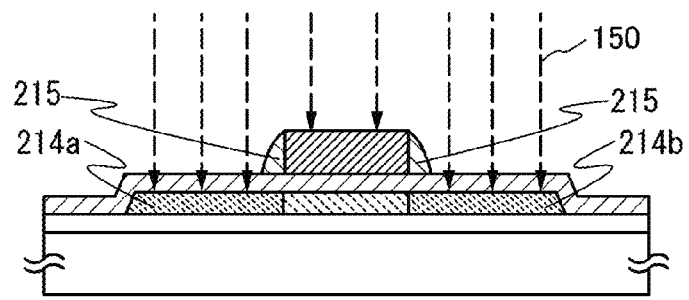

Next, treatment for adding the dopant 150 to the oxide semiconductor regions 214a and 214b (second dopant addition treatment) is performed (see FIG. 10D). Note that a kind of the dopant 150 (an element to be added) and a method for adding the dopant 150 is similar to those in Embodiment 1.

Also in the second dopant addition treatment, the first electrode 113 serves as a mask and the dopant 150 is added to the oxide semiconductor regions 214a and 214b through the gate insulating film 111 and the sidewall insulating film 215. Further, the amount of the added dopant 150 is smaller in a region to which the dopant 150 is added through the gate insulating film 111 and the sidewall insulating film 215 than in a region to which the dopant 150 is added through only the gate insulating film 111. Thus, the oxide semiconductor regions 214a and 214b which are different in dopant concentration can be formed in a self-aligned manner.

Also in this embodiment, the region where the dopant 150 is added becomes an amorphous region where crystallinity is decreased owing to damage by addition of the dopant 150. By adjusting the additive amount of the dopant 150 or the like, the degree of damage can be reduced so that the region is prevented from becoming completely amorphous. That is, the region where the dopant 150 is added has a proportion of amorphous region higher than at least the first region 105. It is preferable that the region is not completely amorphous because crystallization through third heat treatment performed in the following step can be easily performed.

Figure 10E:
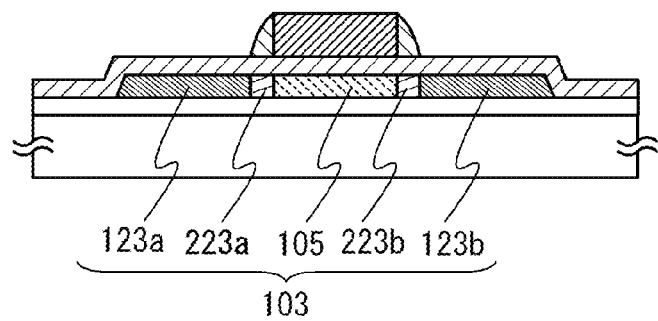

Next, as the manufacturing process of the transistor 100, the third heat treatment is performed, so that the region where the dopant 150 is added can be the pair of second regions 123a and 123b and the pair of third regions 223a and 223b in which the dopant is contained and which are an oxide semiconductor region including a plurality of crystal portions (see FIG. 10E). Note that a heating condition and a heating apparatus for the third heat treatment are similar to those in Embodiment 1.

In such a manner, the dopant 150 is added to the oxide semiconductor film 140 utilizing the first electrode 113 as a mask and then the third heat treatment is performed; thus, the first region 105 serving as a channel formation region, the pair of second regions 123a and 123b serving as a source region and a drain region, and the pair of third regions 223a and 223b serving as an electric-field relaxation region can be formed in a self-aligned manner.

The following steps can be performed in a manner similar to that in the manufacturing process of the transistor 100; the interlayer insulating film 117 is formed, the openings 116a and 116b are formed in the gate insulating film 111 and the interlayer insulating film 117, and the second electrode 119a which is in contact with the second region 123a through the opening 116a and the third electrode 119b which is in contact with the second region 123b through the opening 116b are formed. Note that the process of forming the interlayer insulating film 117, the openings 116a and 116b, the second electrode 119a, and the third electrode 119b are similar to those in Embodiment 1.

Through the above steps, the transistor 200 can be manufactured (see FIGS. 9A and 9B).

In addition, in the above steps, dopant addition treatment is performed twice like the first dopant addition treatment and the second dopant addition treatment. However, the sidewall insulating film 215 may be formed before the first dopant addition treatment is performed, and then, dopant addition treatment may be performed so that the desired dopant concentrations can be obtained. Note that the desired dopant concentrations mean the dopant concentrations of the pair of second regions 123a and 123b and the pair of third regions 223a and 223b of the transistor 200.

Modification Example 1 of Transistor 200

In addition, the third heat treatment is performed at a temperature higher than or equal to 550° C. and lower than a strain point of the substrate under an oxidizing atmosphere, so that in the pair of second regions 123a and 123b, non-single-crystal oxide semiconductor regions 107a and 107b including a c-axis-aligned crystal portion and containing the dopant 150 can be formed over oxide semiconductor regions 109a and 109b including a plurality of crystal portions and containing the dopant 150. Also in the pair of third regions 223a and 223b, non-single crystal oxide semiconductor regions 207a and 207b containing the dopant 150 and including a c-axis-aligned crystal portion can be formed over oxide semiconductor regions 209a and 209b containing the dopant 150 and including a plurality of crystal portions.

Figure 11A:
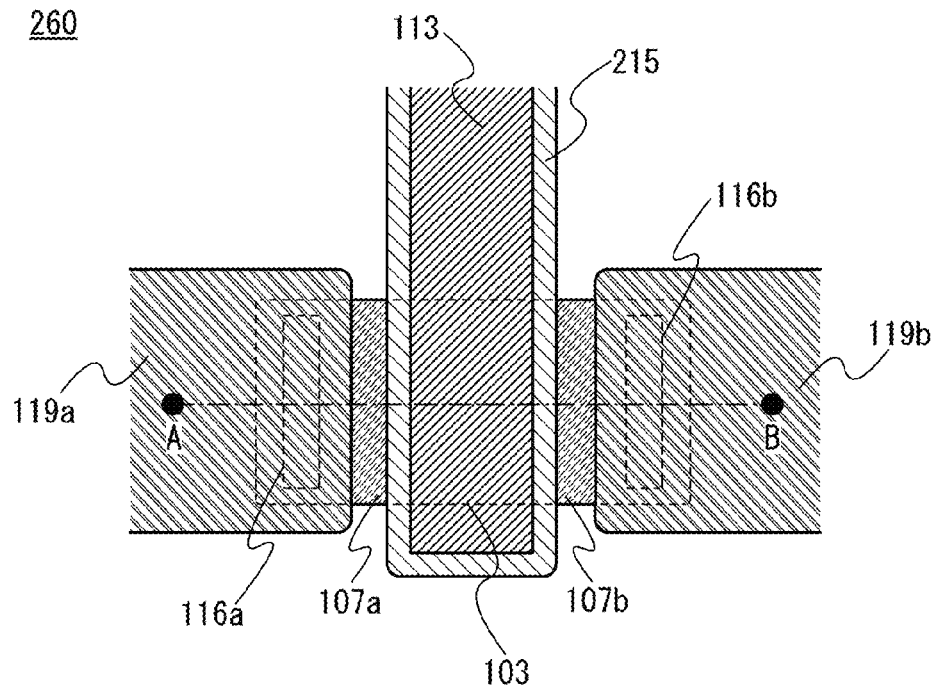
FIGS. 11A and 11B are a top view and a cross-sectional view illustrating an example of a semiconductor device of one embodiment of the present invention.

FIG. 11A is a top view of a transistor 260 manufactured in this manner. Further, FIG. 11B is a cross-sectional view taken along line A-B in FIG. 11A.

Figure 11B:
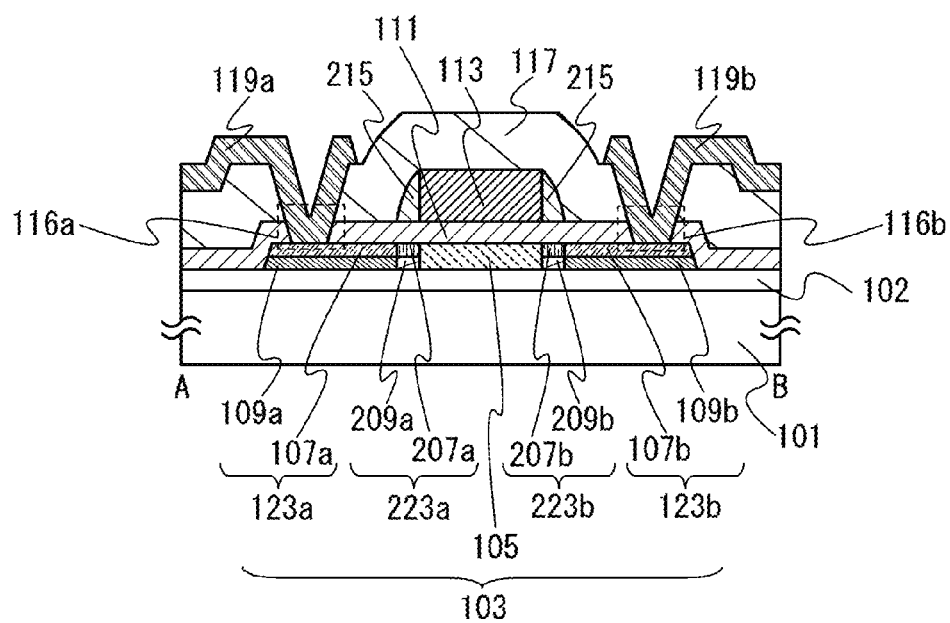

The pair of second regions 123a and 123b of the transistor 260 includes the non-single-crystal oxide semiconductor regions 107a and 107b including a c-axis-aligned crystal portion and containing the dopant 150 and the oxide semiconductor regions 109a and 109b including a plurality of crystal region and containing the dopant 150 (see FIG. 11B). Note that the dopant concentration of the oxide semiconductor regions 107a and 107b and that of the oxide semiconductor regions 109a and 109b are the same.

In addition, the pair of third regions 223a and 223b of the transistor 260 includes the non-single-crystal oxide semiconductor regions 207a and 207b including a c-axis-aligned crystal portion and containing the dopant 150 and the oxide semiconductor regions 209a and 209b including a plurality of crystal portion and containing the dopant 150 (see FIG. 11B).

Modification Example 1 of Transistor 200

As described above, since the dopant concentration of the pair of third regions 223a and 223b is lower than that of the pair of second regions 123a and 123b, the dopant concentrations of the oxide semiconductor regions 207a and 207b and the oxide semiconductor regions 209a and 209b is lower than those of the oxide semiconductor regions 107a and 107b and the oxide semiconductor regions 109a and 109b. Note that the dopant concentration of the oxide semiconductor regions 207a and 207b is the same as that of the oxide semiconductor regions 209a and 209b.

Further, the second electrode 119a and the third electrode 119b are in contact with the oxide semiconductor regions 107a and 107b through the openings 116a and 116b. Note that the other components of the transistor 260 are similar to those of the transistor 160.

In addition, the third heat treatment is performed under the above-described conditions for 1 hour, the oxide semiconductor regions 107a and 107b is formed with a thickness of 2 nm or more from the top surface of the pair of second regions 123a and 123b toward the bottom surface of the pair of second regions 123a and 123b. As the time of the third heat treatment under the above-described conditions is increased, the thickness of the oxide semiconductor regions 107a and 107b is increased.

A difference between the transistor 200 and the transistor 260 is only the structure of the pair of second regions 123a and 123b and the structure of the pair of third regions 223a and 223b, and thus the description of the transistor 200 can be referred to for the transistor 260.

Also in the transistor 260, a curve of a band edge of a channel formed in the first region 105 can be small, and thus, an influence of shortening a channel length such as a negative shift of the threshold voltage can be reduced. Further, the contact resistance between the second region 123a and the second electrode 119a and the contact resistance between the second region 123b and the third electrode 119b can be reduced; accordingly, the on-state current of the transistor 260 can be increased.

Since the transistor 260 includes the pair of second regions 123a and 123b including the oxide semiconductor regions 107a and 107b and the oxide semiconductor regions 109a and 109b, fluctuation in the threshold voltage between before and after light irradiation and between before and after a gate bias-temperature (BT) stress test is considered to be reduced as compared to the case where the pair of second regions 123a and 123b is an amorphous region. For that reason, the transistor 260 has high reliability.

Modification Example 2 of Transistor 200

In the step of forming the first electrode 113 in the manufacturing process of the transistor 200, the gate insulating film 111 is also etched at the same time, and thus, the gate insulating film 121 can be formed only over the first region 105 of the oxide semiconductor film 103.

Figure 12A:
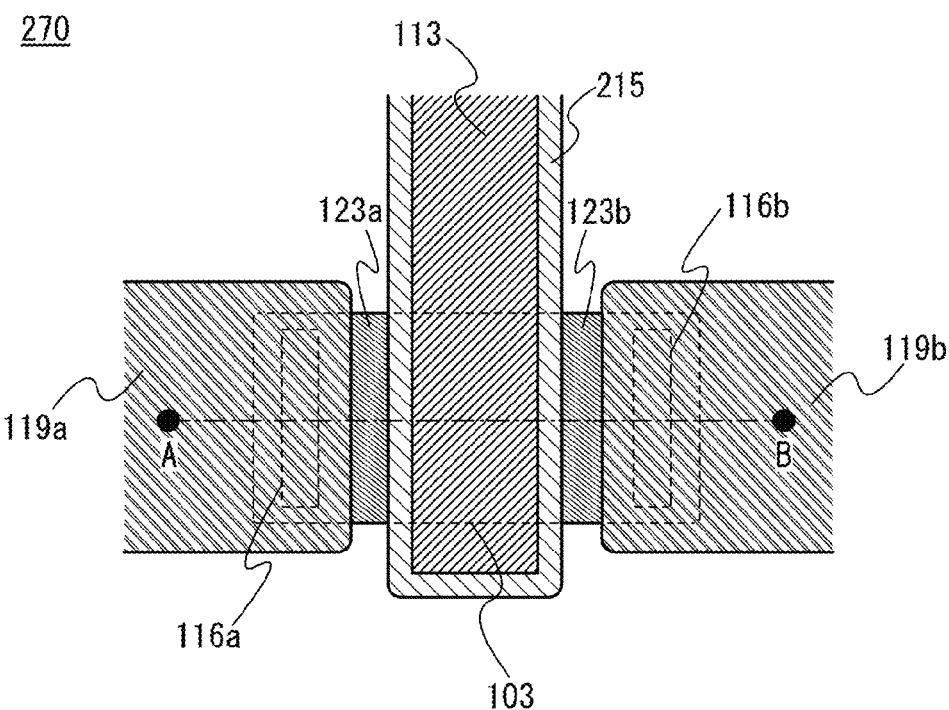
FIGS. 12A and 12B are a top view and a cross-sectional view illustrating an example of a semiconductor device of one embodiment of the present invention.
Figure 12B:
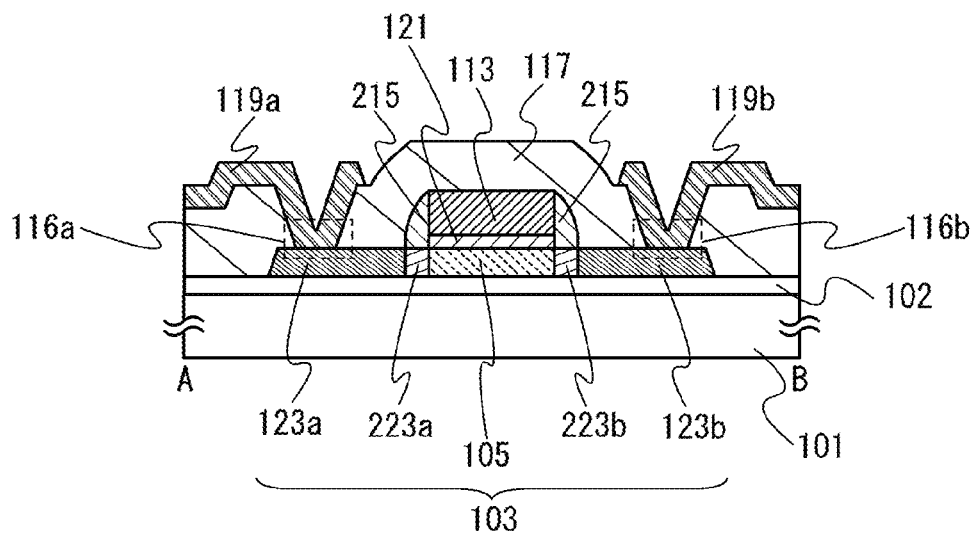

FIG. 12A is a top view of a transistor 270 manufactured in this manner. Further, FIG. 12B is a cross-sectional view taken along line A-B in FIG. 12A. The transistor 270 has a top-view structure similar to that of the transistor 200 and is a top-gate top-contact transistor.

A difference between the transistor 200 and the transistor 270 is only the structure of a gate insulating film, and thus the description of the transistor 200 can be referred to for the transistor 270.

Thus, also in the transistor 270, a curve of a band edge of a channel formed in the first region 105 can be small, and thus, an influence of shortening a channel length such as a negative shift of the threshold voltage can be reduced. Further, the contact resistance between the second region 123a and the second electrode 119a and the contact resistance between the second region 123b and the third electrode 119b can be reduced; accordingly, the on-state current of the transistor 270 can be increased.

Also in the transistor 270, a curve of a band edge of a channel formed in the first region 105 can be small, and thus, an influence of the short-channel effect such as a negative shift of the threshold voltage can be reduced. Further, the contact resistance between the second region 123a and the second electrode 119a and the contact resistance between the second region 123b and the third electrode 119b can be reduced, and a resistance component in the channel direction of the pair of second regions 123a and 123b can be reduced; accordingly, the on-state current of the transistor 270 can be increased.

A method for manufacturing the transistor 270 will be described with reference to FIGS. 3A to 3C, FIGS. 13A to 13D, and FIG. 14. In the manufacturing process of the transistor 270, steps up to and including the step of forming the conductive film 112 (see FIG. 3A) are similarly performed as in the transistor 100.

Figure 13A:
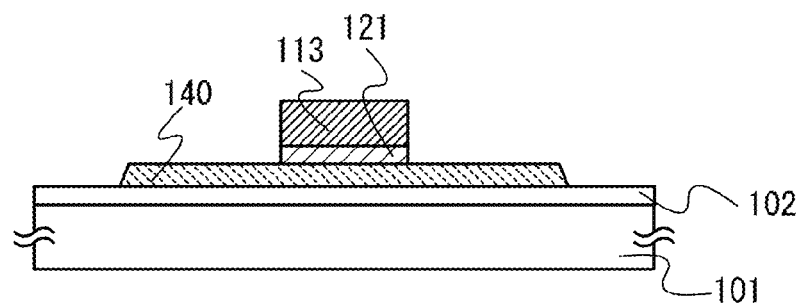
FIGS. 13A to 13D illustrate a method for manufacturing a semiconductor device of one embodiment of the present invention.

The conductive film 112 is formed and then etching treatment is performed on the conductive film 112 and the gate insulating film 111, so that a gate insulating film 121 overlapped only the first electrode 113 and the first region 105 of the oxide semiconductor film 103 formed later can be formed (see FIG. 13A).

In addition, the gate insulating film 121 is in contact with only the first region 105 and thus does not follow the shape of (does not cover a step formed by) the oxide semiconductor film 140. In other words, the gate insulating film 121 does not have a portion which extends beyond a step formed by the oxide semiconductor film 140. Thus, also in the completed transistor 270, the gate insulating film 121 does not have a portion which extends beyond a step formed by the oxide semiconductor film 103, which contributes to a reduction in the leakage current of the transistor 270 due to disconnection of the gate insulating film 121 and an increase in the withstand voltage of the gate insulating film 121. Therefore, even when the gate insulating film 121 whose thickness is reduced to around 5 nm is used, the transistor 270 can operate. Note that a reduction in the thickness of the gate insulating film 121 leads to reduction of an influence of shortening a channel length, and also leads to an increase in the operation speed of the transistor.

Moreover, in the transistor 270, since the gate insulating film 121 does not have a portion which extends beyond the step, parasitic capacitance is hardly caused between the first electrode 113 and the pair of second regions 123a and 123b and between the first electrode 113 and the pair of third regions 223a and 223b. Consequently, even when the channel length of the transistor 270 is shortened, fluctuation in the threshold voltage can be reduced.

Figure 13B:
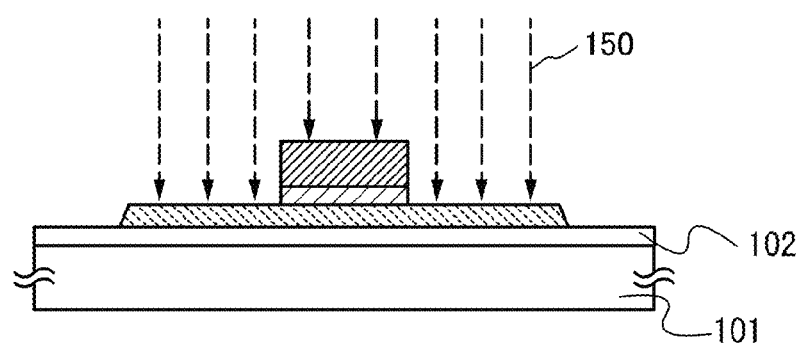

Next, first dopant addition treatment is performed (see FIG. 13B). The first dopant addition treatment may be performed by a method similar to that of the transistor 200. By the first dopant addition treatment, the oxide semiconductor regions 214a and 214b to which the dopant 150 is added are formed.

Figure 13C:
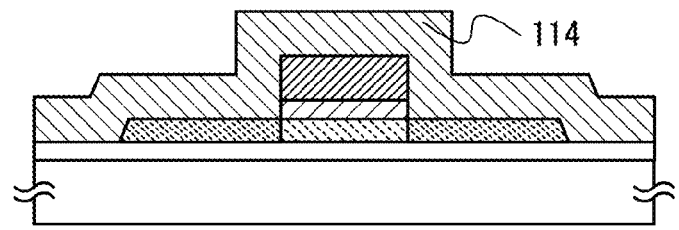
Figure 13D:
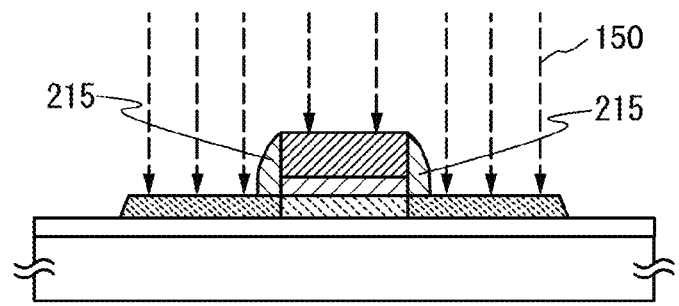
Figure 14:
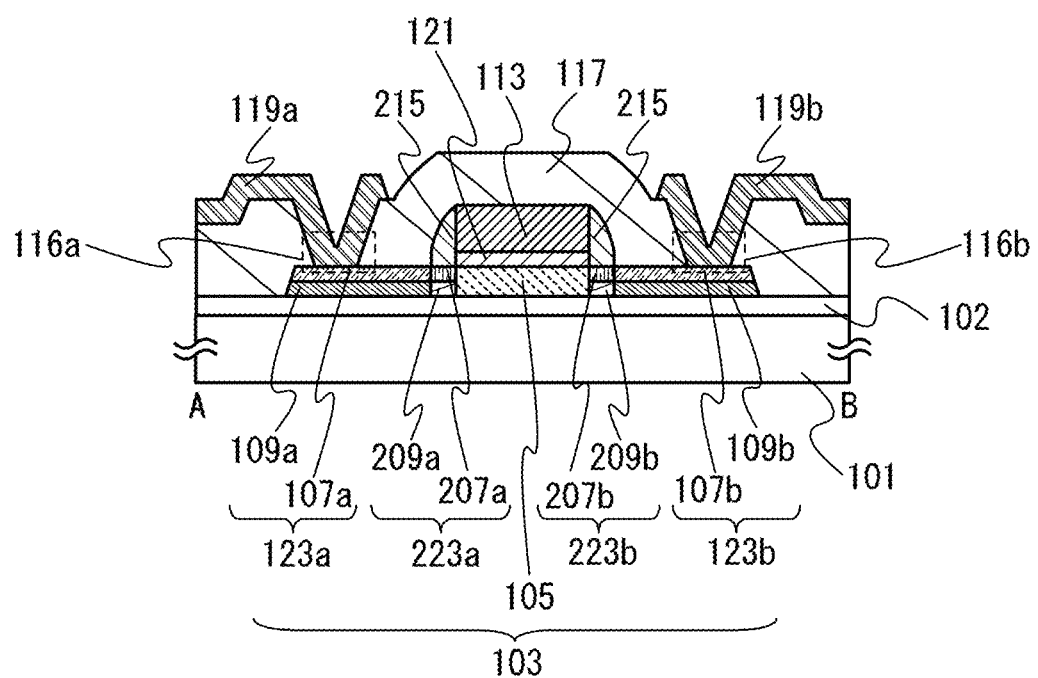
FIG. 14 is a cross-sectional view illustrating an example of a semiconductor device of one embodiment of the present invention.

Then, the insulating film 114 to be the sidewall insulating film 215 is formed (see FIG. 13C). The insulating film 114 can be formed by a method similar to that of the base insulating film 102 or the gate insulating film 111 and is formed using any of the oxide insulating films or the nitride insulating films described in Embodiment 1. In addition, although the thickness of the insulating film 114 is not particularly limited, the thickness is selected as appropriate in consideration of coverage with respect to the shape of the first electrode 113.

As in the transistor 200, the sidewall insulating film 215 is formed by etching the insulating film 114. The above description can be referred to for the detail of the etching here.

The thickness of the sidewall insulating film 215 means the distance from a plane of the sidewall insulating film 215 in contact with the oxide semiconductor film 140 to be the oxide semiconductor film 103 later to the highest point of a plane of the sidewall insulating film 215 in contact with the first electrode 113. Further, the dopant concentration of the pair of third regions 223a and 223b formed later depends on the thickness of the sidewall insulating film 215; therefore, the thickness of the sidewall insulating film 215 and the thickness of the first electrode 113 may be determined so that the dopant concentration of the pair of second regions 123a and 123b is within the range as in the transistor 200.

In addition, the area of the pair of second regions 123a and 123b is determined in accordance with the width of the sidewall insulating film 215 (e.g., the width of a portion where the sidewall insulating film 215 is in contact with the oxide semiconductor film 103 in FIG. 12B). As the area of the pair of second regions 123a and 123b is increased, an electric field applied to the first region 105 can be further relieved.

The width of the sidewall insulating film 215 depends on the thickness of the first electrode 113; therefore, the thickness of the first electrode 113 may be determined so that the area of the pair of second regions 123a and 123b becomes desired one.

Next, second dopant addition treatment is performed. Note that in the transistor 270, the treatment of adding the dopant 150 is different from that in the transistor 200, and there are a region where the dopant 150 is added through the sidewall insulating film 215 and a region where the dopant 150 is added in the state where the oxide semiconductor film 140 is partly exposed with the use of the first electrode 113 as a mask (see FIG. 13D).

In the case where the dopant 150 is added in the state where the oxide semiconductor film 140 is partly exposed as in the transistor 270, the dopant 150 can be added by a method other than an ion doping method or an ion implantation method. For example, plasma treatment can be given in which plasma is generated in an atmosphere of a gas containing an added element and an object to which the element is added (here, the oxide semiconductor film 140) is irradiated with the plasma. As an apparatus for generating the plasma, a dry etching apparatus, a plasma CVD apparatus, a high-density plasma CVD apparatus, or the like can be used. Note that the plasma treatment may be performed while the substrate 101 is heated.

The following steps to manufacture the transistor 270 can be performed in a manner similar to those in the manufacturing process of the transistor 200 (see FIGS. 12A and 12B).

Note that as in the transistor 200, the sidewall insulating film 215 may be formed before the first dopant addition treatment is performed, and then, dopant addition treatment may be performed so that the desired dopant concentrations can be obtained.

Further, also in the transistor 270, by performing the third heat treatment after the dopant 150 is added at a temperature of higher than or equal to 550° C. and lower than the strain point of the substrate under an oxidizing atmosphere, the pair of second regions 123a and 123b including the non-single-crystal oxide semiconductor regions 107a and 107b including a c-axis-aligned crystal portion and containing the dopant 150, over the oxide semiconductor regions 109a and 109b including a plurality of crystal portions and containing the dopant 150 can be formed (see FIG. 8). Note that reference numerals in FIG. 14 correspond to those of the transistor 200, the transistor 260, and the transistor 270.

As described above, according to one embodiment of the disclosed invention, a problem due to miniaturization can be resolved. As a result, the size of the transistor can be sufficiently reduced. When the size of the transistor is sufficiently reduced, the size of the semiconductor device is also reduced and thus the number of semiconductor devices manufactured from one substrate is increased. Accordingly, manufacturing costs of the semiconductor device can be reduced. Further, the size of the semiconductor device can be reduced without its function degrading; therefore, the semiconductor device of the same size can have improved functions. Furthermore, effects of high-speed operation, low power consumption, and the like of a transistor can be obtained in accordance with a reduction in channel length. That is, according to one embodiment of the disclosed invention, miniaturization of a transistor including an oxide semiconductor is achieved, so that a variety of advantageous effects accompanying therewith can be obtained. This embodiment can be used in combination with other embodiments and an example, as appropriate.

Embodiment 3

The transistor described in this embodiment is different from the transistor 100 described in Embodiment 1 in that the second electrode 119a and the third electrode 119b are in contact with the bottom surfaces of the pair of second regions 123a and 123b of the oxide semiconductor film. That is, the transistor described in this embodiment is a top-gate bottom-contact transistor. In addition, a cross-sectional view of the top-gate bottom-contact transistor is illustrated in FIG. 15A.

Further, all the transistors described in Embodiment 1 and Embodiment 2 may be top-gate bottom-contact transistors. For example, the transistors 160 and 170 can be top-gate bottom-contact transistors. FIG. 15B is a cross-sectional view of the top-gate bottom-contact transistor 160. FIG. 15C is a cross-sectional view of the top-gate bottom-contact transistor 170.

Figure 16A:
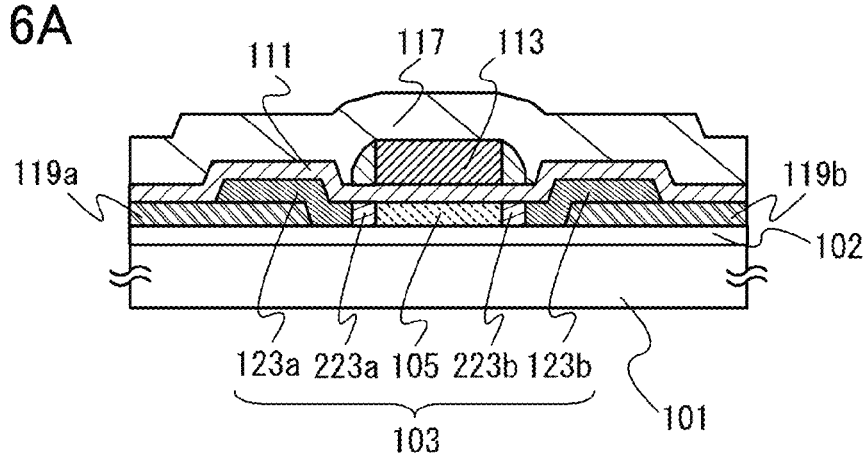
FIGS. 16A to 16C are cross-sectional views each illustrating an example of a semiconductor device of one embodiment of the present invention.
Figure 16B:
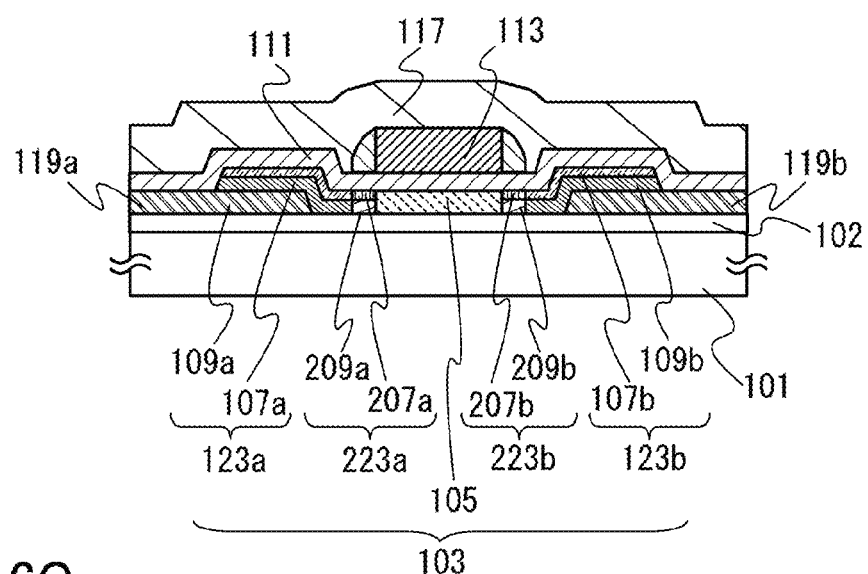
Figure 16C:
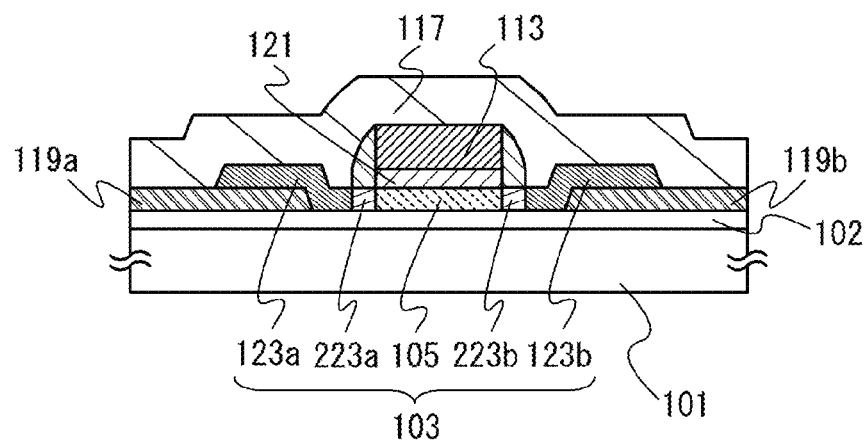

Further, FIG. 16A is a cross-sectional view of the top-gate bottom-contact transistor 200. FIG. 16B is a cross-sectional view of the top-gate bottom-contact transistor 260. FIG. 16C is a cross-sectional view of the top-gate bottom-contact transistor 270.

Figure 15A:
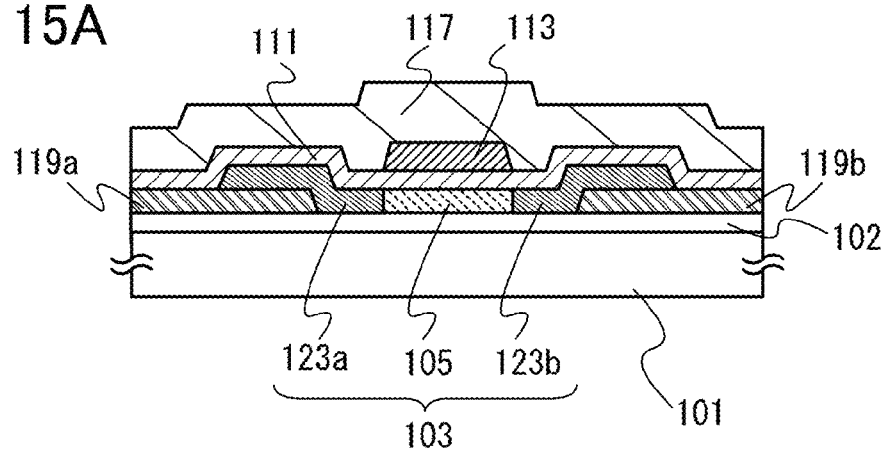
FIGS. 15A to 15C are cross-sectional views each illustrating an example of a semiconductor device of one embodiment of the present invention.
Figure 15B:
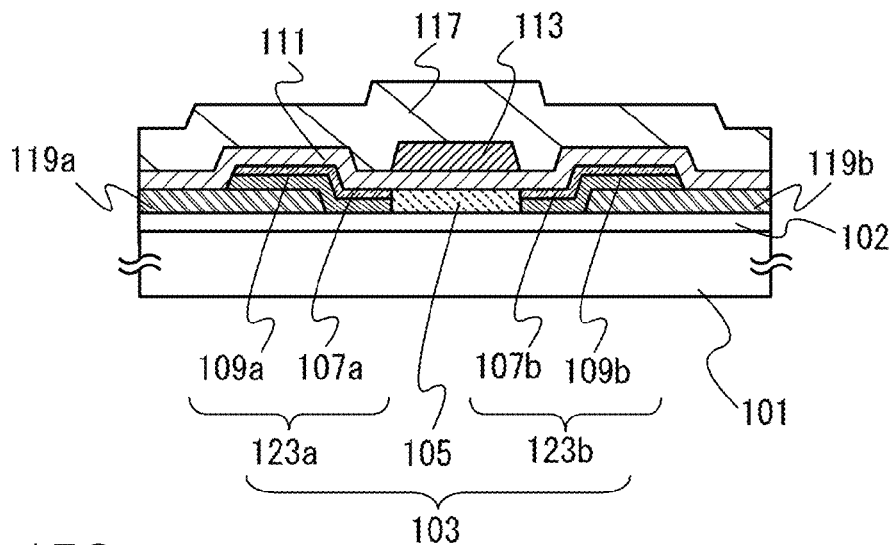
Figure 15C:
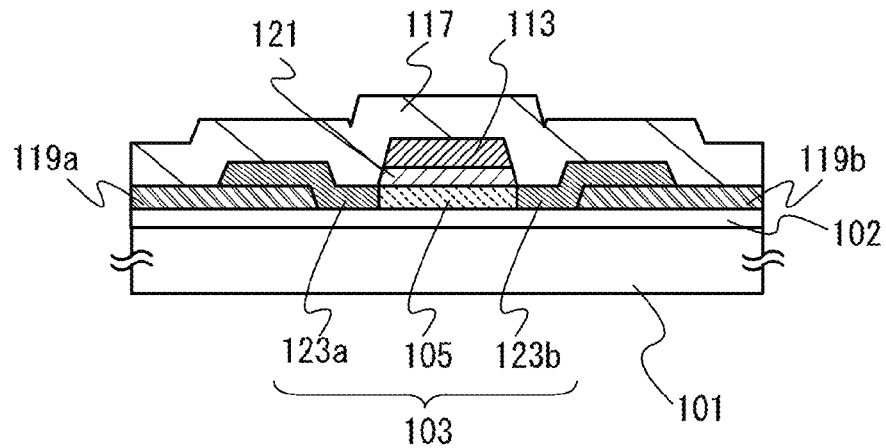

Reference numerals in FIGS. 15A to 15C correspond to the reference numerals of the transistor 100, the transistor 160, and the transistor 170, and reference numerals in FIGS. 16A to 16C correspond to the numerals of the transistor 200, the transistor 260, and the transistor 270; thus, Embodiment 1 and Embodiment 2 can be referred as appropriate to for description of the reference numerals. Note that description in Embodiment 1 and Embodiment 2 in addition to the reference numerals therein can be applied to this embodiment.

In addition, in manufacturing methods of the transistors illustrated in FIGS. 15A to 15C and FIGS. 16A to 16C, order of the manufacturing steps of the corresponding transistor can be interchanged. For example, the step of forming the second electrode 119a and the third electrode 119b is performed after the step of forming the base insulating film 102, and in the following process, the steps of manufacturing the transistors 100, 160, and 170 and the transistors 200, 260, and 270 other than the step of forming the second electrode 119a and the third electrode 119b can be performed.

Note that in the transistors illustrated in FIG. 15C and FIG. 16C, the oxide semiconductor film 103 may have the following structure as in FIG. 15B and FIG. 16B: a structure in which in the pair of second regions 123a and 123b, the non-single-crystal oxide semiconductor regions 107a and 107b including a c-axis-aligned crystal portion and containing the dopant 150 is formed over the oxide semiconductor regions 109a and 109b including a plurality of crystal portions and containing the dopant 150, or a structure in which in the pair of third regions 223a and 223b, the non-single-crystal oxide semiconductor regions 207a and 207b including a c-axis-aligned crystal portion and containing the dopant 150 is formed over the oxide semiconductor regions 209a and 209b including a plurality of crystal portions and containing the dopant 150. Cross-sectional views of the transistors having such a structure are not illustrated.

As described above, according to one embodiment of the disclosed invention, a problem due to miniaturization can be resolved. As a result, the size of the transistor can be sufficiently reduced. When the size of the transistor is sufficiently reduced, the size of the semiconductor device is also reduced and thus the number of semiconductor devices manufactured from one substrate is increased. Accordingly, manufacturing costs of the semiconductor device can be suppressed. Further, the size of the semiconductor device can be reduced without its function degrading; therefore, the semiconductor device of the same size can have improved functions. Furthermore, effects of high-speed operation, low power consumption, and the like of a transistor can be obtained in accordance with a reduction in channel length.

Thus, miniaturization of a transistor including an oxide semiconductor can be achieved according to one embodiment of the disclosed invention, and various effects accompanied with the miniaturization can be obtained. Note that this embodiment can be combined as appropriate with any of the other embodiments.

Embodiment 4

In this embodiment, in the region to which dopant is added, which serves as a source region, a drain region, and an electric-field relaxation region of the transistor described in Embodiments 1 to 3, a bonding state of the dopant and an electron state of an oxide semiconductor included in the region to which dopant is added will be described with reference to FIGS. 17A and 17B and FIGS. 18A and 18B.

For example, in the transistor 100, conductivity of the pair of second regions 123a and 123b where dopant is contained is higher than that of the first region 105 where dopant is not contained.

It is expected that the increase in conductivity is due to generation of carriers in the oxide semiconductor by adding dopant to an oxide semiconductor including the pair of second regions 123a and 123b.

In view of the above, in this embodiment, in the oxide semiconductor to which dopant is added, a bonding state and an electron state of the oxide semiconductor which are calculated by the first-principles molecular dynamics (FPMD) and the density functional theory (DFT) will be described. Note that the oxide semiconductor is an In—Ga—Zn—O-based metal oxide and, for simplifying the calculation, the In—Ga—Zn—O-based metal oxide is assumed to be amorphous (hereinafter referred to as "a-IGZO"). Further, dopant is a phosphorus atom (P).

The above calculation is conducted on a-IGZO to which phosphorus of one atom is arranged (added). Specifically, it is assumed that a-IGZO has 84 atoms per unit cell, the composition ratio is In:Ga:Zn:O=1:1:1:4 (atomic ratio), the density is 5.9 gcm$^{-3}$, and the lattice constants is a=b=c=1.02 nm and $\alpha=\beta=\gamma=90°$.

In the above calculation, a first-principles molecular dynamics program of CASTEP manufactured by Accelrys Software Inc. was used. GGA-PBE was used for a functional, and Ultrasoft was used for pseudopotential. The cut-off energy was 260 eV (380 eV in the DOS calculation), and the k-point set was 1×1×1. The FPMD calculation was conducted using an NVT ensemble at a temperature of 1500 K. The total simulation time was 0.3 ps and the time interval was 1.0 fs.

Figure 17A:
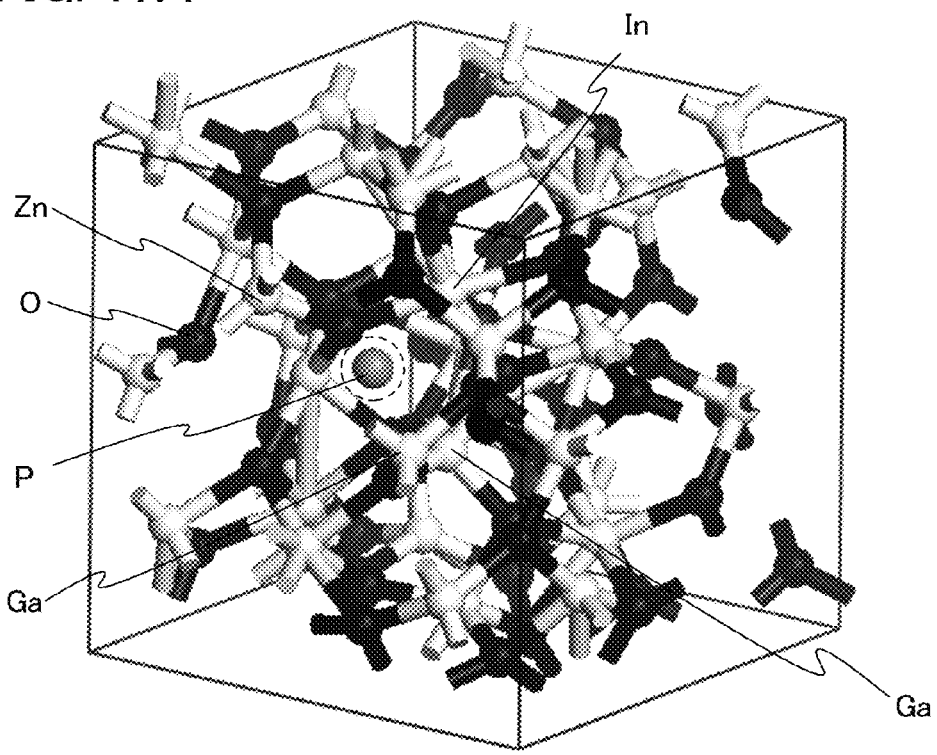
FIGS. 17A and 17B are diagrams each illustrating an oxide semiconductor structure after dopant is added.
Figure 17B:
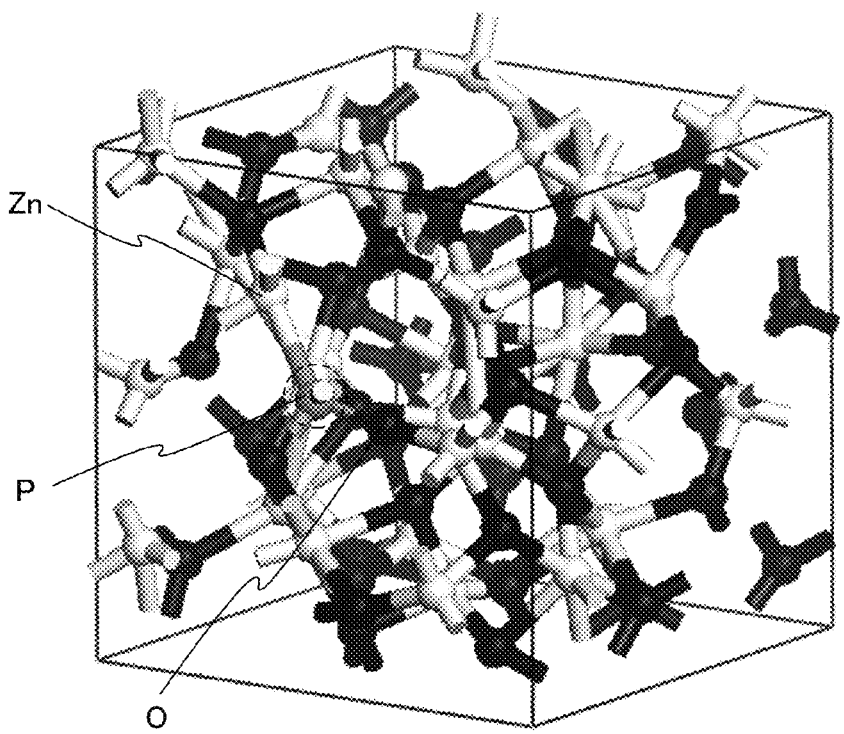

FIGS. 17A and 17B illustrate an initial structure in the calculation and a final structure after the calculation is completed. FIG. 17A illustrate the initial structure. FIG. 17B illustrates the final structure. The initial structure corresponds to a simple structure in which a phosphorus atom is arranged in an arbitrary position in a-IGZO. The final structure corresponds to a structure after the calculation is completed, that is, after the structure optimization. Further, the final structure after the structure optimization corresponds to a structure of the oxide semiconductor film region containing dopant in the transistors described in Embodiments 1 to 3.

The phosphorus atom in the initial structure as in FIG. 17A is arranged (added) between elements included in a-IGZO. Note that in FIGS. 17A and 17B, a black circle represents an oxygen atom, a white circle represents a metal atom (an In atom, a Zn atom, or a Ga atom), and a gray circle represents a phosphorus atom.

As a result of the calculation, the phosphorus atom in the final structure forms "a bond to one Zn atom", "a single bond to two oxygen atoms", and "a double bond to one oxygen atom". In other words, the phosphorus atom is coordinated to a Zn atom with bonded to an oxygen atom (see FIG. 17B).

Note that it can be explained in terms of bond energy that a metal atom to which the phosphorus atom is bonded is a Zn atom.

The bond energy between a Zn atom and an oxygen atom is lower than that between the other metal atom (an In atom and a Ga atom) and an oxygen atom. Thus, it can be said that a bond between a Zn atom and an oxygen atom is easily cut as compared to the other bonds. Accordingly, after the structure optimization, a phosphorus atom is coordinated to a Zn atom with an oxygen atom. Note that this shows that there is the highest possibility that a phosphorus atom is bonded to a Zn atom; of course, a metal atom to which a phosphorus atom is bonded is not limited to a Zn atom, and a phosphorus atom may be bonded to the other metal atoms included in a-IGZO.

Figure 18A:
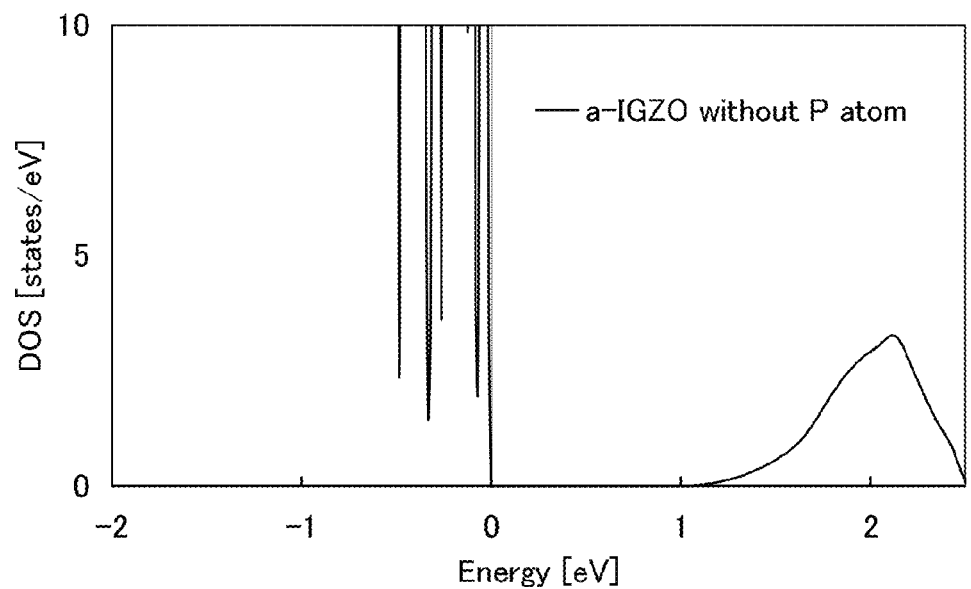
FIGS. 18A and 18B show electron states of an oxide semiconductor before and after dopant is added.
Figure 18B:
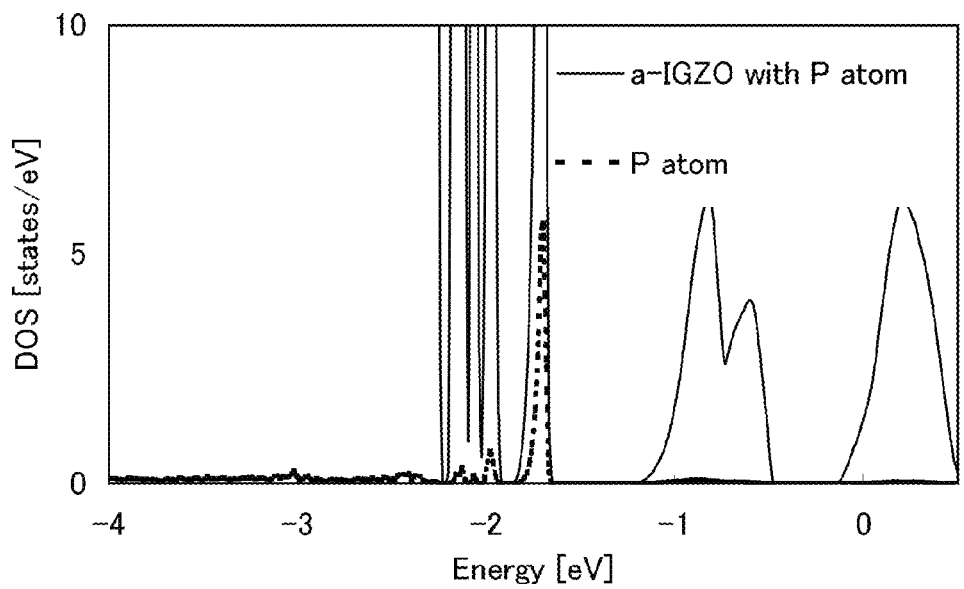

Next, FIGS. 18A and 18B show a state density after the structure optimization. FIG. 18A shows a state density of a-IGZO in which a phosphorus atom is not arranged (to which a phosphorus atom is not added). FIG. 18B shows a state density of the a-IGZO (corresponding to FIG. 17B) in which a phosphorus atom is arranged (to which a phosphorus atom is not added) and which is after the structure optimization. In FIG. 18B, a solid line represents the total state density of a-IGZO in which a phosphorus atom is arranged (to which a phosphorus atom is not added) and which is after the structure optimization, and a dashed line represents the partial state density of a phosphorus atom of a-IGZO after the structure optimization. In FIGS. 18A and 18B, the horizontal axis represents energy [eV] and the vertical axis represents a state density after the structure optimization [states/eV]. Note that in the state density shown in both FIGS. 18A and 18B, the origin on energy is equal to the Fermi level.

As shown in FIG. 18A, in the total state density, the valence band maximum is also positioned at the Fermi level of a-IGZO in which a phosphorus atom is not arranged, and the conduction band is formed over the band gap.

As shown in FIG. 18B, in the total state density, the Fermi level of a-IGZO in which a phosphorus atom is arranged and after the structure optimization is formed within the conduction band; thus, it can be said that a carrier is generated in the a-IGZO. Further, in the band gap of the a-IGZO, a level of a phosphorus atom is also formed.

From the above, it is found that a carrier is generated in an oxide semiconductor by adding dopant to the oxide semiconductor.

The structure, method, and the like described in this embodiment can be used in combination with structures, methods, and the like described in other embodiments and an example, as appropriate.

Embodiment 5

In this embodiment, an example of a semiconductor device including the transistor described in any one of Embodiment 1 to Embodiment 3 will be described.

Figure 20A:
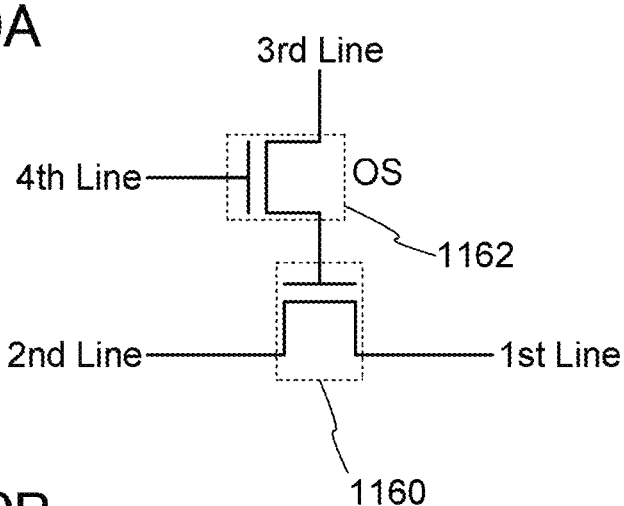
FIGS. 20A and 20B are each an example of a circuit diagram of a semiconductor device of one embodiment of the present invention.

An example of a circuit diagram of a memory element (hereinafter also referred to as a memory cell) included in a semiconductor device is illustrated in FIG. 20A. The memory cell includes a transistor 1160 in which a channel formation region is formed using a material other than an oxide semiconductor and a transistor 1162 in which a channel formation region is formed using an oxide semiconductor.

The transistor 1162 in which the channel formation region is formed using an oxide semiconductor can be manufactured in accordance with any of the above embodiments.

As illustrated in FIG. 20A, a gate electrode of the transistor 1160 is electrically connected to one of a source electrode and a drain electrode of the transistor 1162. A first wiring (a 1st Line, also referred to as a source line) is electrically connected to a source electrode of the transistor 1160. A second wiring (a 2nd Line, also referred to as a bit line) is electrically connected to a drain electrode of the transistor 1160. A third wiring (a 3rd Line, also referred to as a first signal line) is electrically connected to the other of the source electrode and the drain electrode of the transistor 1162. A fourth wiring (a 4th Line, also referred to as a second signal line) is electrically connected to a gate electrode of the transistor 1162.

The transistor 1160 in which the channel formation region is formed using a material other than an oxide semiconductor, e.g., single crystal silicon can operate at sufficiently high speed. Therefore, with the use of the transistor 1160, high-speed reading of stored contents and the like are possible. The transistor 1162 in which the channel formation region is formed using an oxide semiconductor is characterized by its off-state current which is smaller than the off-state current of the transistor 1160. Therefore, when the transistor 1162 is turned off, a potential of the gate electrode of the transistor 1160 can be held for a very long time.

By utilizing a characteristic in which the potential of the gate electrode of the transistor 1160 can be held, writing, holding, and reading of data are possible as described below.

First, writing and holding of data will be described. First, a potential of the fourth wiring is set to a potential at which the transistor 1162 is turned on, so that the transistor 1162 is turned on. Thus, a potential of the third wiring is supplied to the gate electrode of the transistor 1160 (writing). After that, the potential of the fourth wiring is set to a potential at which the transistor 1162 is turned off, so that the transistor 1162 is turned off, and thus, the potential of the gate electrode of the transistor 1160 is held (holding).

Since the off-state current of the transistor 1162 is smaller than the off-state current of the transistor 1160, the potential of the gate electrode of the transistor 1160 is held for a long time. For example, when the potential of the gate electrode of the transistor 1160 is a potential at which the transistor 1160 is in an on state, the on state of the transistor 1160 is held for a long time. In addition, when the potential of the gate electrode of the transistor 1160 is a potential at which the transistor 1160 is an off state, the off state of the transistor 1160 is held for a long time.

Then, reading of data will be described. When a predetermined potential (a low potential) is supplied to the first wiring in a state where the on state or the off state of the transistor 1160 is held as described above, a potential of the second wiring varies depending on the on state or the off state of the transistor 1160. For example, when the transistor 1160 is in the on state, the potential of the second wiring becomes lower than the potential of the first wiring. On the other hand, when the transistor 1160 is in the off state, the potential of the second wiring is not changed.

In such a manner, the potential of the second wiring and the predetermined potential are compared with each other in a state where data is held, whereby the data can be read out.

Then, rewriting of data will be described. Rewriting of data is performed in a manner similar to that of the writing and holding of data. That is, a potential of the fourth wiring is set to a potential at which the transistor 1162 is turned on, so that the transistor 1162 is turned on. Thus, a potential of the third wiring (a potential for new data) is supplied to the gate electrode of the transistor 1160. After that, the potential of the fourth wiring is set to a potential at which the transistor 1162 is turned off, so that the transistor 1162 is turned off, and thus, the new data is held.

In the memory cell according to the disclosed invention, data can be directly rewritten by another writing of data as described above. For that reason, erasing operation which is necessary for a flash memory or the like is not needed, so that decrease in operation speed because of erasing operation can be suppressed. In other words, high-speed operation of the semiconductor device including the memory cell can be realized.

Figure 20B:
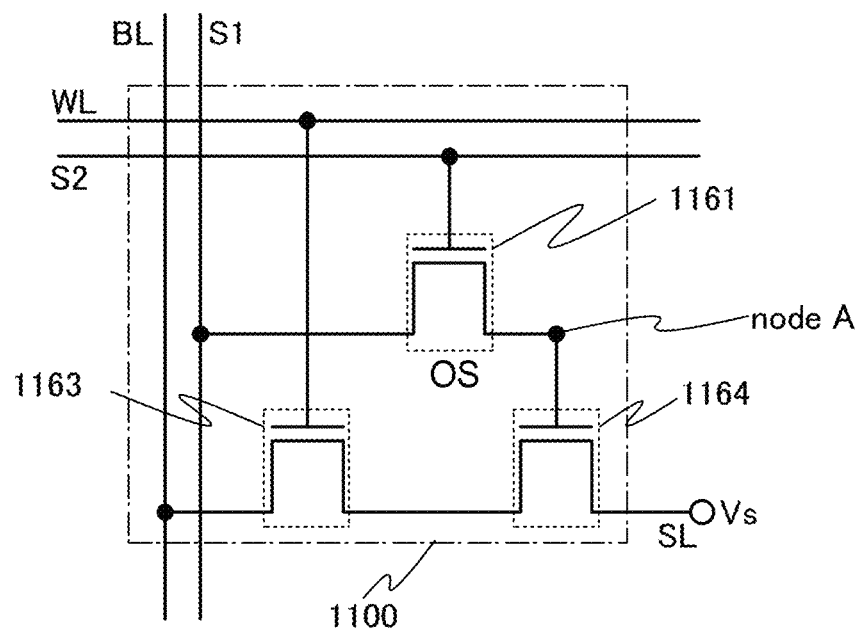

FIG. 20B is a circuit diagram illustrating an application example of the memory cell illustrated in FIG. 20A.

A memory cell 1100 illustrated in FIG. 20B includes a first wiring SL (a source line), a second wiring BL (a bit line), a third wiring S1 (a first signal line), a fourth wiring S2 (a second signal line), a fifth wiring WL (a word line), a transistor 1164 (a first transistor), a transistor 1161 (a second transistor), and a transistor 1163 (a third transistor). In each of the transistors 1164 and 1163, a channel formation region is formed using a material other than an oxide semiconductor, and in the transistor 1161, a channel formation region is formed using an oxide semiconductor.

Here, a gate electrode of the transistor 1164 is electrically connected to one of a source electrode and a drain electrode of the transistor 1161. In addition, the first wiring SL is electrically connected to a source electrode of the transistor 1164, and a drain electrode of the transistor 1164 is electrically connected to a source electrode of the transistor 1163. The second wiring BL is electrically connected to a drain electrode of the transistor 1163, and the third wiring S1 is electrically connected to the other of the source electrode and the drain electrode of the transistor 1161. The fourth wiring S2 is electrically connected to a gate electrode of the transistor 1161, and the fifth wiring WL is electrically connected to a gate electrode of the transistor 1163.

Next, operation of the circuit will be specifically described.

When data is written into the memory cell 1100, the first wiring SL is set to 0 V, the fifth wiring WL is set to 0 V, the second wiring BL is set to 0 V, and the fourth wiring S2 is set to 2 V. The third wiring S1 is set to 2 V in order to write data "1" and set to 0 V in order to write data "0". At this time, the transistor 1163 is in an off state and the transistor 1161 is in an on state. Note that, to finish writing, before the potential of the third wiring S1 is changed, the fourth wiring S2 is set to 0 V so that the transistor 1161 is turned off.

As a result, a potential of a node (referred to as a node A) connected to the gate electrode of the transistor 1164 is set to approximately 2 V after the writing of data "1" and set to approximately 0 V after the writing of data "0". Electric charge corresponding to a potential of the third wiring S1 is accumulated at the node A; since the off-state current of the transistor 1161 is smaller than that of a transistor in which a channel formation region is formed using single crystal silicon, the potential of the gate electrode of the transistor 1164 is held for a long time.

When data is read from the memory cell, the first wiring SL is set to 0 V, the fifth wiring WL is set to 2 V, the fourth wiring S2 is set to 0 V, the third wiring S1 is set to 0 V, and a reading circuit connected to the second wiring BL is set in an operation state. At this time, the transistor 1163 is in an on state and the transistor 1161 is in an off state.

The transistor 1164 is in an off state when data "0" has been written, that is, the node A is set to approximately 0 V, so that the resistance between the second wiring BL and the first wiring SL is high. On the other hand, the transistor 1164 is in an on state when data "1" has been written, that is, the node A is set to approximately 2 V, so that the resistance between the second wiring BL and the first wiring SL is low. The reading circuit can read data "0" or data "1" in accordance with the difference in resistance state of the memory cell. The second wiring BL at the time of the writing is set to 0 V; however, it may be in a floating state or may be charged to have a potential higher than 0 V. The third wiring S1 at the time of the reading is set to 0 V; however, it may be in a floating state or may be charged to have a potential higher than 0 V.

Note that data "1" and data "0" are defined for convenience and can be reversed. In addition, the above operation voltages are examples. The operation voltages are set so that the transistor 1164 is turned off in the case of data "0" and turned on in the case of data "1", the transistor 1161 is turned on at the time of writing and turned off in periods except the time of writing, and the transistor 1163 is turned on at the time of reading. A power supply potential VDD of a peripheral logic circuit may also be used instead of 2 V.

In this embodiment, the memory cell with a minimum storage unit (one bit) is described for easy understanding; however, the structure of the memory cell is not limited thereto. It is also possible to make a more developed semiconductor device with a plurality of memory cells connected to each other as appropriate. For example, it is possible to make a NAND-type or NOR-type semiconductor device by using more than one of the above memory cells. The wiring structure is not limited to that in FIG. 20A or 20B and can be changed as appropriate.

Figure 21:
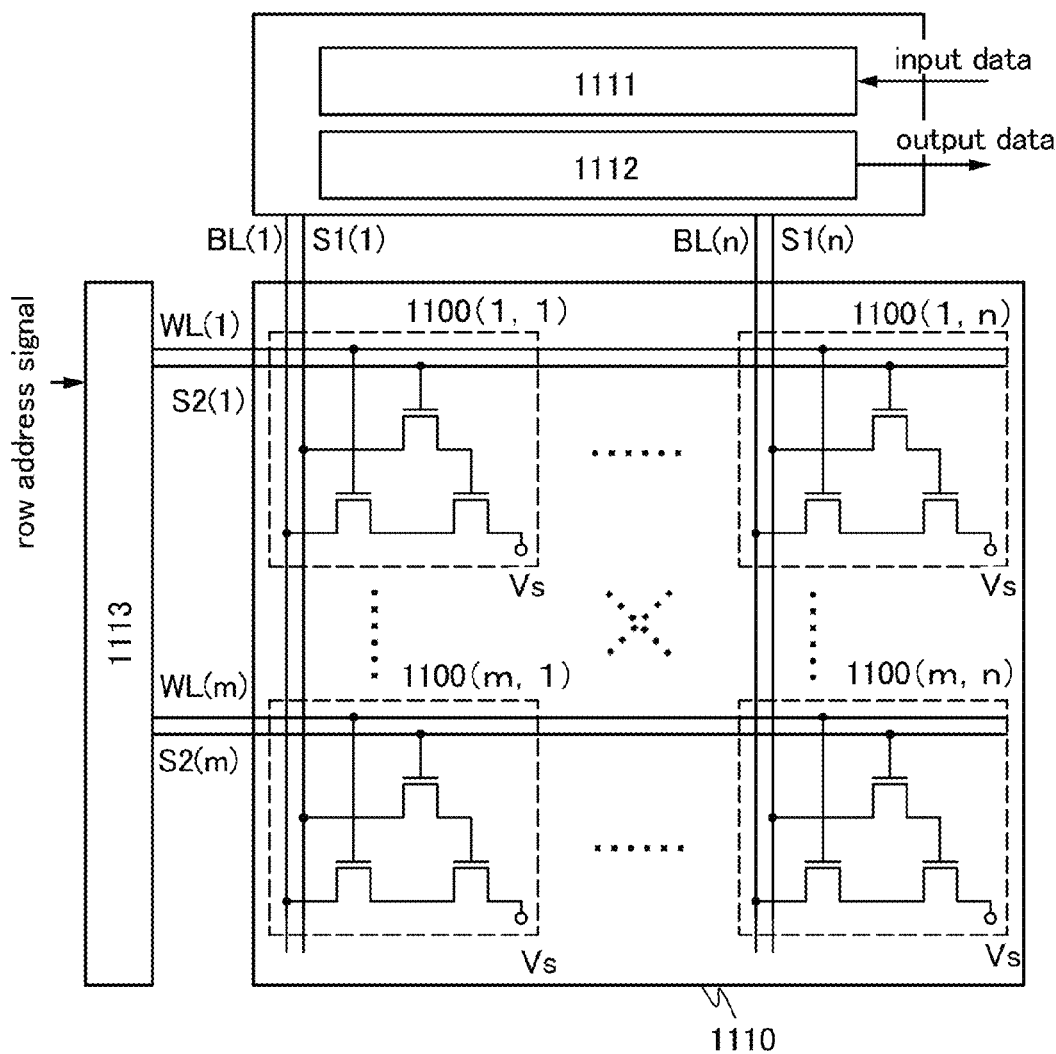
FIG. 21 is an example of a circuit diagram of a semiconductor device of one embodiment of the present invention.

FIG. 21 is a block circuit diagram of a semiconductor device according to one embodiment of the present invention. The semiconductor device has m×n bits of memory capacitance.

The semiconductor device illustrated in FIG. 12 includes m fourth wirings S2(1) to S2(m), m fifth wirings WL(1) to WL(m), n second wirings BL(1) to BL(n), n third wirings S1(1) to S1(n), a memory cell array 1110 in which a plurality of memory cells 1100(1,1) to 1100(m,n) is arranged in a matrix of m rows by n columns (m and n are each a natural number), and peripheral circuits such as a driver circuit 1111 for the second wirings and the third wirings, a driver circuit 1113 for the fourth wirings and the fifth wirings, and a reading circuit 1112. A refresh circuit or the like may be provided as another peripheral circuit.

A memory cell 1100(i,j) is considered as a typical example of the memory cell. Here, the memory cell 1100(i,j) (i is an integer greater than or equal to 1 and less than or equal to m and j is an integer greater than or equal to 1 and less than or equal to n) is connected to a second wiring BL(j), a third wiring S1(j), a fourth wiring S2(i), a fifth wiring WL(i), and a first wiring. A first wiring potential Vs is supplied to the first wiring. The second wirings BL(1) to BL(n) and the third wirings S1(1) to S1(n) are connected to the driver circuit 1111 for the second wirings and the third wirings and the reading circuit 1112. The fifth wirings WL(1) to WL(m) and the fourth wirings S2(1) to S2(m) are connected to the driver circuit 1113 for the fourth wirings and the fifth wirings.

The operation of the semiconductor device illustrated in FIG. 21 will be described. In this structure, data is written and read per row.

When data is written into memory cells 1100(i,1) to 1100(i,n) of an i-th row, the first wiring potential Vs is set to 0 V, the fifth wiring WL(i) is set to 0 V, the second wirings BL(1) to BL(n) are set to 0 V, and the fourth wiring S2(i) is set to 2 V. At this time, the transistors 1161 are turned on. Among the third wirings S1(1) to S1(n), the third wiring in a column in which data "1" is to be written is set to 2 V and the third wiring in a column in which data "0" is to be written is set to 0 V. Note that, to finish writing, the fourth wiring S2(i) is set to 0 V before the potentials of the third wirings S1(1) to S1(n) are changed, so that the transistors 1161 are turned off. Moreover, a non-selected fifth wiring WL and a non-selected fourth wiring S2 are set to 0 V.

As a result, the potential of the node (referred to as the node A) connected to the gate electrode of the transistor 1164 in the memory cell into which data "1" has been written is set to approximately 2 V, and the potential of the node A in the memory cell into which data "0" has been written is set to approximately 0 V (see FIG. 20B and FIG. 21). The potential of the node A of the non-selected memory cell is not changed.

When data is read from the memory cells 1100(i,1) to 1100(i,n) of the i-th row, the first wiring potential Vs is set to 0 V, the fifth wiring WL(i) is set to 2 V, the fourth wiring S2(i) is set to 0 V, the third wirings S1(1) to S1(n) are set to 0 V, and the reading circuit connected to the second wirings BL(1) to BL(n) is set in an operation state. The reading circuit can read data "0" or data "1" in accordance with the difference in resistance state of the memory cell, for example. Note that the non-selected fifth wiring WL and the non-selected fourth wiring S2 are set to 0 V. The second wiring BL at the time of the writing is set to 0 V; however, it may be in a floating state or may be charged to have a potential higher than 0 V. The third wiring S1 at the time of the reading is set to 0 V; however, it may be in a floating state or may be charged to have a potential higher than 0 V.

Note that data "1" and data "0" are defined for convenience and can be reversed. In addition, the above operation voltages are examples. The operation voltages are set so that the transistor 1164 is turned off in the case of data "0" and turned on in the case of data "1", the transistor 1161 is turned on at the time of writing and turned off in periods except the time of writing, and the transistor 1163 is turned on at the time of reading. A power supply potential VDD of a peripheral logic circuit may also be used instead of 2 V.

The structure, method, and the like described in this embodiment can be used in combination with structures, methods, and the like described in other embodiments and example, as appropriate.

Embodiment 6

Figure 22A:
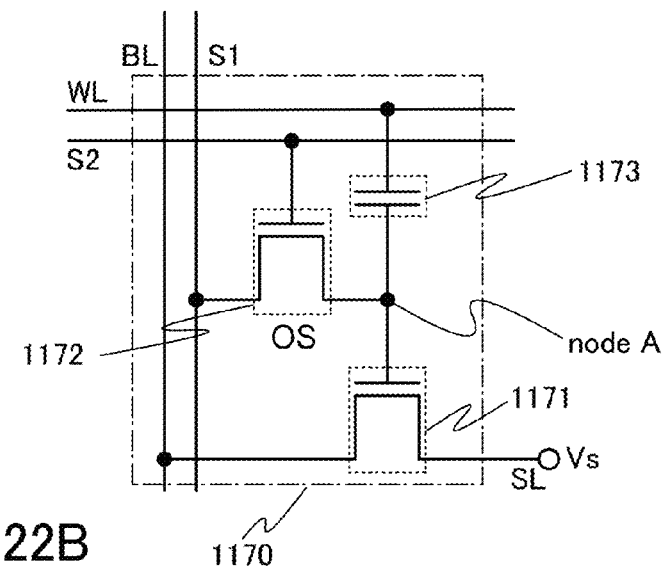
FIGS. 22A and 22B are each an example of a circuit diagram a semiconductor device of one embodiment of the present invention.

In this embodiment, an example of a circuit diagram of a memory cell including a capacitor will be shown. A memory cell 1170 illustrated in FIG. 22A includes a first wiring SL, a second wiring BL, a third wiring S1, a fourth wiring S2, a fifth wiring WL, a transistor 1171 (a first transistor), a transistor 1172 (a second transistor), and a capacitor 1173. In the transistor 1171, a channel formation region is formed using a material other than an oxide semiconductor, and in the transistor 1172, a channel formation region is formed using an oxide semiconductor.

Here, a gate electrode of the transistor 1171, one of a source electrode and a drain electrode of the transistor 1172, and one electrode of the capacitor 1173 are electrically connected to each other. In addition, the first wiring SL and a source electrode of the transistor 1171 are electrically connected to each other. The second wiring BL and a drain electrode of the transistor 1171 are electrically connected to each other. The third wiring S1 and the other of the source electrode and the drain electrode of the transistor 1172 are electrically connected to each other. The fourth wiring S2 and a gate electrode of the transistor 1172 are electrically connected to each other. The fifth wiring WL and the other electrode of the capacitor 1173 are electrically connected to each other.

Next, operation of the circuit will be specifically described.

When data is written into the memory cell 1170, the first wiring SL is set to 0 V, the fifth wiring WL is set to 0 V, the second wiring BL is set to 0 V, and the fourth wiring S2 is set to 2 V. The third wiring S1 is set to 2 V in order to write data "1" and set to 0 V in order to write data "0". At this time, the transistor 1172 is turned on. Note that, to finish writing, the fourth wiring S2 is set to 0 V before the potential of the third wiring S1 is changed, so that the transistor 1172 is turned off.

As a result, the potential of a node (referred to as a node A) connected to the gate electrode of the transistor 1171 is set to approximately 2 V after the writing of data "1" and set to approximately 0 V after the writing of data "0".

When data is read from the memory cell 1170, the first wiring SL is set to 0 V, the fifth wiring WL is set to 2 V, the fourth wiring S2 is set to 0 V, the third wiring S1 is set to 0 V, and a reading circuit connected to the second wiring BL is set in an operation state. At this time, the transistor 1172 is turned off.

The state of the transistor 1171 in the case where the fifth wiring WL is set to 2 V will be described. The potential of the node A which determines the state of the transistor 1171 depends on capacitance C1 between the fifth wiring WL and the node A, and capacitance C2 between the gate electrode of the transistor 1171 and the source and drain electrodes of the transistor 1171.

Note that the third wiring S1 at the time of the reading is set to 0 V; however, it may be in a floating state or may be charged to have a potential higher than 0 V. Data "1" and data "0" are defined for convenience and can be reversed.

The potential of the third wiring S1 at the time of writing may be selected from the potentials of data "0" and data "1" so that the transistor 1172 is turned off after the writing and the transistor 1171 is in an off state in the case where the potential of the fifth wiring WL is set to 0 V. The potential of the fifth wiring WL at the time of reading is set so that the transistor 1171 is turned off in the case of data "0" and turned on in the case of data "1". Furthermore, the threshold voltage of the transistor 1171 is an example. The transistor 1171 can have any threshold voltage so that the transistor 1171 operates in the above-described manner.

An example of a NOR-type semiconductor memory device in which a memory cell including a capacitor and a selection transistor having a first gate electrode and a second gate electrode is used will be described with reference to FIG. 22B.

Figure 22B:
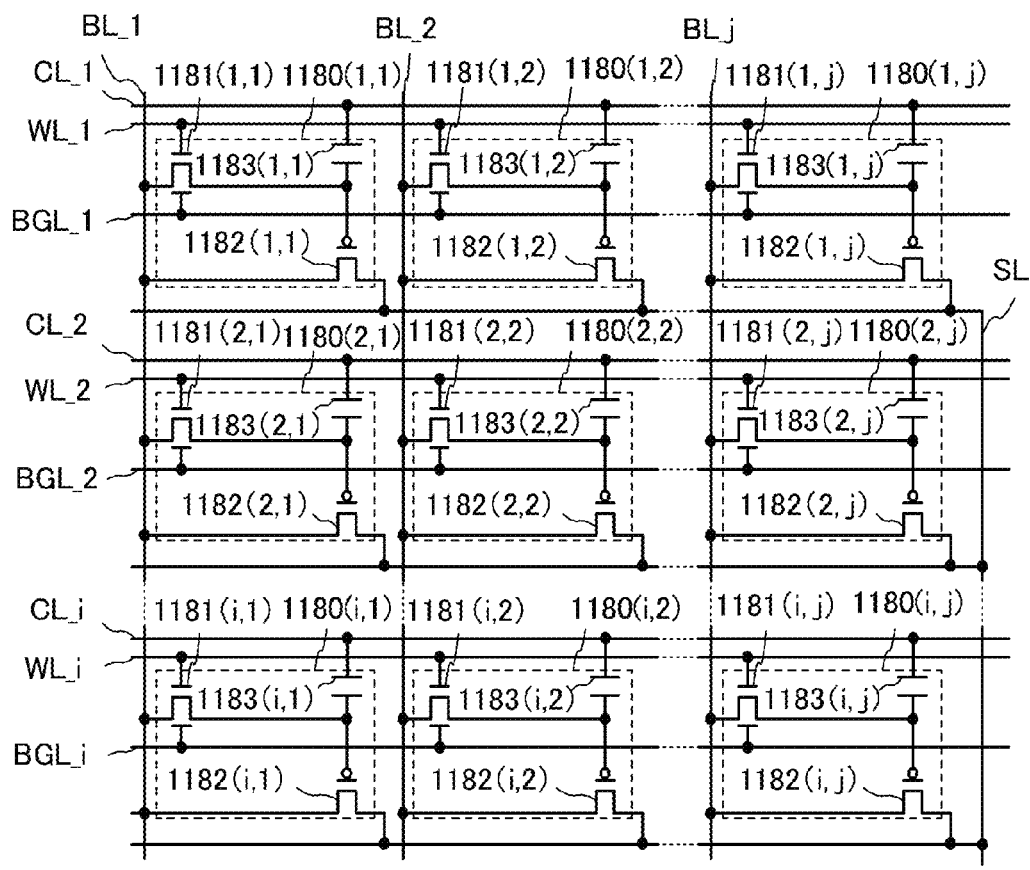

A semiconductor device illustrated in FIG. 22B according to one embodiment of the present invention includes a memory cell array including a plurality of memory cells arranged in a matrix of I rows (I is a natural number of 2 or more) by J columns (J is a natural number).

The memory cell array illustrated in FIG. 22B includes a plurality of memory cells 1180 arranged in a matrix of i rows (i is a natural number of 3 or more) by j columns (j is a natural number of 3 or more), i word lines WL (word lines WL_1 to WL_i), i capacitor lines CL (capacitor lines CL_1 to CL_i), i gate lines BGL (gate lines BGL_1 to BGL_i), j bit lines BL (bit lines BL_1 to BL_j), and a source line SL.

Further, each of the plurality of memory cells 1180 (also referred to as a memory cell 1180(M,N) (note that N is a natural number greater than or equal to 1 and less than or equal to j and that M is a natural number greater than or equal to 1 and less than or equal to i)) includes a transistor 1181(M,N), a capacitor 1183(M,N), and a transistor 1182(M,N).

Note that in the semiconductor memory device, the capacitor includes a first capacitor electrode, a second capacitor electrode, and a dielectric layer overlapping with the first capacitor electrode and the second capacitor electrode. Electric charge is accumulated in the capacitor in accordance with voltage applied between the first capacitor electrode and the second capacitor electrode.

The transistor 1181(M,N) is an n-channel transistor which has a source electrode, a drain electrode, a first gate electrode, and a second gate electrode. Note that in the semiconductor memory device in this embodiment, the transistor 1181 does not necessarily need to be an n-channel transistor.

One of the source electrode and the drain electrode of the transistor 1181(M,N) is connected to a bit line BL_N. The first gate electrode of the transistor 1181(M,N) is connected to a word line WL_M The second gate electrode of the transistor 1181(M,N) is connected to a gate line BGL_M. With the structure in which the one of the source electrode and the drain electrode of the transistor 1181(M,N) is connected to the bit line BL_N, data can be selectively read from memory cells.

The transistor 1181(M,N) serves as a selection transistor in the memory cell 1180(M,N).

As the transistor 1181(M,N), a transistor in which a channel formation region is formed using an oxide semiconductor can be used.

The transistor 1182(M,N) is a p-channel transistor. Note that in the semiconductor memory device in this embodiment, the transistor 1182 does not necessarily need to be a p-channel transistor.

One of a source electrode and a drain electrode of the transistor 1182(M,N) is connected to the source line SL. The other of the source electrode and the drain electrode of the transistor 1182(M,N) is connected to the bit line BL_N. A gate electrode of the transistor 1182(M,N) is connected to the other of the source electrode and the drain electrode of the transistor 1181(M,N).

The transistor 1182(M,N) serves as an output transistor in the memory cell 1180(M,N). As the transistor 1182(M,N), for example, a transistor in which a channel formation region is formed using single crystal silicon can be used.

A first capacitor electrode of the capacitor 1183(M,N) is connected to a capacitor line CL_M. A second capacitor electrode of the capacitor 1183(M,N) is connected to the other of the source electrode and the drain electrode of the transistor 1181(M,N). Note that the capacitor 1183(M,N) serves as a storage capacitor.

The voltages of the word lines WL_1 to WL_i are controlled by, for example, a driver circuit including a decoder.

The voltages of the bit lines BL_1 to BL_j are controlled by, for example, a driver circuit including a decoder.

The voltages of the capacitor lines CL_1 to CL_i are controlled by, for example, a driver circuit including a decoder.

The voltages of the gate lines BGL_1 to BGL_i are controlled by, for example, a gate line driver circuit.

The gate line driver circuit is formed using a circuit which includes a diode and a capacitor whose first capacitor electrode is electrically connected to an anode of the diode and the gate line BGL, for example.

By adjustment of the voltage of the second gate electrode of the transistor 1181, the threshold voltage of the transistor 1181 can be adjusted. Accordingly, by adjustment of the threshold voltage of the transistor 1181 functioning as a selection transistor, current flowing between the source electrode and the drain electrode of the transistor 1181 in an off state can be made extremely small. Thus, a data retention period in the memory circuit can be made longer. In addition, voltage necessary for writing and reading data can be made lower than that of a conventional semiconductor device; thus, power consumption can be reduced.

In accordance with this embodiment, a potential of a node connected to a transistor in which a channel formation region is formed using an oxide semiconductor can be held for a very long time, whereby a memory cell capable of writing, holding, and reading of data with low power consumption can be manufactured. In the memory cell array illustrated in FIG. 22B, the memory cell 1170 illustrated in FIG. 22A can be used instead of the memory cell 1180. On this occasion, in accordance with the memory cell 1170, wirings are provided in an appropriate manner.

The structures, methods, and the like described in this embodiment can be appropriately combined with structures, methods, and the like of other embodiments and example.

Embodiment 7

In this embodiment, examples of a semiconductor device using the transistor described in any of the above embodiments will be described with reference to FIGS. 23A and 23B.

Figure 23A:
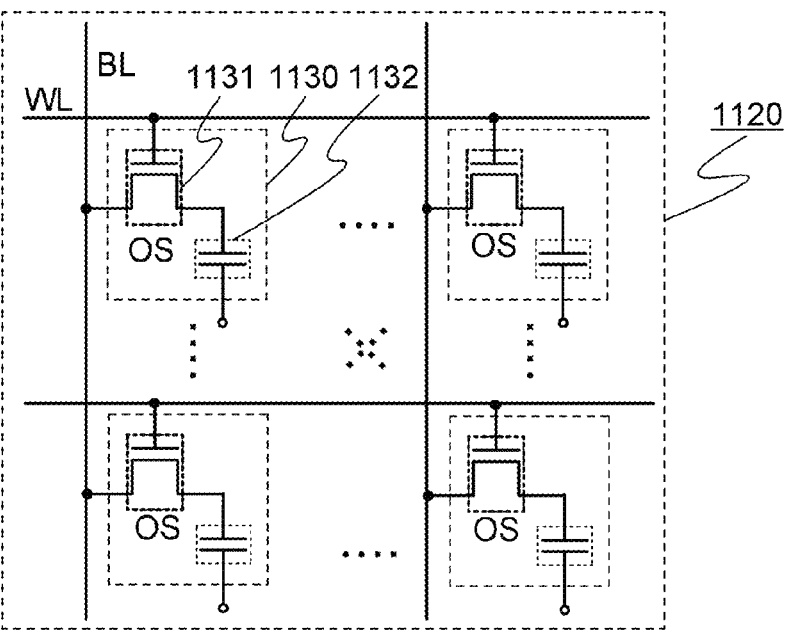
FIGS. 23A and 23B are each an example of a circuit diagram of a semiconductor device of one embodiment of the present invention.

FIG. 23A illustrates an example of a semiconductor device whose structure corresponds to that of a so-called dynamic random access memory (DRAM). A memory cell array 1120 illustrated in FIG. 23A has a structure in which a plurality of memory cells 1130 is arranged in a matrix. Further, the memory cell array 1120 includes m first wirings and n second wirings. Note that in this embodiment, the first wiring and the second wiring are referred to as a bit line BL and a word line WL, respectively.

The memory cell 1130 includes a transistor 1131 and a capacitor 1132. A gate electrode of the transistor 1131 is connected to the first wiring (the word line WL). Further, one of a source electrode and a drain electrode of the transistor 1131 is connected to the second wiring (the bit line BL). The other of the source electrode and the drain electrode of the transistor 1131 is connected to one electrode of the capacitor. The other electrode of the capacitor is connected to a capacitor line CL and is supplied with a predetermined potential. The transistor described in any of the above embodiments is applied to the transistor 1131.

The transistor in which a channel formation region is formed using an oxide semiconductor, which is described in any of the above embodiments, is characterized by having smaller off-state current than a transistor in which a channel formation region is formed using single crystal silicon. Accordingly, when the transistor is applied to the semiconductor device illustrated in FIG. 23A, which is regarded as a so-called DRAM, a substantially nonvolatile memory can be obtained.

Figure 23B:
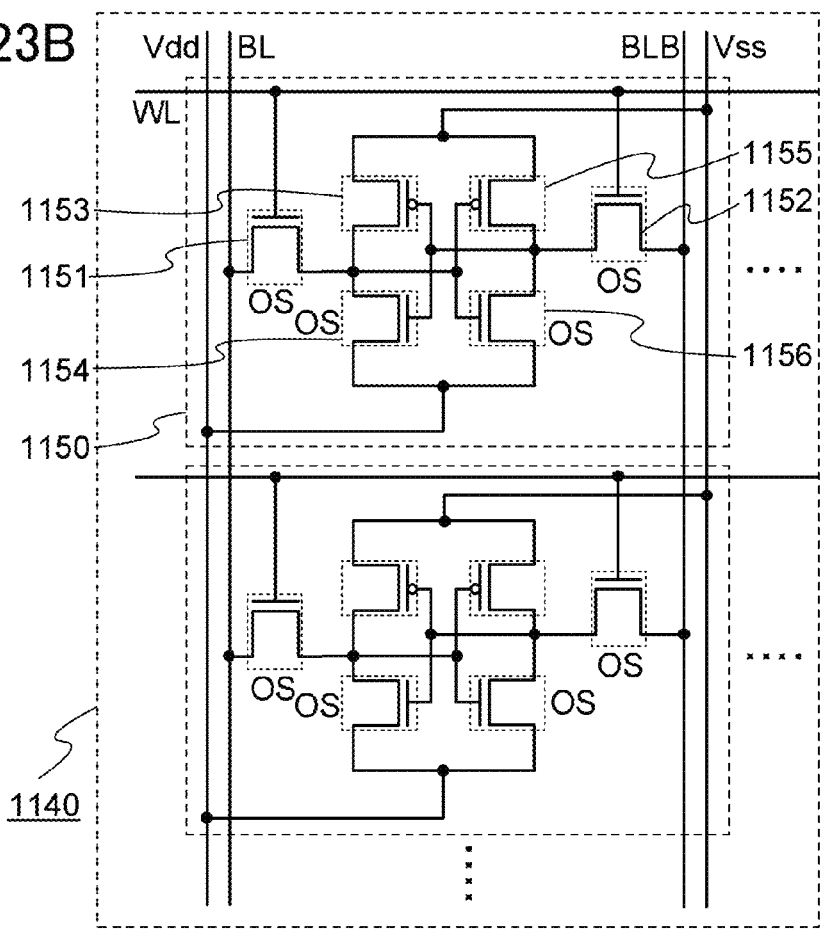

FIG. 23B illustrates an example of a semiconductor device whose structure corresponds to that of a so-called static random access memory (SRAM). A memory cell array 1140 illustrated in FIG. 23B can have a structure in which a plurality of memory cells 1150 is arranged in a matrix. Further, the memory cell array 1140 includes a first wiring BL, a second wiring BLB (inverted bit line), a third wiring WL, a power supply line Vdd, and a ground potential line Vss.

The memory cell 1150 includes a first transistor 1151, a second transistor 1152, a third transistor 1153, a fourth transistor 1154, a fifth transistor 1155, and a sixth transistor 1156. The first transistor 1151 and the second transistor 1152 function as selection transistors. One of the third transistor 1153 and the fourth transistor 1154 is an n-channel transistor (here, the fourth transistor 1154 is an n-channel transistor), and the other of the third transistor 1153 and the fourth transistor 1154 is a p-channel transistor (here, the third transistor 1153 is a p-channel transistor). In other words, the third transistor 1153 and the fourth transistor 1154 form a CMOS circuit. Similarly, the fifth transistor 1155 and the sixth transistor 1156 form a CMOS circuit.

The first transistor 1151, the second transistor 1152, the fourth transistor 1154, and the sixth transistor 1156 are n-channel transistors and the transistor described in any of the above embodiments can be applied to these transistors. Each of the third transistor 1153 and the fifth transistor 1155 is a p-channel transistor in which a channel formation region is formed using a material (e.g., single crystal silicon) other than an oxide semiconductor.

The methods, structures, and the like described in this embodiment can be combined with any of the methods, structures, and the like described in the other embodiments and example, as appropriate.

Embodiment 8

A central processing unit (CPU) can be formed using a transistor in which a channel formation region is formed using an oxide semiconductor for at least part of the CPU.

Figure 24A:
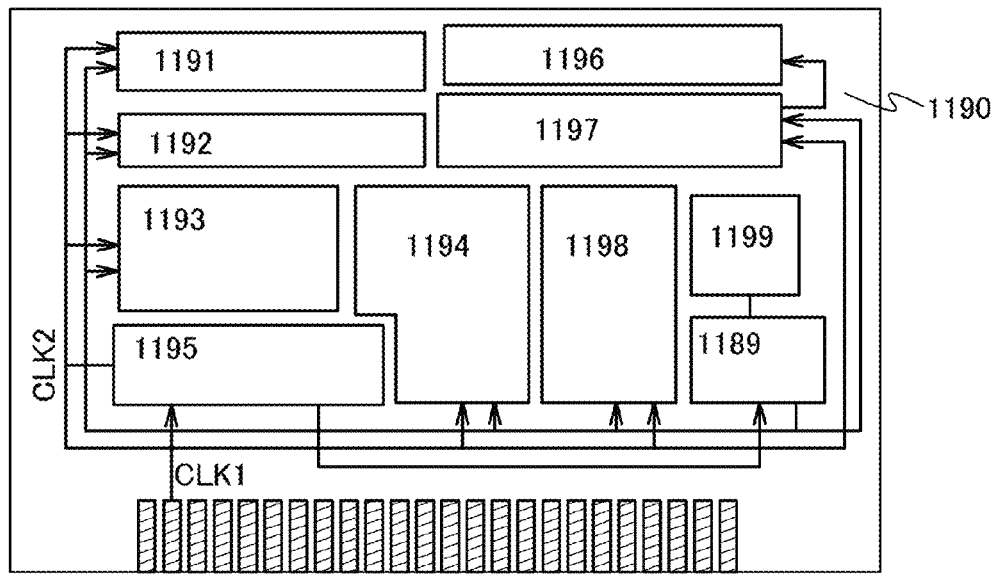
FIG. 24A is a block diagram illustrating a specific example of a CPU and FIGS. 24B and 24C are circuit diagrams illustrating part of the CPU.

FIG. 24A is a block diagram illustrating a specific structure of a CPU. The CPU illustrated in FIG. 24A includes an arithmetic logic unit (ALU) 1191, an ALU controller 1192, an instruction decoder 1193, an interrupt controller 1194, a timing controller 1195, a register 1196, a register controller 1197, a bus interface (Bus I/F) 1198, a rewritable ROM 1199, and an ROM interface (ROM I/F) 1189 over a substrate 1190. A semiconductor substrate, an SOI substrate, a glass substrate, or the like is used as the substrate 1190. The ROM 1199 and the ROM I/F 1189 may be provided over a separate chip. Obviously, the CPU illustrated in FIG. 24A is only an example in which the structure is simplified, and an actual CPU may have various structures depending on the application.

An instruction that is input to the CPU through the Bus I/F 1198 is input to the instruction decoder 1193 and decoded therein, and then, input to the ALU controller 1192, the interrupt controller 1194, the register controller 1197, and the timing controller 1195.

The ALU controller 1192, the interrupt controller 1194, the register controller 1197, and the timing controller 1195 conduct various controls in accordance with the decoded instruction. Specifically, the ALU controller 1192 generates signals for controlling the operation of the ALU 1191. While the CPU is executing a program, the interrupt controller 1194 judges an interrupt request from an external input/output device or a peripheral circuit on the basis of its priority or a mask state, and processes the request. The register controller 1197 generates an address of the register 1196, and reads/writes data from/into the register 1196 in accordance with the state of the CPU.

The timing controller 1195 generates signals for controlling operation timings of the ALU 1191, the ALU controller 1192, the instruction decoder 1193, the interrupt controller 1194, and the register controller 1197. For example, the timing controller 1195 includes an internal clock generator for generating an internal clock signal CLK2 based on a reference clock signal CLK1, and supplies the clock signal CLK2 to the above circuits.

In the CPU illustrated in FIG. 24A, a memory element (a memory cell) is provided in the register 1196. The memory element (the memory cell) described in Embodiments 5 to 7 can be used as the memory element (the memory cell) provided in the register 1196.

In the CPU illustrated in FIG. 24A, the register controller 1197 selects operation of holding data in the register 1196 in accordance with an instruction from the ALU 1191. That is, the register controller 1197 selects whether data is held by a phase-inversion element or a capacitor in the memory element included in the register 1196. When data holding by the phase-inversion element is selected, power supply voltage is supplied to the memory element in the register 1196. When data holding by the capacitor is selected, the data is rewritten in the capacitor, and supply of power supply voltage to the memory element in the register 1196 can be stopped.

Figure 24B:
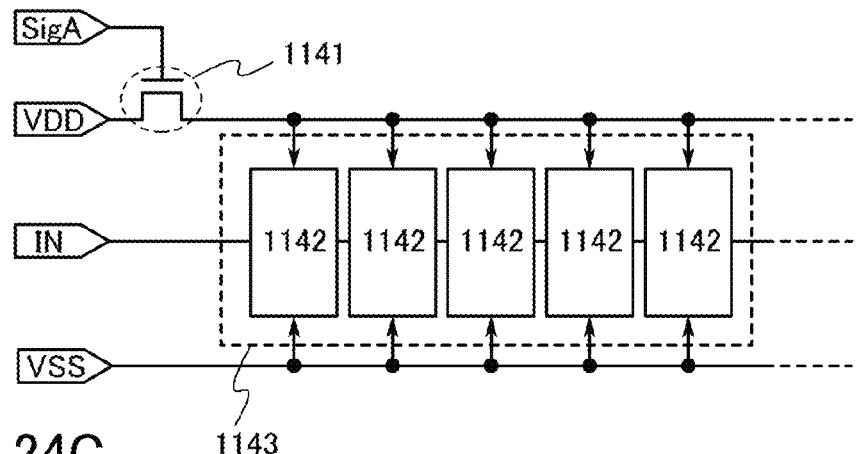
Figure 24C:
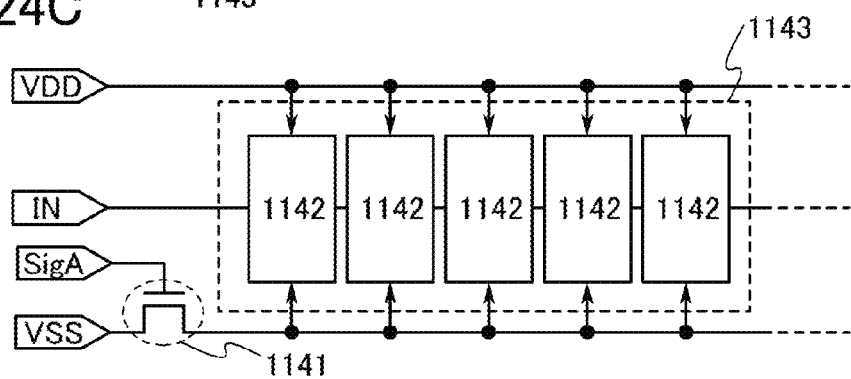

The power supply can be stopped by providing a switching element between a memory element group and a node to which a power supply potential VDD or a power supply potential VSS is supplied, as illustrated in FIG. 24B or FIG. 24C. Circuits illustrated in FIGS. 24B and 24C will be described below.

FIGS. 24B and 24C each illustrate an example of a structure of a memory circuit including a transistor in which a channel formation region is formed using an oxide semiconductor as a switching element for controlling supply of a power supply potential to a memory element.

The memory device illustrated in FIG. 24B includes a switching element 1141 and a memory element group 1143 including a plurality of memory elements 1142. Specifically, as each of the memory elements 1142, the memory element described in the above embodiments can be used. Each of the memory elements 1142 included in the memory element group 1143 is supplied with the high-level power supply potential VDD via the switching element 1141. Further, each of the memory elements 1142 included in the memory element group 1143 is supplied with a potential of a signal IN and the low-level power supply potential VSS.

In FIG. 24B, a transistor in which a channel formation region is formed using an oxide semiconductor is used as the switching element 1141, and the switching of the transistor is controlled by a signal Sig A supplied to a gate electrode thereof.

Note that FIG. 24B illustrates the structure in which the switching element 1141 includes only one transistor; however, without limitation thereto, the switching element 1141 may include a plurality of transistors. In the case where the switching element 1141 includes a plurality of transistors which serves as switching elements, the plurality of transistors may be connected to each other in parallel, in series, or in combination of parallel connection and series connection.

Although the switching element 1141 controls the supply of the high-level power supply potential VDD to each of the memory elements 1142 included in the memory element group 1143 in FIG. 24B, the switching element 1141 may control the supply of the low-level power supply potential VSS.

In FIG. 24C, an example of a memory device in which each of the memory elements 1142 included in the memory element group 1143 is supplied with the low-level power supply potential VSS via the switching element 1141 is illustrated. The supply of the low-level power supply potential VSS to each of the memory elements 1142 included in the memory element group 1143 can be controlled by the switching element 1141.

When a switching element is provided between a memory element group and a node to which the power supply potential VDD or the power supply potential VSS is supplied, data can be held even in the case where operation of a CPU is temporarily stopped and the supply of the power supply voltage is stopped; accordingly, power consumption can be reduced. Specifically, for example, while a user of a personal computer does not input data to an input device such as a keyboard, the operation of the CPU can be stopped, so that the power consumption can be reduced.

Although the CPU is given as an example, the transistor can also be applied to an LSI such as a digital signal processor (DSP), a custom LSI, or a field programmable gate array (FPGA).

Example 1

In this example, a cross-sectional structure of an oxide semiconductor film to which dopant is added will be described.

A manufacturing method for the oxide semiconductor film to which dopant is added will be described. First, a 300-nm-thick silicon oxide film was formed over a glass substrate by a sputtering method.

Next, an oxide semiconductor film formed of an In—Ga—Zn—O-based material (hereinafter, referred to as IGZO film) was formed over the silicon oxide film by a sputtering method. Note that in this example, a 30-nm-thick IGZO film was formed using a target having a composition ratio of $In_2O_3:Ga_2O_3:ZnO=1:1:2$ [molar ratio] under such a condition that the argon flow rate was 30 sccm, the oxygen flow rate was 15 sccm, and the substrate temperature was 400° C. In addition, the IGZO film formed under this condition is the CAAC-OS described in Embodiments 1 to 3.

Next, in order to release hydrogen in the formed IGZO film, heat treatment was performed at 450° C. in a nitrogen atmosphere for one hour.

Then, dopant was added to the heated IGZO film by an ion implantation method. In this example, the dopant was a phosphorus ion ($31P^+$) and is added to the IGZO film at a concentration of $1\times10^{16}$ $cm^{-2}$ at an acceleration voltage of 20 kV.

Next, the IGZO film to which the dopant (a phosphorus ion) was added was subjected to heat treatment at 650° C. for one hour. Note that in this example, in the heat treatment performed after the dopant was added, an IGZO film on which the heat treatment was performed in a nitrogen atmosphere is Sample 1 and an IGZO film on which the heat treatment was performed in an oxygen atmosphere is Sample 2.

Figure 19A:
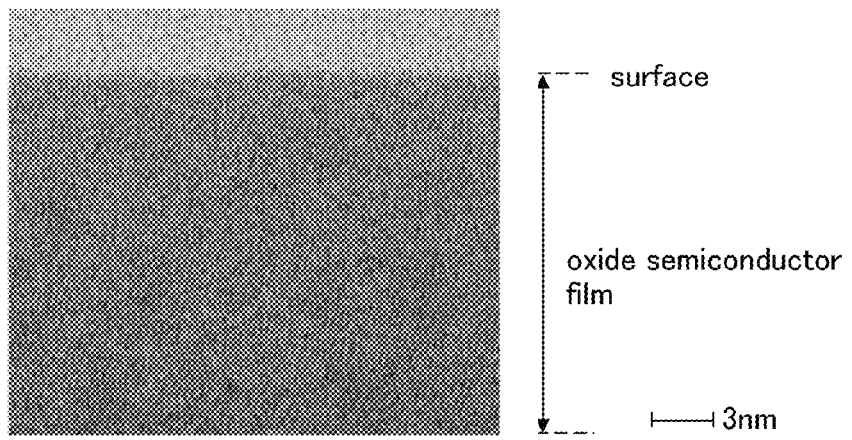
FIGS. 19A to 19C are cross-sectional TEM images of an oxide semiconductor after dopant is added.
Figure 19B:
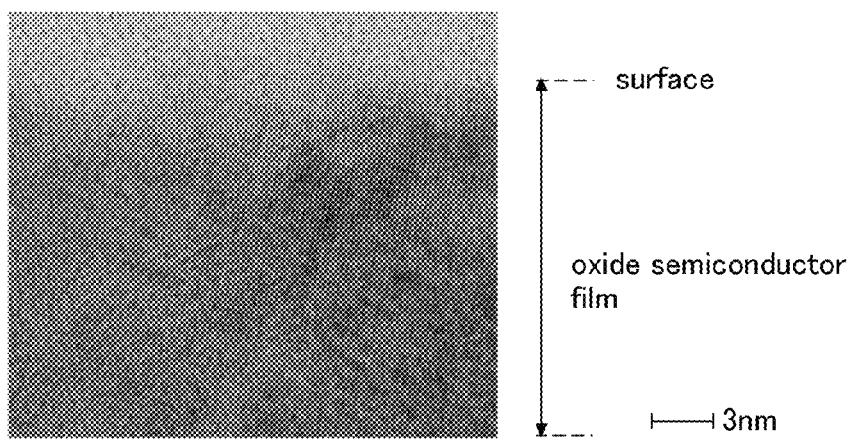
Figure 19C:
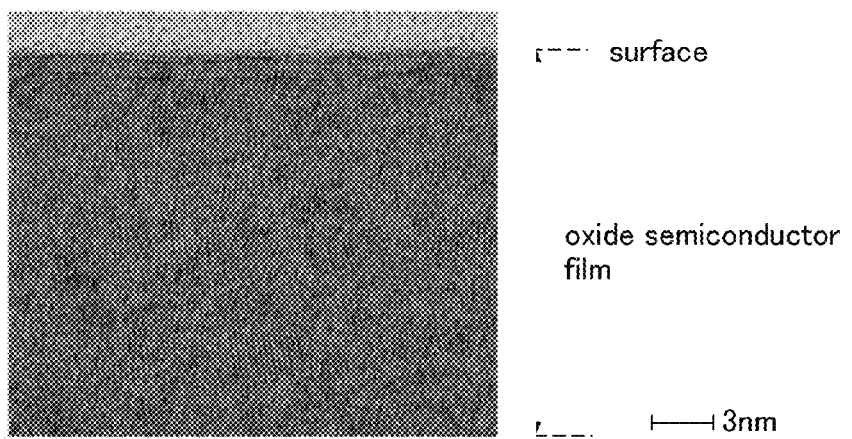

Cross-sectional TEM images of the Sample 1 and the Sample 2 was observed with the use of a transmission electron microscope (TEM). Note that a cross section of an IGZO film on which the heat treatment was not performed after the dopant was added, which is a comparative example, was also observed with the use of TEM. FIG. 19A shows a cross-sectional TEM image of the comparative example. FIG. 19B shows a cross-sectional TEM image of the Sample 1. FIG. 19C shows a cross-sectional TEM image of the Sample 2. Note that FIGS. 19A to 19C are cross-sectional TEM images at a magnification of 8 million times.

In FIG. 19A, a lattice image cannot be observed. An electron diffraction pattern (not shown) of the comparative example is a halo pattern. From the result, it is found that the comparative example is amorphous.

In FIG. 19B, a lattice pattern can be observed; thus, it is found that the Sample 1 includes a crystal portion. Further, an electron diffraction pattern (not shown) of the Sample 1 includes different electron diffraction patterns depending on a position irradiated with an electron beam. In particular, in FIG. 19B, positions where contrast of the IGZO film were different have different crystal arrangements. Accordingly, it is found that the Sample 1 includes a plurality of crystal portions.

In FIG. 19C, a lattice pattern can be observed; thus, it is found that the Sample 2 includes a crystal portion. In addition, from FIG. 19C and an electron diffraction pattern (not shown) of the Sample 2, a region including a surface of the IGZO film is a c-axis aligned crystal portion. Further, the c-axis aligned crystal portion is a non-single crystal portion; thus, it can be said that the region including the surface of the IGZO film is CAAC-OS. The CAAC-OS is formed to the depth of at least 2 nm from the surface of the IGZO film. In addition, it is found that a region other than the region including the surface of the IGZO film includes a plurality of crystal portions, like the Sample 1.

From the above, it is found that an oxide semiconductor film including a plurality of crystal portions can be formed through heat treatment after dopant is added to the oxide semiconductor film. Further, it is found that an oxide semiconductor (CAAC-OS) which is non-single crystal and has a c-axis-aligned crystal portion can be formed in a region including a surface of an IGZO film, under the atmosphere of the heat treatment.

This application is based on Japanese Patent Application serial no. 2011-054610 filed with Japan Patent Office on Mar. 11, 2011, the entire contents of which are hereby incorporated by reference.

What is claimed is:

1. A semiconductor device comprising:
an oxide semiconductor film on an insulating surface, the oxide semiconductor film including a first region, a second region, and a third region;
a gate insulating film over the oxide semiconductor film;
a gate electrode over the gate insulating film, the gate electrode overlapping with the first region;
a first electrode electrically connected to the second region; and
a second electrode electrically connected to the third region,
wherein the first region is interposed between the second region and the third region,
wherein, in the first region, c-axes of crystals are aligned substantially perpendicularly to the insulating surface throughout a thickness of the oxide semiconductor film;
wherein each of the second region and the third region is added with an impurity element and comprises a first portion in contact with the insulating surface and a second portion over the first portion,
wherein the second portion has a polycrystalline oxide semiconductor, and
wherein, in the second portion, c-axes of crystals are aligned substantially perpendicularly to the insulating surface.

2. The semiconductor device according to claim 1, wherein the gate electrode serves as a mask for preventing the impurity element from being contained in the first region.

3. The semiconductor device according to claim 1, wherein the impurity element is selected from the group consisting of phosphorus, arsenic, antimony, and boron.

4. The semiconductor device according to claim 1, wherein a concentration of the impurity element of the second region and the third region is higher than or equal to $5\times10^{18}$ cm$^{-3}$ and lower than or equal to $1\times10^{22}$ cm$^{-3}$.

* * * * *